US012787544B2

(12) United States Patent
Kang et al.

(10) Patent No.: US 12,787,544 B2
(45) Date of Patent: Nov. 3, 2026

(54) DISPLAY APPARATUS

(71) Applicant: Samsung Display Co., Ltd., Yongin-Si (KR)

(72) Inventors: Jangmi Kang, Yongin-si (KR); Myunghoon Park, Yongin-si (KR); Byungchang Yu, Yongin-si (KR); Donghoon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 396 days.

(21) Appl. No.: 18/613,104

(22) Filed: Mar. 22, 2024

(65) Prior Publication Data

US 2024/0324283 A1 Sep. 26, 2024

(30) Foreign Application Priority Data

Mar. 24, 2023 (KR) ........................ 10-2023-0039080
Apr. 28, 2023 (KR) ........................ 10-2023-0056582

(51) Int. Cl.
*H10K 59/121* (2023.01)
*H10K 59/131* (2023.01)

(52) U.S. Cl.
CPC ......... *H10K 59/121* (2023.02); *H10K 59/131* (2023.02)

(58) Field of Classification Search
CPC .................................................... H10K 59/121
See application file for complete search history.

(56) References Cited

U.S. PATENT DOCUMENTS 11,233,095 B2 1/2022 Lv et al.
2006/0066768 A1* 3/2006 Lee .................. G02F 1/133308 349/58
2022/0310761 A1 9/2022 Kim et al.

FOREIGN PATENT DOCUMENTS

CN 108538895 A 9/2018
CN 113097234 A 7/2021
CN 114843288 A 8/2022
KR 10-2018-0039808 A 4/2018
KR 10-2022-0133361 A 10/2022

* cited by examiner

*Primary Examiner* — William A Harriston
(74) *Attorney, Agent, or Firm* — Innovation Counsel LLP

(57) ABSTRACT

A display apparatus is disclosed that includes a substrate including a front display area and a corner display area extending from a corner of the front display area. A plurality of main light-emitting elements is arranged in the front display area and a plurality of main pixel circuits are connected to the plurality of main light-emitting elements, respectively. A plurality of corner light-emitting elements is arranged in the corner display area and a plurality of corner pixel circuits are connected to the plurality of corner light-emitting elements. Each of the plurality of main pixel circuits and the plurality of corner pixel circuits includes a boost capacitor, and a capacitance of the boost capacitor included in each of the plurality of corner pixel circuits gradually increases or decreases as the boost capacitor gets farther from the front display area.

24 Claims, 28 Drawing Sheets

DISPLAY APPARATUS

CROSS-REFERENCE TO RELATED APPLICATIONS

This application is based on and claims priority under 35 U.S.C. § 119 to Korean Patent Application Nos. 10-2023-0039080, filed on Mar. 24, 2023, and 10-2023-0056582, filed on Apr. 28, 2023, in the Korean Intellectual Property Office, the disclosures of which are incorporated by reference herein in their entirety.

BACKGROUND

1. Field

One or more embodiments relate to a structure of a display apparatus, and more particularly, to a display apparatus having an expanded display area so that an image may be displayed in side and corner regions.

2. Description of the Related Art

Recently, the design of display apparatuses has been diversifying. For example, curved type display apparatuses, foldable display apparatuses, and rollable display apparatuses have been developed. In addition, a display area is expanded, and a non-display area is reduced. Thus, various designs of the shape of display apparatuses have been developed.

SUMMARY

One or more embodiments may include a display apparatus in which a display area is expanded so that an image may be displayed even in a corner region, and a high-quality image may be provided. However, this is merely illustrative, and the scope of the present disclosure is not limited thereto.

Additional aspects will be set forth in part in the description which follows and, in part, will be apparent from the description, or may be learned by practice of the presented embodiments of the disclosure.

An embodiment of a display apparatus includes a substrate including a front display area and a corner display area extending from a corner of the front display area, a plurality of main light-emitting elements arranged in the front display area and a plurality of main pixel circuits connected to the plurality of main light-emitting elements, respectively, and a plurality of corner light-emitting elements arranged in the corner display area and a plurality of corner pixel circuits connected to the plurality of corner light-emitting elements, respectively, wherein each of the plurality of main pixel circuits and the plurality of corner pixel circuits includes a boost capacitor, and a capacitance of the boost capacitor included in each of the plurality of corner pixel circuits gradually increases or decreases as the boost capacitor gets farther from the front display area.

The corner display area may include a first corner display area extending from the front display area and a second corner display area extending from the first corner display area, and the plurality of corner pixel circuits may be arranged in the first corner display area, and the second corner display area may include a driving circuit for providing driving signals to the plurality of main pixel circuits and the plurality of corner pixel circuits, and the plurality of corner light-emitting elements may be arranged in the first corner display area and the second corner display area.

The boost capacitor may include a first boost capacitor, each of the plurality of main pixel circuits and the plurality of corner pixel circuits may further include a second boost capacitor, a capacitance of the first boost capacitor included in each of the plurality of corner pixel circuits may gradually decrease as the first boost capacitor gets farther from the front display area, and a capacitance of the second boost capacitor included in each of the plurality of corner pixel circuits may gradually increase as the second boost capacitor gets farther from the front display area.

Each of the plurality of main pixel circuits and the plurality of corner pixel circuits may further include a storage capacitor, and a capacitance of the storage capacitor of the plurality of corner pixel circuits may be the same as a capacitance of the storage capacitor of the plurality of main pixel circuits.

A capacitance of the second boost capacitor of a corner pixel circuit disposed closest to the front display area among the plurality of corner pixel circuits may be greater than 1.5 times a capacitance of the second boost capacitor of one of the plurality of main pixel circuits.

One of the plurality of corner pixel circuits may be connected to at least two of the plurality of corner light-emitting elements.

The display apparatus may further include light-emitting element units configured as a portion of the plurality of corner light-emitting elements and being repeatedly arranged, and one light-emitting element unit may include 8 corner light-emitting elements and may be connected to 4 corner pixel circuits.

When n light-emitting element units (where n is a natural number that is greater than or equal to 2) are arranged in the corner display area in a first direction, a capacitance of a boost capacitor included in each of the plurality of corner pixel circuits may gradually increase or decrease through n steps as the boost capacitor gets farther from the front display area.

Each of the plurality of main pixel circuits and the plurality of corner pixel circuits may include a first transistor that is a driving transistor, a second transistor connected to a first scan line and a data line, and a third transistor connected to the second scan line and configured to connect a gate electrode and an output electrode of the first transistor to each other.

One electrode of the first boost capacitor may be connected to the first scan line connected to a gate electrode of the second transistor, and the other electrode of the first boost capacitor may be connected to the gate electrode of the first transistor.

One electrode of the second boost capacitor may be connected to the second scan line connected to a gate electrode of the third transistor, and the other electrode of the second boost capacitor may be connected to a node connecting the first transistor to the third transistor.

The display apparatus may further include a first semiconductor layer disposed on the substrate and including a channel region of the first transistor, a first gate insulating layer disposed on the first semiconductor layer, a gate electrode of the first transistor disposed on the first gate insulating layer and overlapping a channel of the first transistor, a second gate insulating layer disposed on the gate electrode of the first transistor, a lower gate electrode of the third transistor disposed on the second gate insulating layer, a first interlayer insulating layer disposed on a lower gate electrode of the third transistor, a second semiconductor layer disposed on the first interlayer insulating layer and a channel region of the third transistor, a third gate insulating layer disposed on the second semiconductor layer, an upper gate electrode disposed on the third gate insulating layer and overlapping a channel region of the third transistor, a second interlayer insulating layer covering an upper gate electrode of the third transistor, and a node connection line disposed on the second interlayer insulating layer and connecting the gate electrode of the first transistor to the second semiconductor layer.

The first semiconductor layer may include a silicon semiconductor, and the second semiconductor layer may include an oxide semiconductor.

The first boost capacitor may include a first lower boost electrode and a first upper boost electrode, and the first lower boost electrode may be located on the same layer as the gate electrode of the first transistor, and the first upper boost electrode may be located on the same layer as the second semiconductor layer.

The first scan line may be disposed on the first gate insulating layer, and the first lower boost electrode may extend from the first scan line and may be integrally formed, and the first upper boost electrode may extend from the channel region of the third transistor and may be integrally formed.

An overlapping area of the first lower boost electrode and the first upper boost electrode arranged in one of the plurality of corner pixel circuits may gradually decrease as the corner pixel circuit gets farther from the front display area.

The first scan line may extend in a first direction, and a width following the first direction of the first upper boost electrode may gradually decrease as the corner pixel circuit gets farther from the front display area.

The second boost capacitor may include a second lower boost electrode and a second upper boost electrode, and the second lower boost electrode may be located on the same layer as an upper gate electrode of the third transistor, and the second upper boost electrode may be located on the same layer as the node connection line.

The second scan line may be disposed on the third gate insulating layer, and the second lower boost electrode may extend from the second scan line and may be integrally formed, and the second upper boost electrode may extend from the node connection line and may be integrally formed.

An overlapping area of the second lower boost electrode and the second upper boost electrode arranged in one of the corner pixel circuits may gradually increase as the corner pixel circuit gets farther from the front display area.

The second scan line may extend in a first direction, and a width following the first direction of the second upper boost electrode disposed in the corner pixel circuit may gradually increase as the corner pixel circuit gets farther from the front display area.

The first semiconductor layer may include the channel region of the first transistor, and a source region and a drain region at opposite sides of the channel region, and a channel region of the first transistor arranged in the plurality of main pixel circuits may has a bent shape, and a channel region of the first transistor arranged in the plurality of corner pixel circuits may have a straight line shape.

A channel width/channel length (W/L) of the first transistor arranged in the plurality of main pixel circuits may be less than a W/L of the first transistor arranged in the plurality of corner pixel circuits.

A channel width/channel length (W/L) of the first transistor arranged in the plurality of corner pixel circuits may be uniform.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
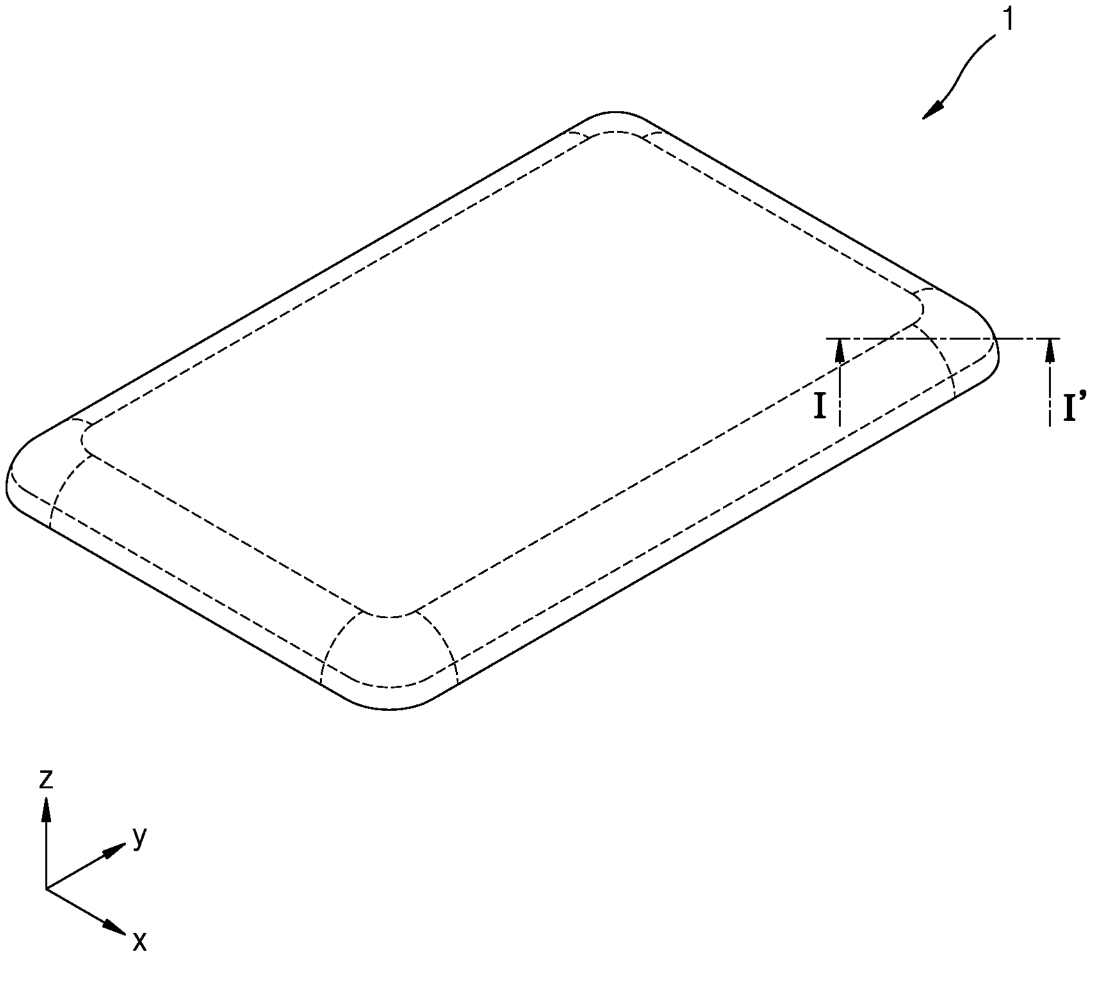
FIG. 1 is a perspective view schematically illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B." Throughout the disclosure, the expression "at least one of a, b or c" indicates only a, only b, only c, both a and b, both a and c, both b and c, all of a, b, and c, or variations thereof.

Since various modifications and various embodiments of the present disclosure are possible, specific embodiments are illustrated in the drawings and described in detail in the detailed description. Effects and features of the present disclosure, and a method of achieving them will be apparent with reference to embodiments described below in detail in conjunction with the drawings. However, the present disclosure is not limited to the embodiments disclosed herein, but may be implemented in a variety of forms.

Hereinafter, embodiments of the present disclosure will be described in detail with reference to the accompanying drawings, and the same or corresponding components are denoted by the same reference numerals, and the same reference numerals are assigned and redundant explanations will be omitted.

In the following embodiments, the terms of the first and second, etc. were used for the purpose of distinguishing one element from other element s, not a limited sense.

In the following embodiments, the singular expression includes a plurality of expressions unless the context is clearly different.

In the following embodiments, the terms "comprising," "including," and "having" (and their variations such as "comprises") used herein specify the presence of stated features or components, but do not preclude the presence or addition of one or more other features or components.

In the following embodiments, when a portion such as a layer, a region, an element or the like is on other portions, this is not only when the portion is on other elements, but also when other elements are interposed therebetween.

In the drawings, for convenience of explanation, the sizes of elements may be exaggerated or reduced. For example, since the size and thickness of each component shown in the drawings are arbitrarily indicated for convenience of explanation, the present disclosure is not necessarily limited to the illustration.

In the case where some embodiments may be implemented in the present specification, a specific process order may be performed differently from the order described. For example, two processes described in succession may be substantially performed at the same time, or in an opposite order to an order to be described.

In the following embodiments, when a layer, a region, a component, etc. are connected to each other, the layer, the region, and the components are directly connected to each other or the layer, the region, and the components may be indirectly connected to each other with other layers, other regions and other components interposed between the layer, the region, and the components. For example, when a layer, a region, a component, etc. are electrically connected to each other in the present specification, the layer, the region, the component, etc. are directly electrically connected to each other, or the layer, the region, the component, etc. are indirectly electrically connected to each other with other layers, other regions and other components interposed between the layer, the region, and the components.

The x-axis, the y-axis, and the z-axis are not limited to three axes on a Cartesian coordinate system, and may be interpreted in a broad sense including the same. For example, the x-axis, the y-axis, and the z-axis may be perpendicular to each other, but may refer to different directions that are not perpendicular to each other.

FIG. 1 is a perspective view schematically illustrating a display apparatus 1 according to an embodiment.

Referring to FIG. 1, the display apparatus 1 according to an embodiment is an apparatus for displaying video or still images, which may be a mobile phone, a smart phone, a tablet personal computer, and a portable electronic device such as a mobile communication terminal, an electronic notebook, an e-book, a portable multimedia player (PMP), a navigation device, an ultra mobile PC (UMPC), and the like. In addition, the display apparatus 1 may be an electronic apparatus that provides a display screen such as a television, a laptop computer, a monitor, a billboard, Internet of Things (IoT), or the like. Alternatively, the display apparatus 1 may be a wearable device, such as a smart watch, a watch phone, a glasses type display, or a head mounted display (HMD).

In one embodiment, the display apparatus 1 may have the shape of a rectangle in a plan view. As an alternative embodiment, the display apparatus 1 may have various shapes such as a polygonal shape, such as a triangular shape, a rectangular shape or the like, a circular shape, an elliptical shape, and the like. In an embodiment, when the display apparatus 1 has a polygonal shape in a plan view, a polygonal corner may be rounded. Hereinafter, for convenience of explanation, a case where the display apparatus 1 has a rectangular shape with rounded corners in a plan view, will be described.

The display apparatus 1 may have a short side in a first direction (e.g., x direction or −x direction) and a long side in a second direction (e.g., y direction or −y direction). In another embodiment, the display apparatus 1 may have the same length of a side in the first direction (e.g., x direction or −x direction) and a side in the second direction (e.g., y direction or −y direction). In another embodiment, the display apparatus 1 may have a long side in the first direction (e.g., x direction or −x direction) and a short side in the second direction (e.g., y direction or −y direction). Each corner where a short side in the first direction (e.g., x-direction or −x-direction) and a long side in the second direction (e.g., y-direction or −y-direction) meet may be rounded to have a certain curvature.

Figure 2:
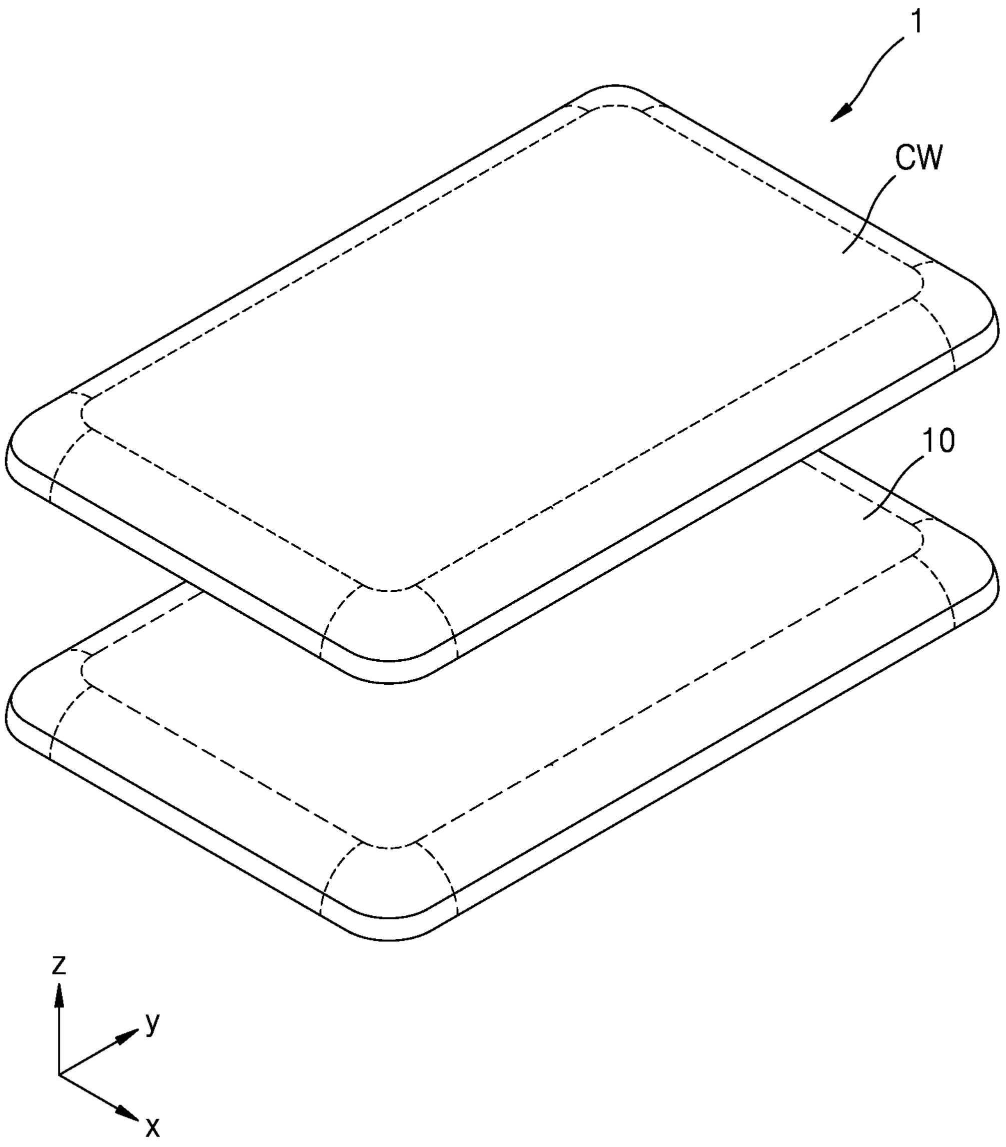
FIG. 2 is an exploded perspective view schematically illustrating a display panel and a cover window of a display apparatus according to an embodiment.
Figure 3:
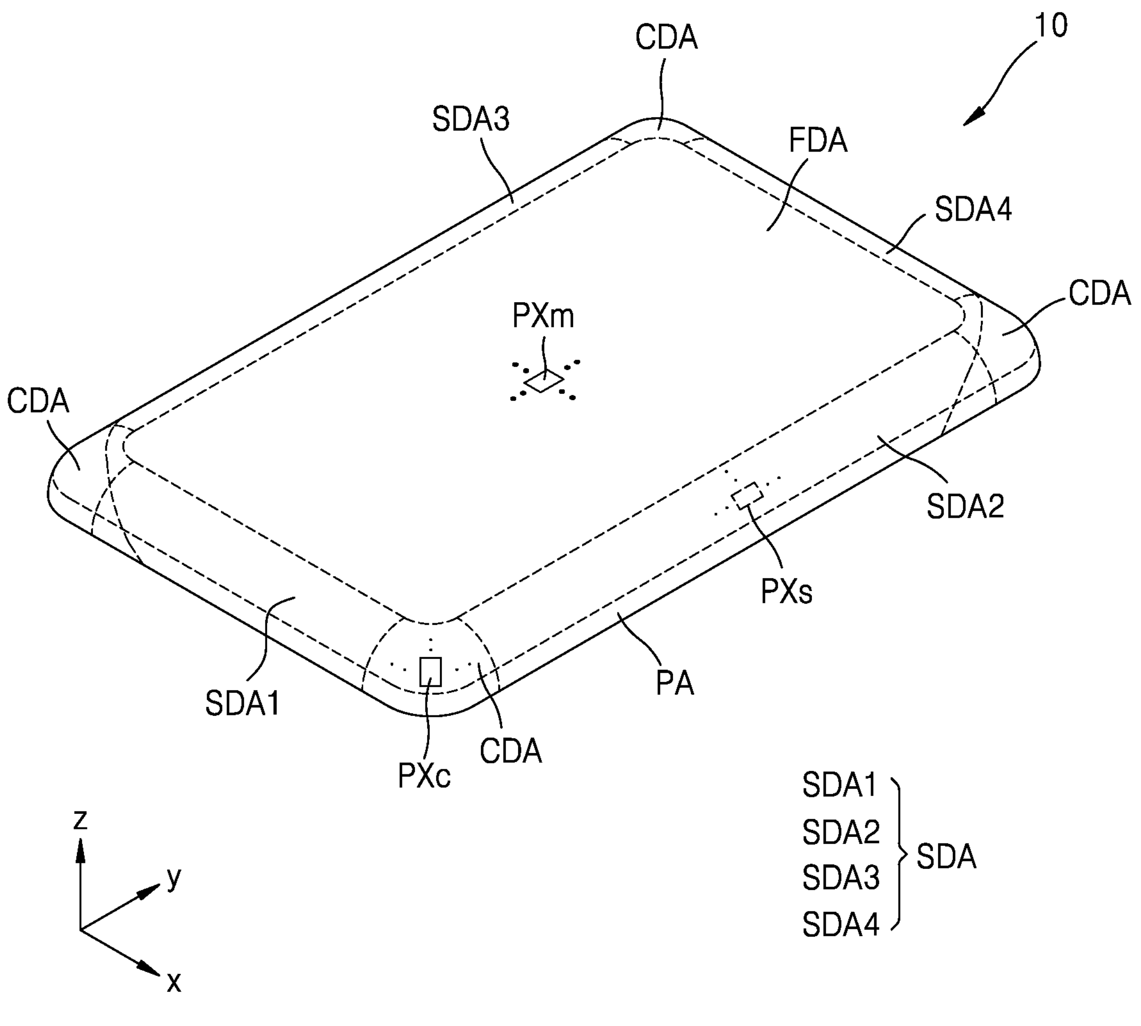
FIG. 3 is a perspective view schematically illustrating a display panel of a display apparatus according to an embodiment.
Figure 4:
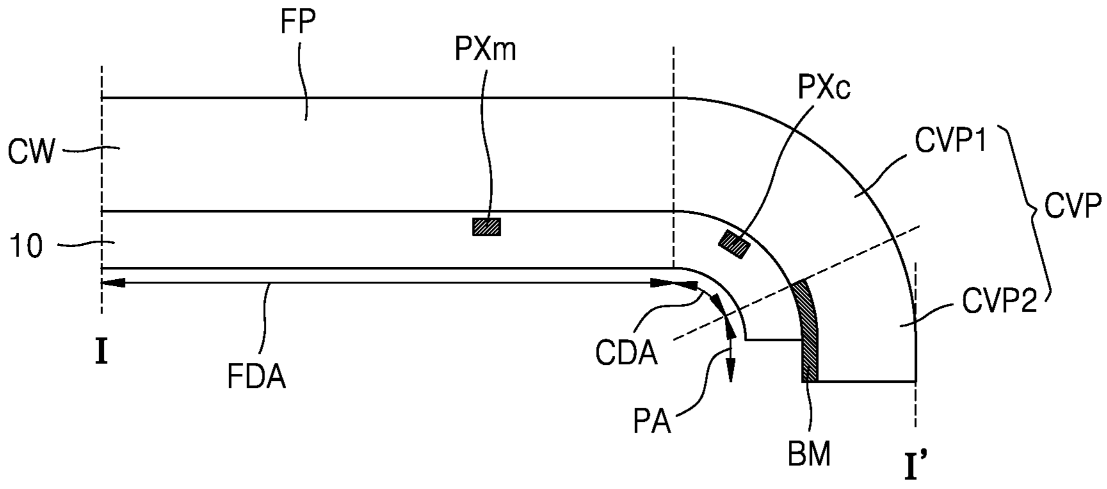
FIG. 4 is a cross-sectional view of the display apparatus taken along a line I-I' of FIG. 1.

FIG. 2 is an exploded perspective view schematically illustrating a display panel 10 and a cover window CW of a display apparatus according to an embodiment. FIG. 3 is a perspective view schematically illustrating the display panel 10 of a display apparatus according to an embodiment. FIG. 4 is a cross-sectional view of the display apparatus 1 taken along a line I-I' of FIG. 1.

Referring to FIGS. 2 through 4, the display apparatus 1 may include the display panel 10 and the cover window CW disposed on the display panel 10.

The display panel 10 may include a front display area FDA, a side display area SDA, and a corner display area CDA, which are display areas. The display apparatus 1 may include a peripheral area PA for surrounding the display area.

The front display area FDA may be an area that is at a front portion of the display panel 10 and is not bent but is flatly formed. The front display area FDA may occupy the largest percentage of the display area of the display panel 10, and thus may provide the majority of the image. That is, the front display area FDA may be a main display area. The front display area FDA may include a short side in the x direction and a long side in the y direction, and each corner where the short and long sides meet may have a rounded rectangular shape.

At least a portion of the side display area SDA may be bent so that the side display area SDA may include a curved surface and may extend outwards from each side of the front display area FDA. The side display area SDA may include a first side display area SDA1, a second side display area SDA2, a third side display area SDA3, and a fourth side display area SDA4. In some embodiments, at least one of the first side display area SDA1, the second side display area SDA2, the third side display area SDA3, and the fourth side display area SDA4 may be omitted.

The first side display area SDA1 may be an area that extends from a first side of the front display area FDA and is bent with a certain curvature. The first side display area SDA1 may extend from the bottom of the front display area FDA. The first side display area SDA1 may be an area in a lower side surface of the display panel 10.

The second side display area SDA2 may be an area that extends from a second side of the front display area FDA and is bent with a certain curvature. The second side display area SDA2 may extend from a right side of the front display area FDA. The second side display area SDA2 may be an area in a right side surface of the display panel 10.

The third side display area SDA3 may be an area that extends from a third side of the front display area FDA and is bent with a certain curvature. The third side display area SDA3 may extend from a left side of the front display area FDA. The third side display area SDA3 may be an area in a left side surface of the display panel 10.

The fourth side display area SDA4 may be an area that extends from a fourth side of the front display area FDA and is bent with a certain curvature. The fourth side display area SDA4 may extend from an upper side of the front display area FDA. The fourth side display area SDA4 may be an area in an upper side surface of the display panel 10.

The first through fourth side display areas SDA1, SDA2, SDA3, and SDA4 may each include a curved surface that is bent with a constant curvature. For example, the first side display area SDA1 and the fourth side display area SDA4 may have curved surfaces bent about a bending axis extending in the x direction, and the second side display area SDA2 and the third side display area SDA3 may have curved surfaces bent about a bending axis extending in the y direction. Curvatures of the first through fourth side display areas SDA1, SDA2, SDA3, and SDA4 may be the same or different from each other.

The corner display area CDA may be an area that extends from a corner of the front display area FDA and is bent with a certain curvature. The corner display area CDA may be between the first through fourth side display areas SDA1, SDA2, SDA3, and SDA4. For example, the corner display area CDA may be between the first side display area SDA1 and the second side display area SDA2, between the first side display area SDA1 and the third side display area SDA3, between the second side display area SDA2 and the fourth side display area SDA4, and between the third side display area SDA3 and the fourth side display area SDA4.

Since the corner display area CDA is between neighboring side display areas SDAs that have curved surfaces in different directions, the corner display area CDA may include a continuous surface with curved surfaces bent in multiple directions. Furthermore, when the curvatures of neighboring side display areas SDAs are different from each other, the curvature of the corner display area CDA may gradually change along an edge of the display apparatus 1. For example, when the curvature of the first side display area SDA1 and the curvature of the second side display area SDA2 are different from each other, the corner display area CDA between the first side display area SDA1 and the second side display area SDA2 may have a curvature that gradually changes depending on a position.

The display panel 10 may provide an image by using main pixels PXm disposed in the front display area FDA, side pixels PXs disposed in the side display area SDA, and corner pixels PXc disposed in the corner display area CDA. Since the display panel 10 provides an image to the side display area SDA and the corner display area CDA in addition to the front display area FDA, the ratio of the display area in the display apparatus 1 may increase. That is, in the display apparatus 1 having the same size, the area of the peripheral area PA may be reduced, and the area of the display area DA may be increased.

The peripheral area PA may surround entirely or partially the outline of the side display area SDA and the corner display area CDA. The peripheral area PA may be an area in which no images are disposed, and various wirings and driving circuits and the like may be arranged in the peripheral area PA. The peripheral area PA may be provided with a shield, such as a shielding member, to prevent the members disposed in the peripheral area PA from being visible.

Referring to FIG. 4, the cover window CW may be arranged on a front surface of the display panel 10. Here, the 'front surface' of the display panel 10 may be defined as a surface facing a direction in which the display panel 20 provides an image.

The cover window CW may be configured to cover and protect the display panel 10. The cover window CW may have a high transmittance to transmit light emitted from the display panel 10, and may have a thin thickness to minimize the weight of the display apparatus 1. Furthermore, the cover window CW may have a high strength and hardness to protect the display panel 10 from external impact.

The cover window CW may include a transparent material. The cover window CW may include, for example, glass or plastic. When the cover window CW includes plastic, the cover window CW may have flexible characteristics. For example, the cover window 30 may be ultra-thin tempered glass (UTG®) that has been strengthened by methods such as chemical or thermal strengthening. In another embodiment, the cover window 30 may be ultra-thin glass (UTG®) and colorless polyimide (CPI). In an embodiment, the cover window 30 may have a structure with a flexible polymeric layer disposed on one side of the glass substrate, or may include only a polymeric layer.

The cover window CW may include a flat portion FP corresponding to the front display area FDA of the display panel 10 and a curved portion CVP corresponding to the side display area SDA and the corner display area CDA.

The flat portion FP of the cover window CW may be provided as a flat surface and may overlap the front display area FDA of the display panel 20. The curved portion CVP of the cover window CW may include a curved surface. In this case, the curved portion CVP of the cover window CW may have a constant curvature or a varying curvature. The curved portion CVP may include a first curved portion CVP1 and a second curved portion CVP2. The first curved portion CVP1 may overlap the side display area SDA and the corner display area CDA of the display panel 10. The second curved portion CVP2 may overlap the peripheral area PA of the display panel 10. The first curved portion CVP1 may be disposed between the flat portion FP and the second curved portion CVP2.

A shielding member BM may be disposed on a portion of the second curved portion CVP2 of the cover window CW. The shielding member BM may be intended to shield a lower substructure disposed therebeneath, and may overlap the peripheral area PA of the display panel 10. The shielding member BM may include a light-blocking material. The shielding member BM may include a resin including carbon black, carbon nanotubes, and a black dye. Alternatively, the shielding member BM may include nickel, aluminum, molybdenum, and an alloy thereof. The shielding member BM may be inkjet-applied or attached with a film type.

The display panel 10 may be disposed under the cover window CW. The cover window CW and the display panel 10 may be coupled to each other by using an adhesive member (not shown). The adhesive member may be an optically cleared adhesive film (OCA) or an optically cleared resin (OCR).

The display panel 10 may provide an image by using main pixels PXm disposed in the front display area FDA, and corner pixels PXc disposed in the corner display area CDA. A lower protective film (not shown) may be further disposed at the bottom of the display panel 10 to protect the display panel 10.

Figure 5:
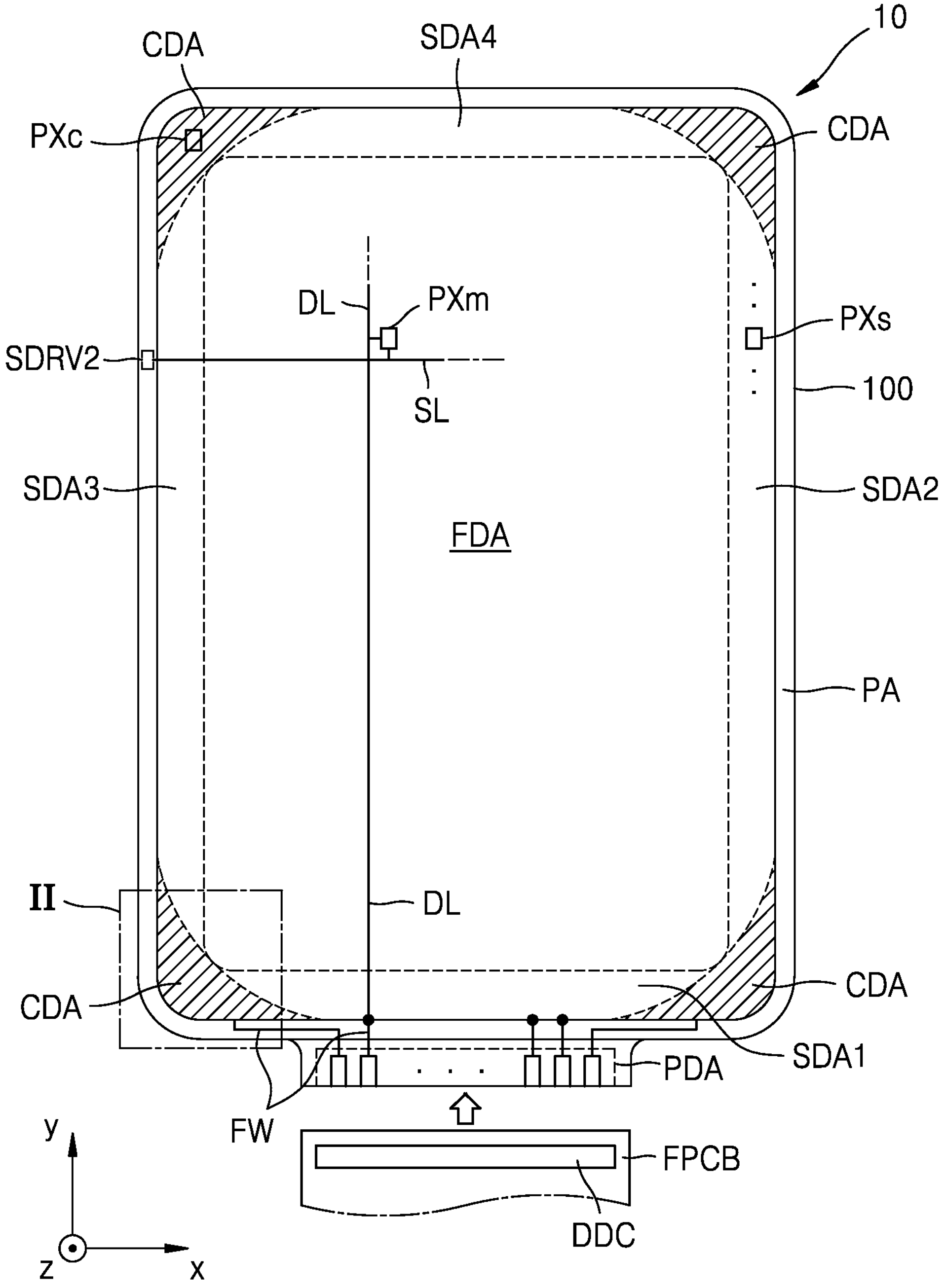
FIG. 5 is a schematic plan view illustrating a display panel that may be included in the display apparatus of FIG. 1, in an unfolded state according to an embodiment.
Figure 6:
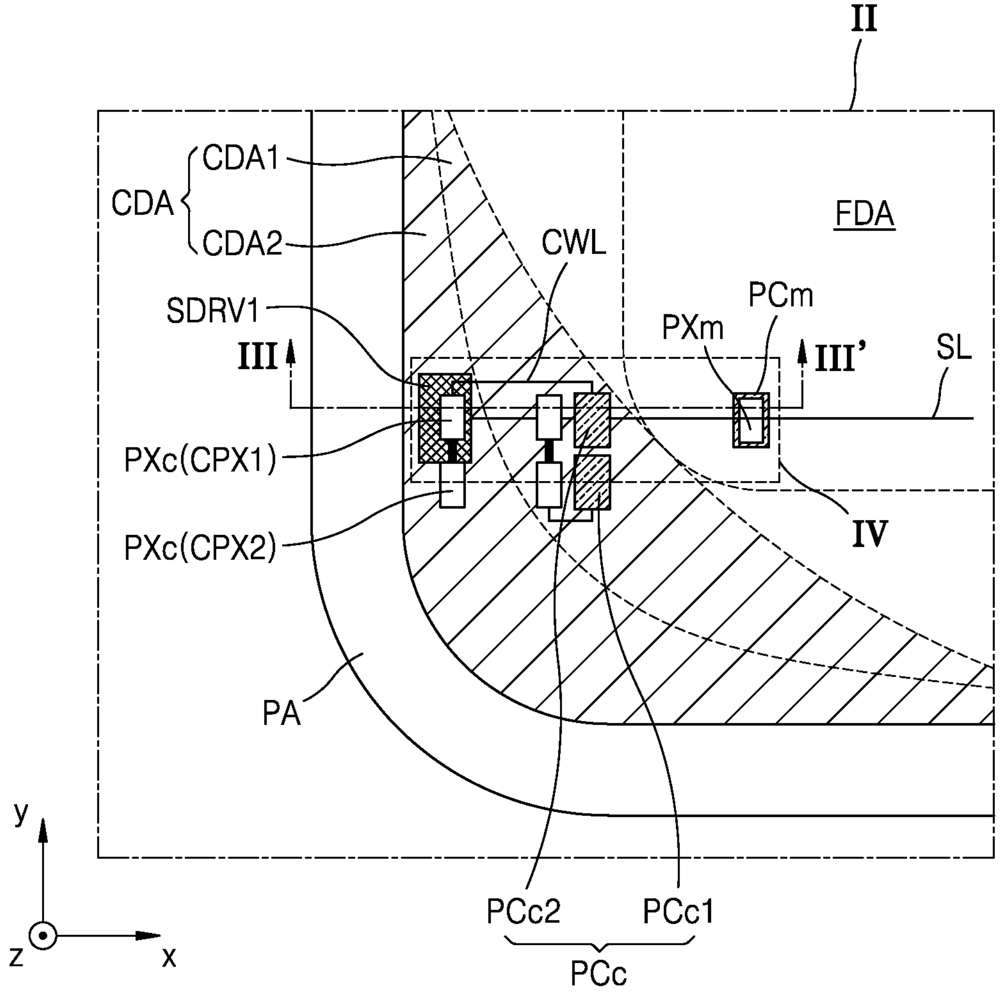
FIG. 6 is an enlarged view of a portion II of FIG. 5.

FIG. 5 is a schematic plan view illustrating a display panel that may be included in the display apparatus of FIG. 1, in an unfolded state according to an embodiment. FIG. 6 is an enlarged view of a portion II of FIG. 5.

Referring to FIGS. 5 and 6, various components that constitute the display panel 10 may be arranged on the substrate 100. The substrate 100 may include a front display area FDA, a side display area SDA, a corner display area CDA, and a peripheral area PA.

A plurality of main pixels PXm may be arranged in the front display area FDA, and a main image may be displayed thereby. The main pixels PXm may be provided as a set of a plurality of sub-pixels. Each of the plurality of sub-pixels may emit red, green, blue or white light, for example.

The side display area SDA may be above, below, left, or right of the front display area FDA. A plurality of side pixels PXs may be arranged in the side display area SDA, and a side image may be displayed thereby. The side image may constitute one entire image together with the main image, or an image independent from the main image.

The corner display area CDA may be in an area extending from the corner of the front display area FDA. The corner display area CDA may be between two side display areas SDA. A plurality of corner pixels PXc may be arranged in the corner display area CDA, and a corner image may be displayed thereby. The corner image may constitute one entire image together with the main image and the side image, or an image independent from the main image.

The corner display area CDA may include a first corner display area CDA1 and a second corner display area CDA2. The second corner display area CDA2 may be an extension of the first corner display area CDA1, and the second corner display area CDA2 may be disposed closer to the edge of the substrate 100 than the first corner display area CDA1. The first corner display area CDA1 may be between the second corner display area CDA2 and the front display area FDA.

A driving circuit SDRV1 in addition to the plurality of corner pixels PXc may be disposed in the second corner display area CDA2. The driving circuit SDRV1 may provide a scan signal for driving the main pixels PXm and the corner pixels PXc arranged in the front display area FDA and the corner display area CDA. In some embodiments, the driving circuit SDRV1 may be simultaneously connected to a pixel circuit for driving the corner pixels PXc and a pixel circuit for driving the main pixels PXm to provide the same scan signal. In this case, a scan line SL connected to the driving circuit SDRV1 may extend from the second corner display area CDA2 to the front display area FDA. The scan line SL may extend in the x direction.

In the second corner display area CDA2, the corner pixels PXc may overlap the driving circuit SDRV1. The corner pixel circuit PCc for driving the corner pixels PXc arranged in the second corner display area CDA2 may be arranged in the first corner display area CDA1. Thus, corner pixel circuits PCc1 and PCc2 for driving each of the the corner pixels PXc arranged in the first corner area CDA1 and the corner pixels PXc arranged in the second corner display area CDA2 may be arranged in the first corner display area CDA1. The corner pixels PXc arranged in the second corner display area CDA2 may be driven while being connected to the corner pixel circuits PCc1 and PCc2 arranged in the first corner display area CDA1 via a connection wiring CWL. The connection wiring CWL may extend in the x direction in which the scan line SL extends.

The corner pixels PXc arranged in the corner display area CDA may include a first copy pixel CPX1 and a second copy pixel CPX2. The first copy pixel CPX1 and the second copy pixel CPX2 may be driven by one pixel circuit and may emit the same color. Sizes of the first copy pixel CPX1 and the second copy pixel CPX2 may be substantially the same. As the corner pixels PXc are provided as copy pixels, the number of pixel circuits for driving the corner pixels PXc may be reduced, and as the corner pixels PXc overlap the scan driving circuit SDRV1, the corner display area CDA may be extended.

The peripheral area PA may be outside the side display area SDA and the corner display area CDA. Various wirings, a driving circuit SDRV2, and a terminal portion PAD may be provided in the peripheral area PA.

The driving circuit SDRV2 may provide a scan signal for driving the main pixels PXm and side pixels PXs. The driving circuit SDRV2 may be arranged at the right side of the second side display area SDA2 or at the left side of the third side display area SDA3 and may be connected to the scan line SL extending in the x direction.

The terminal portion PAD may be disposed at the bottom of the first side display area SDA1. The terminal portion PAD may not be covered by an insulating layer but may be exposed and thus may be connected to a display circuit board FPCB. A display driving portion DDC may be disposed on the display circuit board FPCB.

The display driving portion DDC may generate a control signal to be transmitted to the driving circuits SDRV1 and SDRV2. In addition, the display driving portion DDC may generate data signals. The generated data signals may be transmitted to the pixels PXm, PXs, and PXc via a fanout wiring FW and a data line DL connected to the fanout wiring FW.

Figure 7:
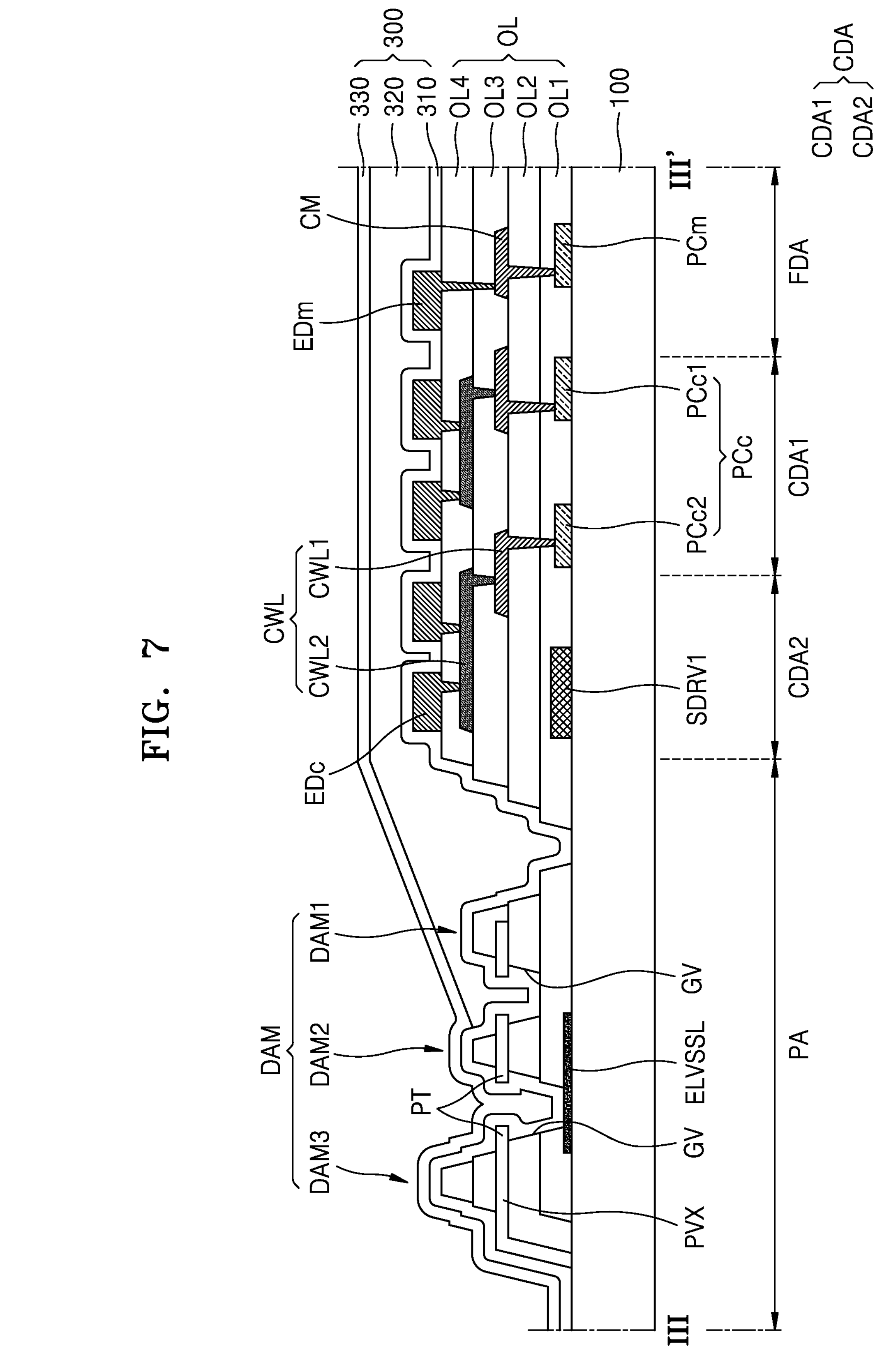
FIG. 7 is a cross-sectional view schematically illustrating a part of a cross-section of a display panel according to an embodiment, which corresponds to a line III-III' of FIG. 6.

FIG. 7 is a cross-sectional view schematically illustrating a part of a cross-section of the display panel 10 according to an embodiment, which corresponds to a line III-III' of FIG. 6.

Referring to FIG. 7, the display panel 10 may include a front display area FDA, a corner display area CDA, and a peripheral area PA, and the corner display area CDA may include a first corner display area CDA1 and a second corner display area CDA2.

The substrate 100 may include an insulating material such as glass, quartz, a polymer resin, or the like. The substrate 100 may be a rigid substrate or a flexible substrate that may be bent, folded or rolled.

The pixel circuits PCm and PCc including thin-film transistors, the driving circuit SDRV1 for providing a scan signal to the pixel circuits PCm and PCc, light-emitting elements EDm and EDc connected to the pixel circuits PCm and PCc and implementing a pixel, a thin-film encapsulation layer 300 for covering and protecting the light-emitting elements EDm and EDc, and a dam DAM. The pixel circuits PCm and PCc may include a main pixel circuit PCm and a corner pixel circuit PCc, and the corner pixel circuit PCc may include a first corner pixel circuit PCc1 and a second corner pixel circuit PCc2. In some embodiments, at least a portion of the main pixel circuit PCm, the first corner pixel circuit PCc1, and the second corner pixel circuit PCc2 may be modified or provided as another pixel circuit.

An organic insulating layer OL may be disposed between the pixel circuits PCm and PCc and the light-emitting elements EDm and EDc. A plurality of organic insulating layers may be stacked in the organic insulating layer OL. In some embodiments, the organic insulating layer OL may be provided by stacking the first organic insulating layer OL1, the second organic insulating layer OL2, the third organic insulating layer OL3, and the fourth organic insulating layer OL4.

The main pixel circuit PCm and the main light-emitting element EDm connected to the main pixel circuit PCm may be arranged in the front display area FDA of the display panel 10. A light-emitting area of the main light-emitting element EDm may correspond to a main pixel (scc PXm of FIG. 6). The main pixel circuit PCm may include at least one thin-film transistor and may control emission of the main light-emitting element EDm. The main light-emitting element EDm may be connected to the main pixel circuit PCm via a connection electrode CM. At least a portion of the main light-emitting element EDm may overlap the main pixel circuit PCm.

The first corner pixel circuit PCc1 and the corner light-emitting element EDc connected to the first corner pixel circuit PCc1 may be arranged in the first corner display area CDA1 of the display panel 10. A light-emitting area of the corner light-emitting element EDc may correspond to a corner pixel (see PXc of FIG. 6). The first corner pixel circuit PCc1 may include at least one thin-film transistor and may control emission of at least two corner light-emitting elements EDc. In an embodiment, two corner light-emitting elements EDc may be connected to one first corner pixel circuit PCc1 and may emit light simultaneously. In this case, two corner light-emitting elements EDc may implement a copy pixel.

A second corner pixel circuit PCc2 connected to the corner light-emitting element EDc arranged in the second corner display area CDA2 may be arranged in the first corner display area CDA1. The second corner pixel circuit PCc2 may include at least one thin-film transistor and may control emission of at least two corner light-emitting elements EDc. In an embodiment, two corner light-emitting elements EDc may be connected to one second corner pixel circuit PCc2 and may emit light simultaneously. In this case, two corner light-emitting elements EDc may implement a copy pixel.

The second corner pixel circuit PCc2 may be connected to the corner light-emitting element EDc arranged in the second corner display area CDA2 by the connection wiring CWL connected to the first corner display area CDA1. The connection wiring CWL may include a first connection wiring CWL1 and a second connection wiring CWL2, which are arranged in different layers. The connection relationship like that the second corner pixel circuit PCc2 may be connected to the corner light-emitting element EDc only by the first connection wiring CWL1, or may be connected to the corner light-emitting element EDc only by the second connection wiring CWL2, or may be connected to the corner light-emitting element EDc by the first connection wiring CWL1 and the second connection wiring CWL2, may be variously modified.

A driving circuit SDRV1 may be arranged in the second corner display area CDA2 of the display panel 10. The driving circuit SDRV1 may include at least one thin-film transistor and may provide a scan signal to the pixel circuits PCc and PCm arranged in the corner display area CDA and the front display area FDA. An emission control driving circuit (not shown) for providing emission control signals in addition to scan signals may be further arranged in the second corner display area CDA2. The driving circuit SDRV1 and the emission control driving circuit may overlap the corner light-emitting element EDc.

An emission area of the corner light-emitting element EDc arranged in the first corner display area CDA1 and the second corner display area CDA2 may represent corner pixels, and the corner pixels may be arranged in the same pixel arrangement in the first corner display area CDA1 and the second corner display area CDA2.

The main light-emitting element EDm and the corner light-emitting element EDc may be covered by the thin-film encapsulation layer 300. In some embodiments, the thin-film encapsulation layer 300 may include at least one inorganic encapsulation layer and at least one organic encapsulation layer. In an embodiment, the thin-film encapsulation layer 300 may include first and second inorganic encapsulation layers 310 and 330 and an organic encapsulation layer 320 therebetween.

A plurality of dams DAM and a common voltage line ELVSSL for transmitting common voltages to the light-emitting elements may be arranged in the peripheral area PA of the display panel 10. The plurality of dams DAM may overlap the common voltage line ELVSS. The plurality of dams DAM may prevent a flow of the organic encapsulation layer 320 of the thin-film encapsulation layer 300 and may prevent external moisture permeation.

The plurality of dams DAM may include a first dam DAM1, a second dam DAM2, and a third dam DAM3. A groove GV that is concave in a depth direction may be formed between the plurality of dams DAM. The plurality of dams DAM may be provided by stacking a plurality of organic insulating layers OL. Each of the first dam DAM1 and the second dam DAM2 may be provided by stacking a first organic insulating layer OL1, a second organic insulating layer OL2, and a third organic insulating layer OL3.

In the present embodiment, each of the first dam DAM1 and the second dam DAM2 may further include an inorganic protective layer PVX between the second organic insulating layer OL2 and the third organic insulating layer OL3. The inorganic protective layer PVX may have a protruding tip PT protruding in a center direction of the groove GV disposed between the first dam DAM1 and the second dam DAM2. By short-circuiting an organic layer or opposite electrode included in the light-emitting element by the protruding tip PT, a tolerance margin required for depositing the organic layer or opposite electrode may be reduced, thereby dramatically reducing the area of the peripheral area PA.

In the present embodiment, the third dam DAM3 may be provided by stacking the first organic insulating layer OL1, the second organic insulating layer OL2, the third organic insulating layer OL3, and the fourth organic insulating layer OL4. The third dam DAM3 may further provide an inorganic protective layer PVX between the second organic insulating layer OL2 and the third organic insulating layer OL3. The inorganic protective layer PVX may cover a side surface of the third dam DAM3 that is adjacent to the edge of the substrate 100. That is, the inorganic protective layer PVX may be provided to cover one side surface of the second organic insulating layer OL2 that is a second layer of the third dam DAM3. The inorganic protective layer PVX may extend from one side surface of the second organic insulating layer OL2 to an upper surface of the substrate 100. Thus, the first inorganic encapsulation layer 310 of the thin-film encapsulation layer may be in contact with the inorganic protective layer PVX on the side surface of the third dam DAM3. The second inorganic encapsulation layer 330 may also be in contact with the first inorganic encapsulation layer 310 on the side surface of the third dam DAM3.

Meanwhile, the first inorganic encapsulation layer 310 may clad the edge of the inorganic protective layer PVX on the upper surface of the substrate 100, and the second inorganic encapsulation layer 330 may clad the edge of the first inorganic encapsulation layer 310 on the upper surface of the substrate 100. This structure may effectively prevent outside air from penetrating into the display area. In addition, since the first inorganic encapsulation layer 310, the second inorganic encapsulation layer 330 and the inorganic protective layer PVX are in contact with each other on the side surface of the third dam DAM3, the area of the peripheral area may be dramatically reduced. By reducing the area of the peripheral area PA, the area of the second corner display area CDA2 may be increased, which may mean an increase in the area of the display area of the display apparatus 1.

Figure 8:
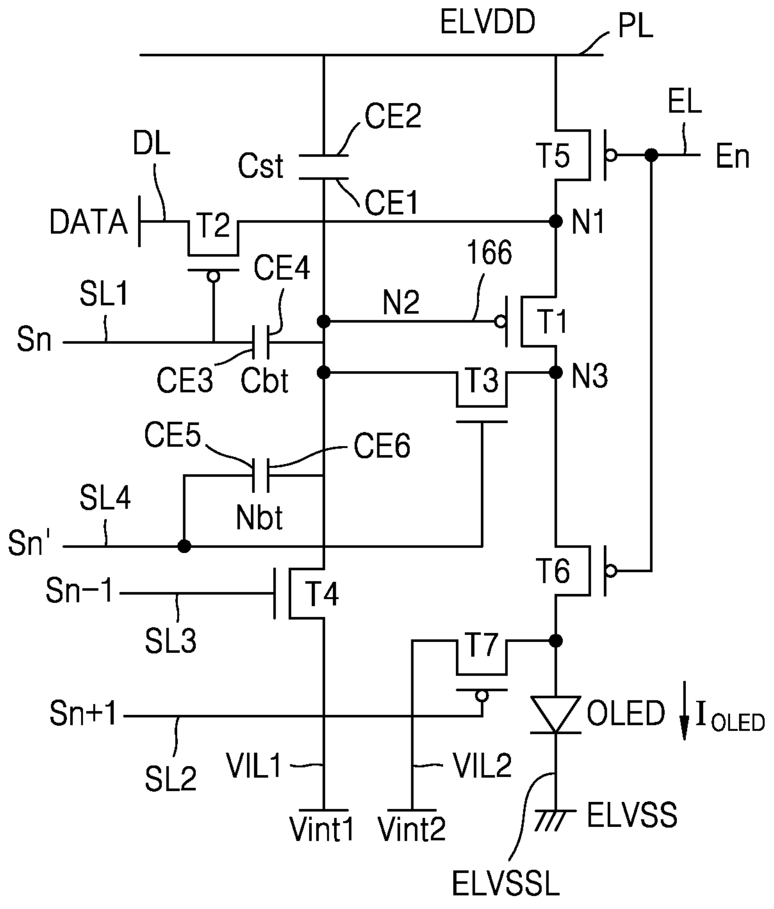
FIG. 8 is an equivalent circuit diagram of a pixel circuit that is applicable to a display panel according to an embodiment.

FIG. 8 is an equivalent circuit diagram of a pixel circuit that is applicable to a display panel according to an embodiment.

Referring to FIG. 8, a pixel may include a plurality of first through seventh transistors T1, T2, T3, T4, T5, T6, and T7, a storage capacitor Cst, a first boost capacitor Cbt, a second boost capacitor Nbt, an organic light-emitting diode OLED that is a display element, signal lines connected thereto, and first and second initialization voltage lines VIL1 and VIL2, and a driving voltage line PL. The signal lines may include a data line DL, a first scan line SL1, a second scan line SL2, a third scan line SL3, a fourth scan line SL4, and an emission control line EL. In another embodiment, at least one of the signal lines, the first and second initialization voltage lines VIL1 and VIL2 or the driving voltage line PL may be shared in adjacent pixels.

The driving voltage line PL may transmit the first driving voltage ELVDD to the first transistor T1. The first initialization voltage line VIL1 may transmit a first initialization voltage Vint1 for initializing the first transistor T1 to the pixel. The second initialization voltage line VIL2 may transmit a second initialization voltage Vint2 for initializing the organic light-emitting diode OLED to the pixel.

In FIG. 8, a third transistor T3 and a fourth transistor T4 among the first through seventh transistors T1 to T7 may be implemented with n-channel metal oxide semiconductor field effect transistors (MOSFET)(NMOSs), and the others may be implemented with p-channel MOSFETs (PMOSs).

The first transistor T1 may be connected between the driving voltage line PL and the organic light-emitting diode OLED. The first transistor T1 may be connected to the driving voltage line PL via the fifth transistor T5 and may be connected to the organic light-emitting diode OLED via the sixth transistor T6. The first transistor T1 may serve as a driving transistor, may receive a data signal DATA according to a switching operation of the second transistor T2, and may supply a driving current to the organic light-emitting diode OLED.

The second transistor T2 (a switching transistor) may be connected between the data line DL and the first node N1 and may be connected to the driving voltage line PL via the fifth transistor T5. The first node N1 may be a node in which the first transistor T1 and the fifth transistor T5 are connected to each other. The second transistor T2 may be turned on in response to the first scan signal Sn transmitted through the first scan line SL1 and may perform a switching operation of transmitting the data signal DATA transmitted to the data line DL to the first node N1.

The third transistor T3 (a compensation transistor) may be connected between a second node N2 and a third node N3. The third transistor T3 may be connected to the organic light-emitting diode OLED via the sixth transistor T6. The second node N2 may be a node to which a gate electrode of the first transistor T1 is connected, and the third node N3 may be a node in which the first transistor T1 and the sixth transistor T6 are connected to each other. That is, the third transistor T3 may connect a gate electrode and an output electrode of the first transistor T1. The third transistor T3 may be turned on in response to a fourth scan signal Sn' transmitted through the fourth scan line SL4 and may diode-connect the first transistor T1, thereby compensating for a threshold voltage of the first transistor T1.

The fourth transistor T4 (a first initialization transistor) may be connected between the second node N2 and the first initialization voltage line VIL1. The fourth transistor T4 may be turned on in response to a third scan signal Sn−1, which is received through the third scan line SL3, to transmit the first initialization voltage Vint1 from the first initialization voltage line VIL1 to the gate electrode of the first transistor T1 to initialize the voltage of the gate electrode of the first transistor T1.

The fifth transistor T5 (a first emission control transistor) may be connected between the driving voltage line PL and the first node N1. The sixth transistor T6 (a second emission control transistor) may be connected between the third node N3 and the organic light-emitting diode OLED. The fifth transistor T5 and the sixth transistor T6 may be simultaneously turned on in response to an emission control signal En transmitted through the emission control line EL and may form a current path through which the driving current IOLED may flow in a direction of the organic light-emitting diode OLED from the driving voltage line PL.

The seventh transistor T7 (a second initialization transistor) may be connected between the organic light-emitting diode OLED and the second initialization voltage line VIL2. The seventh transistor T7 may be turned on in response to the second scan signal Sn+1, which is received through the second scan line SL2, to transmit the second initialization voltage Vint2 from the second initialization voltage line VIL2 to the organic light emitting diode OLED to initialize the organic light-emitting diode OLED. The second scan signal Sn+1 may be the first scan signal for the previous row Sn. The seventh transistor T7 may be omitted.

The storage capacitor Cst may include a first electrode CE1 and a second electrode CE2. The first electrode CE1 may be connected to a gate electrode of the first transistor T1, and the second electrode CE2 may be connected to the driving voltage line PL. The storage capacitor Cst may store and maintain a voltage corresponding to a voltage difference between the driving voltage line PL and a gate electrode of the first transistor T1, thereby maintaining a voltage applied to the gate electrode of the first transistor T1.

The first boost capacitor Cbt may include a third electrode CE3 and a fourth electrode CE4. The third electrode CE3 may be connected to the first scan line SL1, which is connected to the gate electrode of the second transistor T2. The fourth electrode CE4 may be connected to the gate electrode of the first transistor T1 and the first electrode CE1 of the storage capacitor Cst. The first boost capacitor Cbt (i.e., a boost capacitor) may be reduce a voltage (black voltage) for displaying black by increasing a voltage of the second node N2 when the first scan signal Sn of the first scan line SL1 is a voltage for turning off the second transistor T2.

The second boost capacitor Nbt may include a fifth electrode CE5 and a sixth electrode CE6. The fifth electrode CE5 may be connected to the fourth scan line SLA connected to the gate electrode of the third transistor T3. The sixth electrode CE6 may be connected to a node for connecting the gate electrode of the first transistor T1 to the third transistor T3. The second boost capacitor Nbt (i.e., a boost capacitor) may be a negative boosting capacitor that functions opposite to the first boost capacitor Cbt. Specifically, when a fourth scan signal Sn' of the fourth scan line SL4 is changed, a voltage of the second node N2 may be changed by the second boost capacitor Nbt. For example, when the fourth scan signal Sn' changes from a high level to a low level, the voltage of the second node N2 may be reduced by the second boost capacitor Nbt. At this time, the voltage reduction of the second node N2 by the second boost capacitor Nbt may be compensated by the first boost capacitor Cbt. Thus, the voltage applied to the gate electrode of the first transistor T1 may be adjusted by adjusting the first boost capacitor Cbt so that a driving current IOLED output to the organic light-emitting diode OLED and the emission luminance of the organic light-emitting diode OLED may be adjusted.

The organic light-emitting diode OLED may include a pixel electrode and an opposite electrode, and the second driving voltage ELVSS may be applied to the opposite electrode. The organic light-emitting diode OLED may receive the driving current IOLED from the first transistor T1 to emit light, thereby displaying an image.

In the present embodiment, at least one of the plurality of transistors T1 through T7 may include a semiconductor layer including an oxide, and the others may include a semiconductor layer including silicon. Specifically, a first transistor that directly affects brightness of the display apparatus is configured to include a semiconductor layer including polycrystalline silicon having high reliability. Thus, a display apparatus having high resolution may be implemented.

Since the oxide semiconductor has high carrier mobility and low leakage current, voltage drop may not be large even when a driving time is long. This means that even when driving at low frequency, the color change of the image due to voltage drop is not large, so that it is possible to drive at low frequency. As such, since oxide semiconductors have the advantage of less leakage current, at least one of the third transistor T3 and the fourth transistor T4 connected to the gate electrode of the first transistor T1 may be adopted as an oxide semiconductor to prevent leakage current that may flow to the gate electrode of the first transistor T1 while reducing power consumption.

Figure 9:
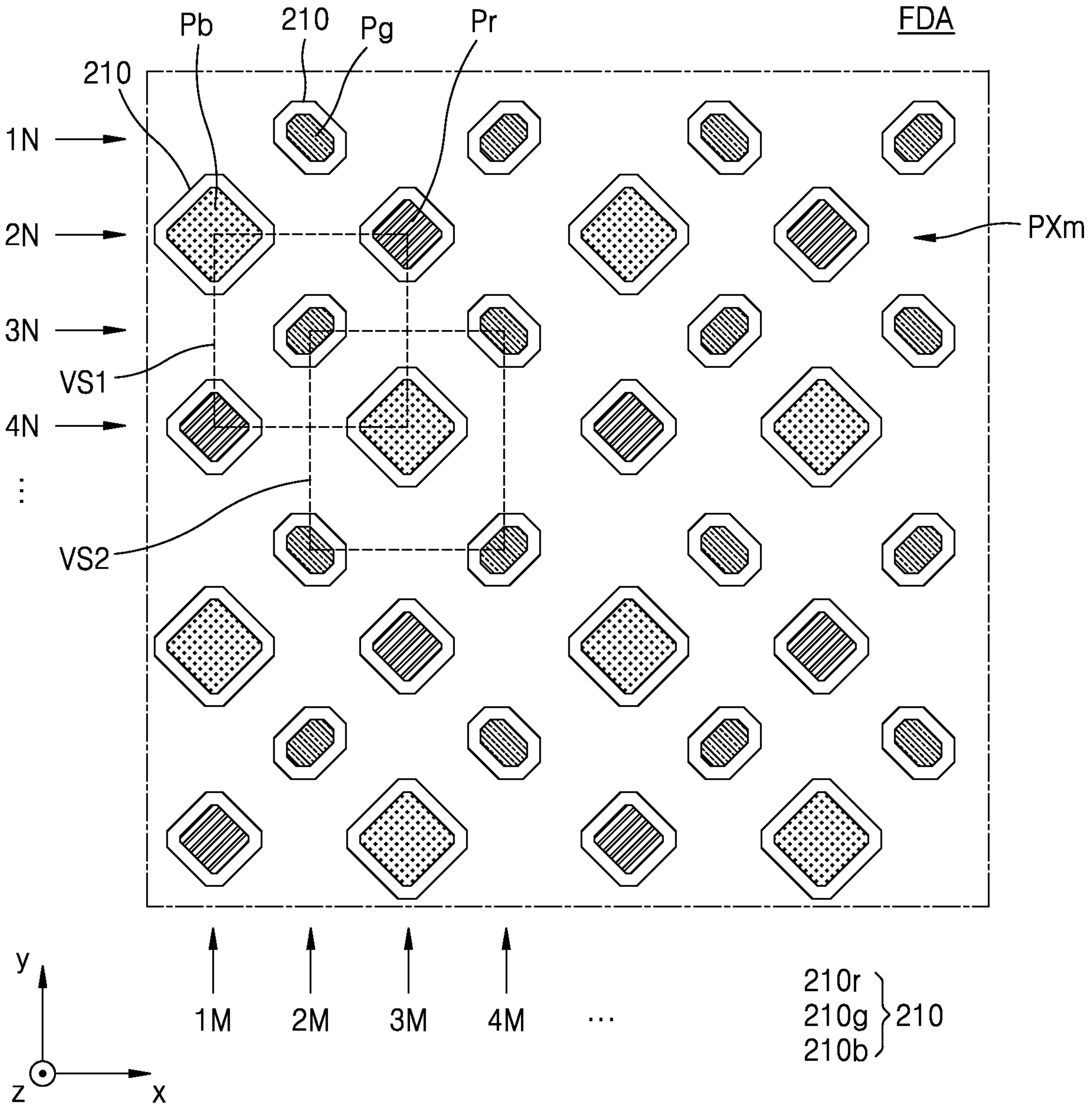
FIG. 9 is a layout diagram schematically illustrating a pixel arrangement structure that may be applied to a front display area and an arrangement of a pixel electrode that is an electrode of a light-emitting element, according to an embodiment.

FIG. 9 is an arrangement diagram schematically illustrating a pixel arrangement structure that can be applied to the front display area FDA and a pixel electrode arrangement that is an electrode of a light-emitting element, according to an embodiment.

Referring to FIG. 9, a plurality of sub-pixels Pr, Pg, and Pb may be arranged in the front display area FDA. As used herein, a sub-pixel refers to the emission area of a light-emitting element as the smallest unit that implements an image. The plurality of sub-pixels may include a first sub-pixel Pr, a second sub-pixel Pg, and a third sub-pixel Pb that represent different colors. Each of the first sub-pixel Pr, the second sub-pixel Pg, and the third sub-pixel Pb may implement red, green, and blue, respectively.

As illustrated in FIG. 9, the first sub-pixel Pr, the second sub-pixel Pg, and the third sub-pixel Pb arranged in the front display area FDA may be arranged in a diamond pentile (PenTile™) type. In FIG. 9, 1N, 2N, 3N, 4N, . . . represent rows of sub-pixels, and 1M, 2M, 3M, 4M, . . . represent columns of sub-pixels.

A plurality of second sub-pixels Pg may be arranged in a first row 1N to be spaced apart from each other at certain intervals, and a plurality of third sub-pixels Pb and a plurality of first sub-pixels Pr may be alternately arranged in a second row 2N that is adjacent to the first row 1N, and a plurality of second sub-pixels Pg may be arranged in a third row 3N that is adjacent to the first row 1N to be spaced apart from each other at certain intervals, and the first sub-pixels Pr and the third sub-pixels Pb may be alternately arranged in a fourth row 4N that is adjacent to the first row 1N, and the arrangement of these pixels may be repeated until an N-th row. In this case, the third sub-pixel Pb and the first sub-pixel Pr may be larger than the second sub-pixel Pg.

A plurality of first sub-pixels Pr and third sub-pixels Pb arranged in the first row 1N and a plurality of second sub-pixels Pg arranged in the second row 2N may be staggered with each other. Thus, the third sub-pixel Pb and the first sub-pixel Pr may be alternately arranged in the first column 1M, a plurality of second sub-pixels Pg may be arranged in a second column 2M that is adjacent to the first column 1M to be spaced apart from each other at certain intervals, and the first sub-pixel Pr and the third sub-pixel Pb may be alternately arranged in a third column 3M that is adjacent to the first column 1M, and a plurality of second sub-pixels Pg may be arranged in a fourth column 4M that is adjacent to the first column 1M to be spaced apart from each other at certain intervals, and the arrangement of these pixels may be repeated until a M-th column M.

This pixel arrangement structure may be expressed in another way like that the first sub-pixel Pr may be arranged first and third vertexes facing each other among vertexes of an imaginary rectangle VS1 with the center point of the second sub-pixel Pg as the center point of the rectangle and the third sub-pixel Pb may be arranged at second and fourth vertexes that are the other vertexes.

The above-described pixel arrangement structure may be expressed in another way like that the second sub-pixel Pg may be arranged at the vertex of a second imaginary rectangle VS2 with the center point of the first sub-pixel Pr or the third sub-pixel Pb as the center point of the rectangle. In this case, the first and second imaginary rectangles VS1 and VS2 may be modified in various shapes such as rectangles, rhombuses, squares and the like.

This pixel arrangement structure may be referred to as a diamond pentile (PenTile™) arrangement structure, and rendering driving for expressing color by sharing adjacent pixels may be applied so that high resolution may be implemented with a small number of sub-pixels.

Each of the first sub-pixel Pr, the second sub-pixel Pg, and the third sub-pixel Pb arranged in the front display area FDA may represent an emission region of each of main light-emitting elements, and each of the light-emitting elements may include pixel electrodes 210 that are spaced apart from each other at certain intervals.

Figure 10:
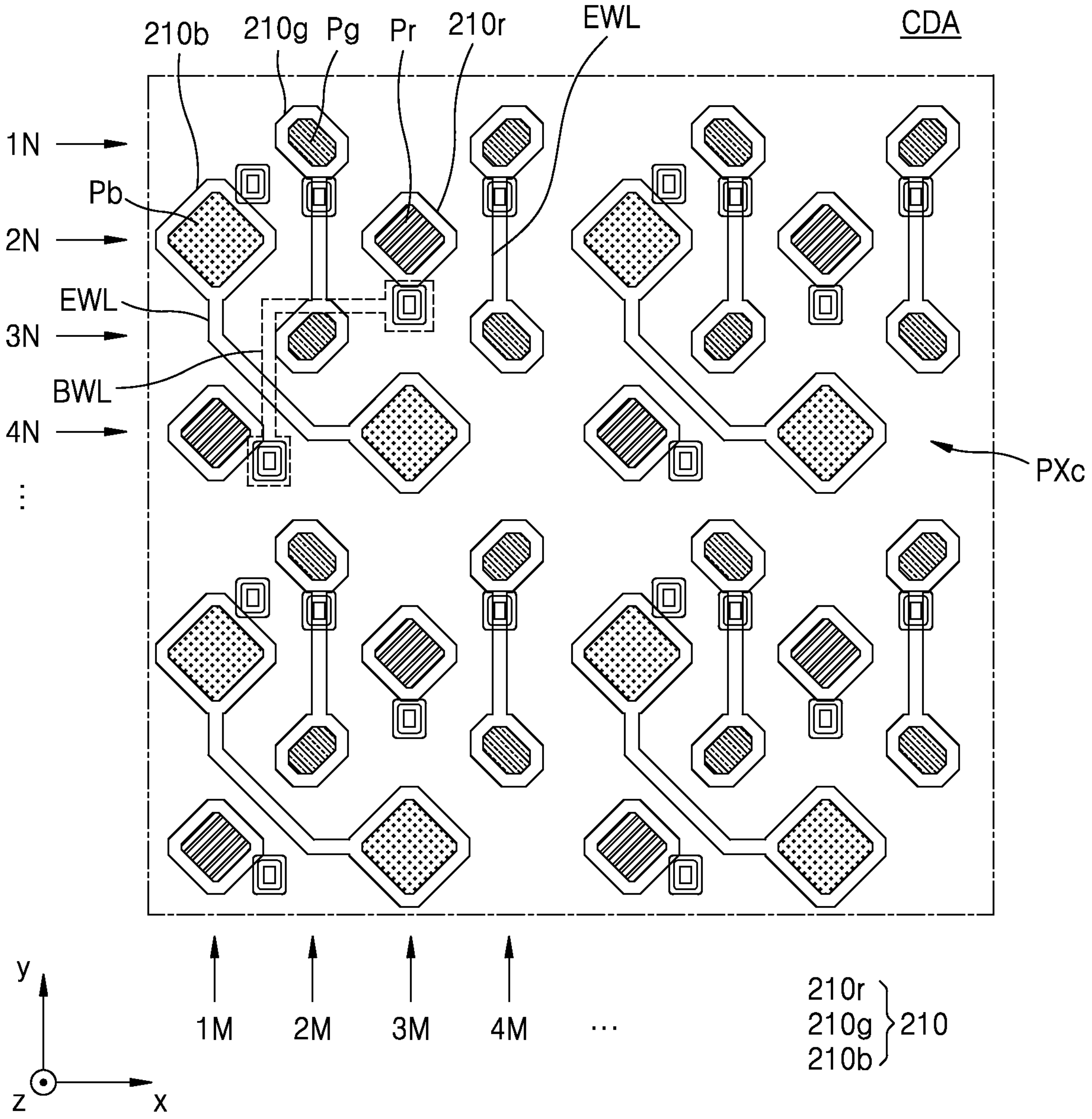
FIG. 10 is a layout diagram schematically illustrating a pixel arrangement structure that may be applied to a corner display area and an arrangement of a pixel electrode that is an electrode of a light-emitting element, according to an embodiment.

FIG. 10 is an arrangement diagram schematically illustrating a pixel arrangement structure that can be applied to the front display area FDA and the arrangement of a pixel electrode that is an electrode of a light-emitting element, according to an embodiment.

Referring to FIG. 10, the first sub-pixel Pr, the second sub-pixel Pg, and the third sub-pixel Pb arranged in the corner display area CDA may be arranged in a diamond pentile (PenTile™) type. That is, the sub-pixels Pr, Pg, and Pb arranged in each of the front display area FDA and the corner display area CDA may have the same pixel arrangement in a plan view.

In some embodiments, the front display area FDA and the corner display area CDA may have the same resolution. In other words, for the same area, the number or area of sub-pixels arranged in the frontal display area FDA and the number or area of sub-pixels arranged in the corner display area CDA may be the same.

The first sub-pixel Pr, the second sub-pixel Pg, and the third sub-pixel Pb arranged in the corner display area CDA may represent an emission region of each of the corner light-emitting elements. The corner light-emitting elements may include first light-emitting elements for implementing first sub-pixels Pr, second light-emitting elements for implementing second sub-pixels Pg, and third light-emitting elements for implementing third sub-pixels Pb.

The corner light-emitting elements may include at least two light-emitting elements connected to each other. The light-emitting elements connected to each other may be connected to one pixel circuit and may emit simultaneously. The light-emitting elements connected to each other may implement copy pixels that represent the same color and size.

Referring to FIG. 10, pixel electrodes 210*r* of two adjacent first light-emitting elements among the first light-emitting elements may be connected to each other via a bridge wiring BWL disposed in a different layer from a layer in which the pixel electrode 210*r* is disposed. For example, the bridge wiring BWL may be arranged in the same layer as the first connection wiring (see CWL1 of FIG. 7) or in the same layer as the second connection wiring (see CWL2 of FIG. 7).

The pixel electrodes 210*g* of two adjacent second light emitting elements among the second light emitting element may be integrally formed. That is, two second light-emitting elements may share one pixel electrode 210*g*. Alternatively, it may be expressed that pixel electrodes 210*g* of two second light-emitting elements may be connected to each other via an electrode wiring EWL. The electrode wiring EWL may be arranged in the same layer as the pixel electrode 210*g*, and the pixel electrode 210*g* and the electrode wiring EWL may be integrally formed.

Pixel electrodes 210*b* of two adjacent third light emitting elements among the third light-emitting element may be integrally formed. That is, two third light-emitting elements may share one pixel electrode 210*b*. Alternatively, it may be expressed that pixel electrodes 210*b* of two third light-emitting elements may be connected to each other via the electrode wiring EWL.

By utilizing a wiring connecting corner light-emitting elements in the corner display area CDA as an electrode wiring EWL disposed on the same layer as the pixel electrodes 210, the degree of freedom of connecting wirings disposed thereunder may be increased.

In FIGS. 9 and 10, a plurality of sub-pixels Pr, Pg, and Pb are arranged in a pentile (PenTile™) pixel arrangement structure. However, embodiments are not limited thereto. For example, the plurality of sub-pixels Pr, Pg, and Pb may be arranged in various shapes such as a stripe arrangement structure, a mosaic arrangement structure, a delta arrangement structure, and the like.

Figure 11A:
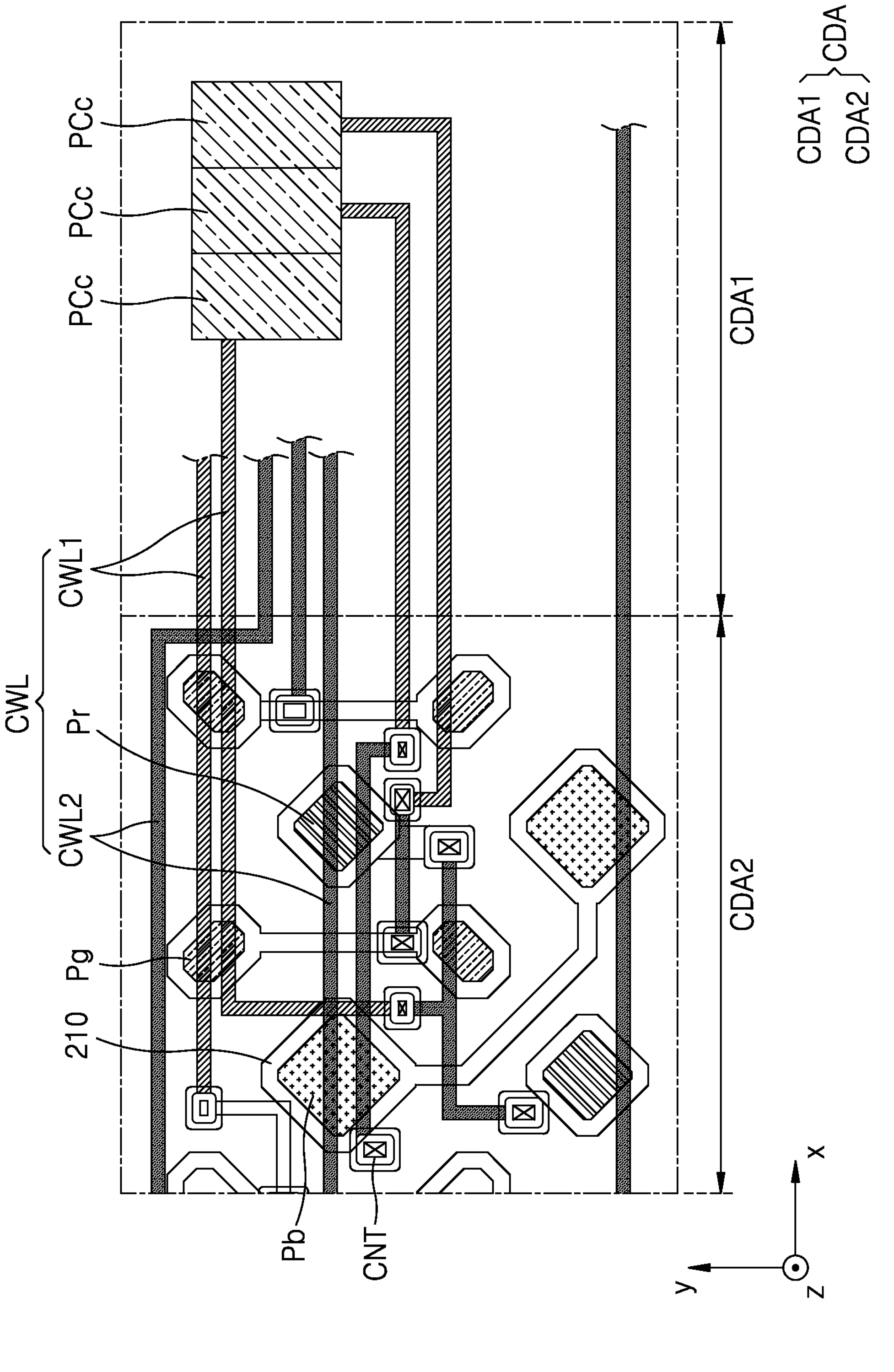
FIGS. 11A and 11B are schematic layout diagrams illustrating the arrangement relationship between some corner light-emitting elements and some corner pixel circuits, which are arranged in a corner display area of a display panel, according to an embodiment.
Figure 11B:
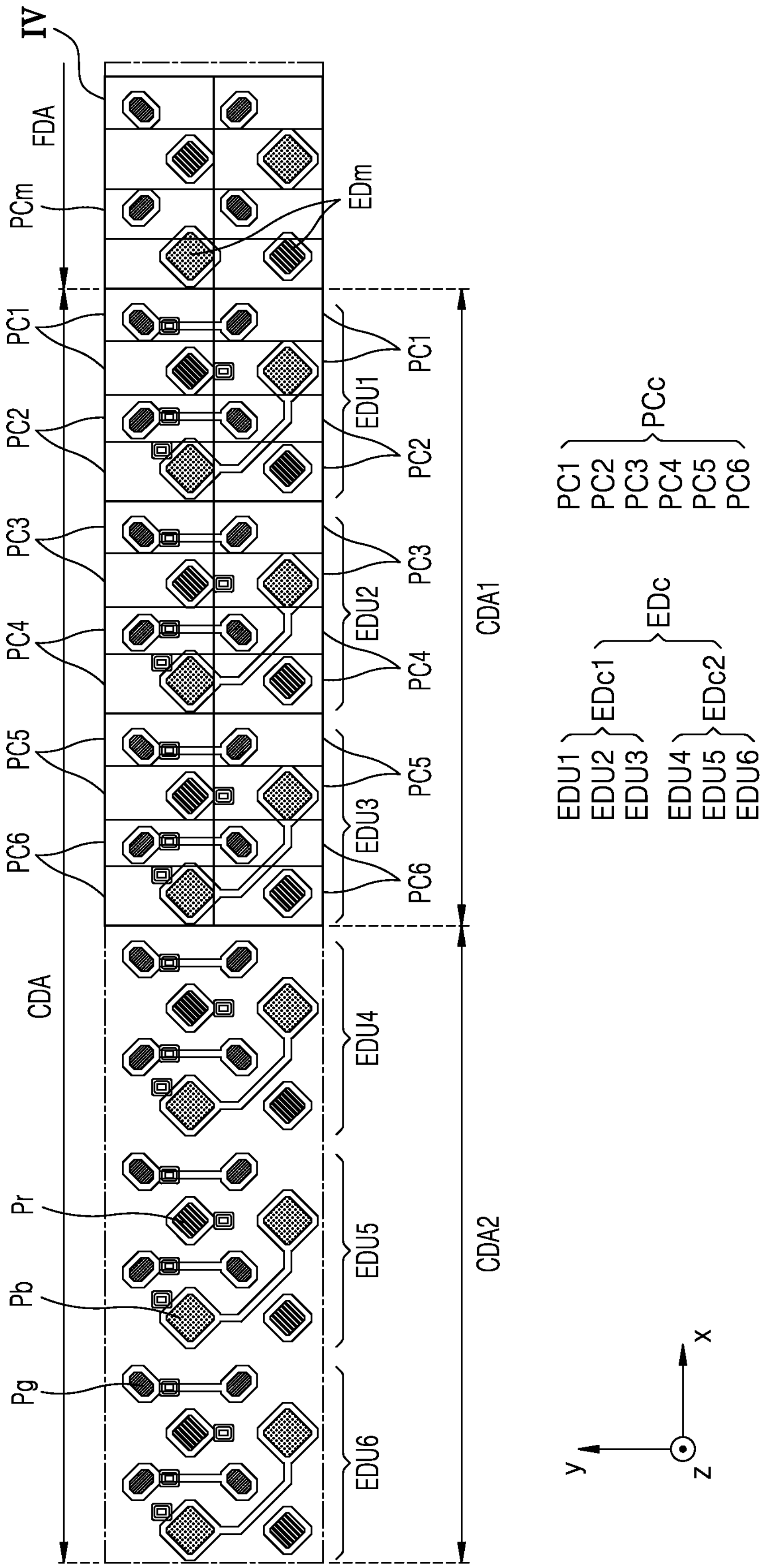

FIGS. 11A and 11B are schematic arrangement diagrams illustrating the arrangement relationship between some corner light-emitting elements and some corner pixel circuits, which are arranged in a corner display area of a display panel, according to an embodiment.

Referring to FIG. 11A, in the corner display area CDA, the corner pixel circuits PCc may be arranged in the first corner display area CDA1. Light-emitting elements arranged in the second corner display area CDA2 may be connected to the corner pixel circuits PCc arranged in the first corner display area CDA1 through the connection wirings CWL.

Each corner pixel circuit PCc arranged in the first corner display area CDA1 may be connected to a plurality of light-emitting elements that emit light of the same color. For example, one corner pixel circuit PCc may be connected to two light-emitting elements that emit light of the same color.

The corner pixel circuit PCc may be electrically connected to the light-emitting element via the connection wirings CWL. The connection wiring CWL may be connected to the pixel electrode 210 of the light-emitting element via a contact hole CNT. Thus, the connection wirings CWL may extend from a first corner display area CDA1 to a second corner display area CDA2. The connection wiring CWL may extend generally in the x direction or −x direction.

The connection wirings CWL may include first connection wirings CWL1 and second connection wirings CWL2, which are arranged in different layers. In some embodiments, some corner pixel circuits PCc may be connected to the light-emitting element by one of the first connection wirings CWL1. In some embodiments, the corner pixel circuits PCc may be connected to the light-emitting element by one of the second connection wirings CWL2. In some embodiments, the corner pixel circuits PCc may be connected to the light-emitting element by one of the first connection wirings CWL1 and the second connection wirings CWL2. In some embodiments, portions of the first connection wirings CWL1 and the second connection wirings CWL2 may be used as a bridge wiring for connecting two light-emitting elements that emit light of the same color.

Referring to FIG. 11B, as described above, a plurality of main light-emitting elements EDm and a plurality of main pixel circuits PCm may be arranged in the front display area FDA, and a plurality of corner light-emitting elements EDc and a plurality of corner pixel circuits PCc may be arranged in the corner display area CDA. In this case, the main light-emitting elements EDm may be arranged to overlap at least portions of each of the main pixel circuits PCm electrically connected to each of the main light-emitting elements EDm. That is, in the front display area FDA, the main pixel circuits PCm may be arranged in a matrix shape in the first direction (e.g., x direction) and the second direction (e.g., y direction), and the main light-emitting elements EDm may be arranged in the arrangement manner of the main pixel circuits PCm.

The corner display area CDA may include a first corner display area CDA1 and a second corner display area CDA2. The first corner display area CDA1 may be an area in which a plurality of corner pixel circuits PCc are arranged, and the second corner display area CDA2 may be an area in which the driving circuit (see SDRV1 of FIG. 7) is arranged. As the plurality of corner light-emitting elements EDc are arranged in both the first corner display area CDA1 and the second corner display area CDA2, a plurality of corner light-emitting elements EDc may be arranged on each of the corner pixel circuits PCc and the driving circuit (scc SDRV1 of FIG. 7). That is, the plurality of corner light-emitting elements EDc may be classified into first corner light-emitting elements EDc1 arranged on the corner pixel circuits PCc, and second corner light-emtiting elements EDc2 arranged on the driving circuit (see SDRV1 of FIG. 7). However, both the first corner light-emitting elements EDc1 and the second corner light-emitting element EDc2 may be driven while being electrically connected to the corner pixel circuits PCc arranged in the first corner display area CDA1.

Specifically, the corner light-emitting elements EDc arranged in the corner display area CDA may include light-emitting element units EDU1, EDU2, EDU3, EDU4, EDU5, and EDU6. In an embodiment, a light-emitting unit that is closest to the front display area FDA may be a first light-emitting element unit EDU1, and a light-emitting unit that is farthest from the front display area FDA may be a sixth light-emitting element unit EDU6. One light-emitting unit may include two first sub-pixels Pr, four second sub-pixels Pg, and two third sub-pixels Pb. Each of the corner light-emitting elements EDc may share a pixel electrode with the corner light-emitting element EDc that emits light of the same color and is arranged to be adjacent to each corner light-emitting element EDc so that two corner light-emitting elements EDc may be connected to one corner pixel circuit PCc. For example, the first light-emitting element unit EDU1 may include eight corner light-emitting elements EDC and may be connected to four corner pixel circuits PCc.

Each of four corner pixel circuits PCc connected to the corner light-emitting elements EDc included in the first light-emitting element unit EDU1 may be referred to as a first corner pixel circuit PC1. Similarly, each of the four corner pixel circuits PCc connected to the corner light-emitting elements EDc included in the second light-emitting element unit EDU2 may be referred to as a second corner pixel circuit PC2, and each of four corner pixel circuits PCc connected to the corner light-emitting elements EDc included in the third light-emitting element unit EDU3 may be referred to as a third corner pixel circuit PC3, and each of four corner pixel circuits PCc connected to the corner light-emitting elements EDc included in the fourth light-emitting element unit EDU4 may be referred to as a fourth corner pixel circuit PC4. Similarly, each of four corner pixel circuits PCc connected to the corner light-emitting elements EDc included in the fifth light-emitting element unit EDU5 may be referred to as a fifth corner pixel circuit PC5, and each of four corner pixel circuits PCc connected to the corner light-emitting elements EDc included in the sixth light-emitting element unit EDU6 may be referred to as a sixth corner pixel circuit PC6. Thus, the corner pixel circuit PCc may include first through sixth corner pixel circuits PC1, PC2, PC3, PC4, PC5, and PC6, and the corner pixel circuit PCc that is closest to the front display area FDA may be a first corner pixel circuit PC1, and the corner pixel circuit PCc that is farthest from the front display area FDA may be a sixth corner pixel circuit PC6.

In this case, the first through sixth corner pixel circuits PC1, PC2, PC3, PC4, PC5, and PC6 may have different pixel circuit structures. Specifically, the first through sixth corner pixel circuits PC1, PC2, PC3, PC4, PC5, and PC6 may be designed in such a way that luminance may be gradually changed as the first through sixth corner pixel circuits PC1, PC2, PC3, PC4, PC5, and PC6 get farther from the front display area FDA. For example, the first corner pixel circuits PC1 disposed closest to the front display area FDA may be formed to have the smallest luminance value, and the sixth corner pixel circuit PC6 disposed farthest from the front display area FDA may be formed to have the largest luminance value, and the second to fifth corner pixel circuits PC2, PC3, PC4, and PC5 disposed therebetween may be formed to have gradually-increasing luminance values. To this end, in an embodiment, the first through sixth corner pixel circuits PC1, PC2, PC3, PC4, PC5, and PC6 may be designed in such a way that capacitance of a boost capacitor may be gradually changed as the first through sixth corner pixel circuits PC1, PC2, PC3, PC4, PC5, and PC6 get farther from the front display area FDA. In other words, the plurality of corner pixel circuits PCc may be formed such that the capacitance of the boost capacitors included in each of the plurality of corner pixel circuits PCc gradually increases or decreases through six steps as the plurality of corner pixel circuits PCc get farther from the front display area FDA.

Thus, the display apparatus according to an embodiment may prevent boundary defects due to a luminance deviation between the front display area FDA and the corner display area CDA. In the corner display area CDA, one corner pixel circuit PCc is connected to two corner light-emitting elements EDc so that, when the corner pixel circuit (Cc and the main pixel circuit PCm have the same pixel circuit structure, the luminance of the corner light-emitting elements EDc may be reduced. Thus, it is necessary to design the corner pixel circuit PCc and the main pixel circuit PCm separately so that the corner pixel circuits PCc may have a higher luminance compared to the main pixel circuit PCm. However, when the corner pixel circuit PCc and main pixel circuit PCm are used differently, a luminance deviation between the corner display area CDA and the front display area FDA may occur, resulting in boundary defects. Thus, when the pixel circuit structure is designed such that the first through six corner pixel circuits PC1, PC2, PC3, PC4, PC5 and PC6 have gradual luminance values, as in one embodiment, the problem of decreasing the luminance of the corner light-emitting elements EDc may be solved, and the effect of preventing boundary defects between the corner display area CDA and the front display area FDA may be realized at the same time.

The pixel circuit structure of the corner pixel circuits PCc will be described in detail in FIGS. 12 through 14*h* below. On the other hand, the corner pixel circuits PCc may not be limited to be divided into the first through sixth corner pixel circuits PC1, PC2, PC3, PC4, PC5, and PC6. For example, depending on the position of the corner display area CDA, when there are three light-emitting element units disposed along a first direction (e.g., x direction) in the corner display area CDA, it may be designed so that the corner pixel circuits PCc are divided into first through third corner pixel circuits PC1, PC2, and PC3 and luminance of the corner pixel circuits PCc is gradually changed through three steps. Similarly, when there are four light emitting element units disposed along the first direction in the corner display area CDA, it may be designed so that the corner pixel circuits PCc are divided into first to fourth corner pixel circuits PC1, PC2, PC3 and PC4 and luminance of the corner pixel circuits PCc is gradually changed through four steps. In other words, if there are n light-emitting element units disposed in the first direction in the corner display area CDA, luminance of the corner pixel circuit PCc may be gradually changed through n steps.

Figure 12:
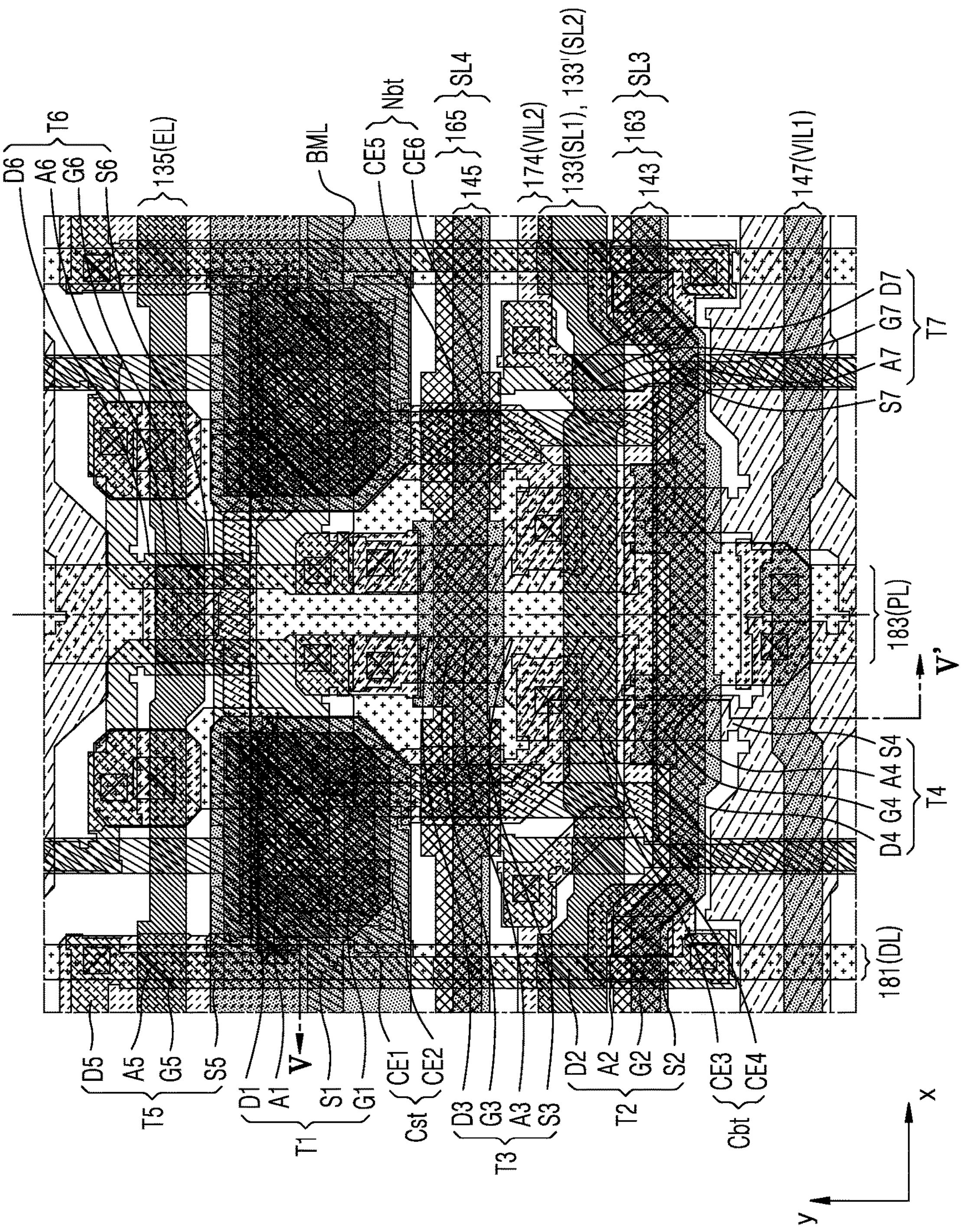
FIG. 12 is a layout diagram schematically illustrating positions of a plurality of thin-film transistors and capacitors arranged in a pair of corner pixel circuits of a display apparatus according to an embodiment.
Figure 13:
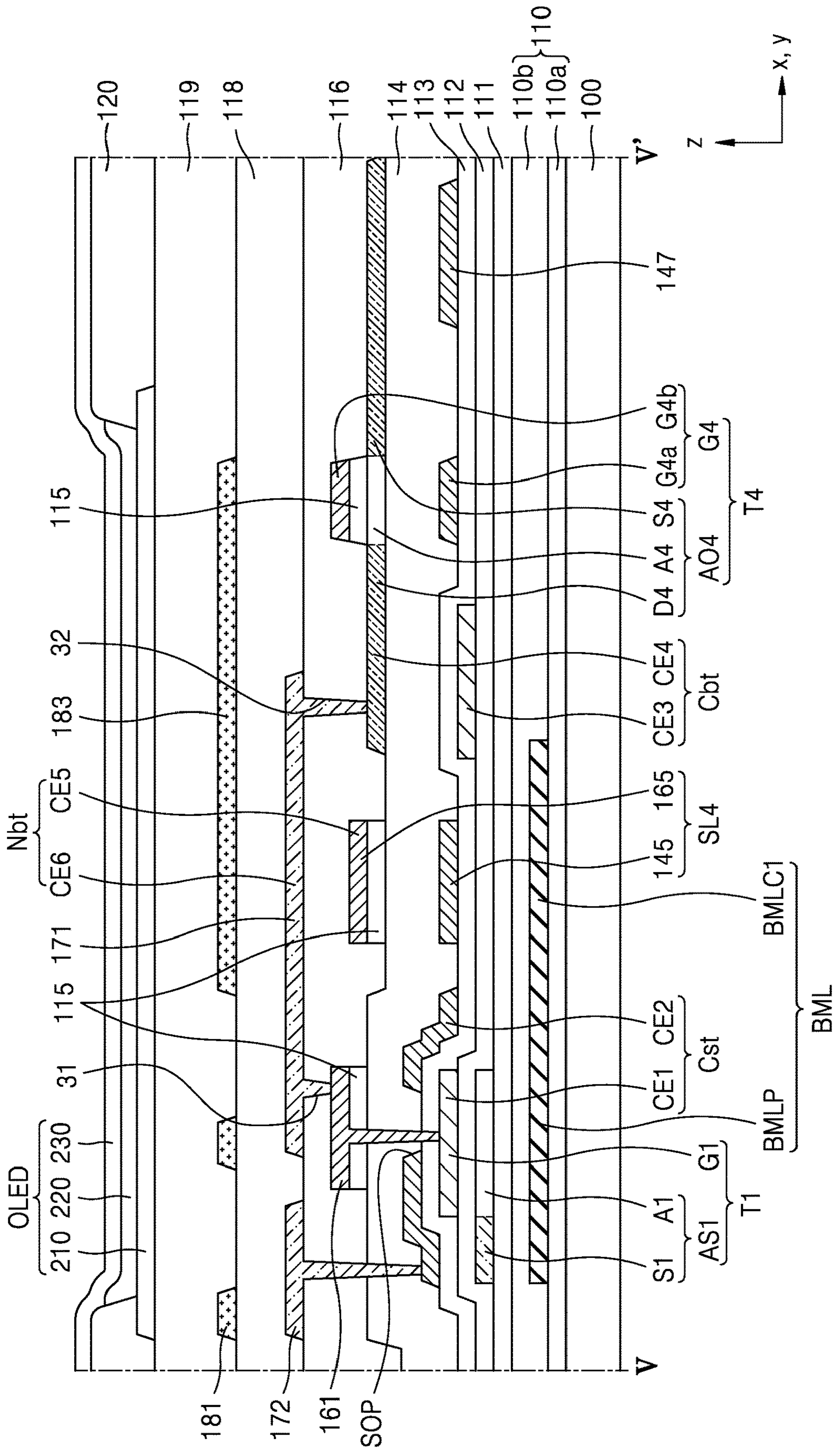
FIG. 13 is a schematic cross-sectional view of the display apparatus taken along a line V-V' of FIG. 12.

FIG. 12 is an arrangement diagram schematically illustrating positions of a plurality of thin-film transistors and capacitors arranged in a pair of corner pixel circuits of a display apparatus according to an embodiment. FIG. 13 is a schematic cross-sectional view of the display apparatus taken along a line V-V' of FIG. 12. FIGS. 14A through 14H are arrangement diagrams schematically illustrating elements of FIG. 13 according to layers.

FIG. 12 illustrates the structure of a pair of pixel circuits arranged in the same row of an adjacent column. In FIG. 12, a pixel circuit of a pixel arranged on the left and a pixel circuit of a pixel arranged on the right may be symmetrical.

Referring to FIG. 12, the first scan line SL1, the second scan line SL2, the third scan line SL3, the fourth scan line SL4, the emission control line 135, the first initialization voltage line 147, and the second initialization voltage line 174 may extend in the x direction and may be spaced apart from each other in each row. The data line 181 may extend in the y direction and may be spaced apart from each other in each column. The driving voltage line 183 may extend in the y direction and may include a portion placed in each column and a portion shared between adjacent pixel circuits. The second scan line 133' may be a first scan line SL1 in the previous row. That is, the first scan line 133 shown in FIG. 12 may be the second scan line SL2 in the next row.

The pixel circuit may include a first transistor T1, a second transistor T2, a third transistor T3, a fourth transistor T4, a fifth transistor T5, a sixth transistor T6, a seventh transistor T7, a storage capacitor Cst, a first boost capacitor Cbt, and a second boost capacitor Nbt.

In an embodiment, each of the first transistor T1, the second transistor T2, the fifth transistor T5, the sixth transistor T6, and the seventh transistor T7 may be provided as a silicon-based thin-film transistor including a silicon semiconductor. The third transistor T3 and the fourth transistor T4 may be provided as an oxide-based thin-film transistor including an oxide semiconductor.

Semiconductor layers of the first transistor T1, the second transistor T2, the fifth transistor T5, the sixth transistor T6, and the seventh transistor T7 may be disposed in the same layer and may include the same material. For example, the semiconductor layer may include polycrystalline silicon. The semiconductor layers of the first transistor T1, the second transistor T2, the fifth transistor T5, the sixth transistor T6, and the seventh transistor T7 may be connected to each other and may be bent in various shapes.

Each of the semiconductor layers of the first transistor T1, the second transistor T2, the fifth transistor T5, the seventh transistor T6, and the seventh transistor T7 may include a channel region, and a source region and a drain region at opposite sides of the channel region. In an example, the source region and the drain region may be doped with impurities, and the impurities may include N-type impurities or P-type impurities. The source region and the drain region may correspond to a source electrode and a drain electrode, respectively. The source region and the drain region may be changed according to characteristics of the transistor. Hereinafter, the terms such as a source region and a drain region instead of a source electrode or a drain electrode are used.

The first transistor T1 may include a first semiconductor layer and a first gate electrode G1. The first semiconductor layer may include a first channel region A1, and a first source region S1 and a first drain region D1 at opposite sides of the first channel region A1. The first semiconductor layer may have a bent shape so that the first channel region A1 may be formed to be longer than the other channel regions A2 to A7. For example, the first semiconductor layer has a shape in which it is bent a plurality of times, such as 'ㄷ', 'ㄹ', 'S', 'M', 'W', and the like so that a long channel length may be formed in a narrow space. ince the first channel region A1 is formed long, the driving range of a gate voltage applied to the first gate electrode G1 increases so that the gray scale of light emitted from the organic light-emitting diode OLED may be more accurately controlled and a display quality may be enhanced. Alternatively, the first semiconductor layer may have not a bent shape but a straight shape. In an embodiment, the first semiconductor layer may include a bent shape in the front display area FDA and may be provided in a straight shape in the corner display area CDA. The first gate electrode G1 may have an isolated shape and may overlap the first channel region A1 with a first insulating layer (see 112 of FIG. 13) therebetween.

The storage capacitor Cst may be disposed to overlap the first transistor T1. The storage capacitor Cst may include a first electrode CE1 and a second electrode CE2. The first gate electrode G1 may function as a control electrode of the first transistor T1 and also as the first electrode CE1 of the storage capacitor Cst. That is, the first gate electrode G1 and the first electrode CE1 may be integrally formed. The second electrode CE2 of the storage capacitor Cst may be provided to overlap the first electrode CE1 with a second insulating layer (see 113 of FIG. 13). In this case, the second insulating layer 113 may serve as a dielectric layer of the storage capacitor Cst.

A node connection line 171 may be electrically connected to the first electrode CE1 and a fourth semiconductor layer of the fourth transistor T4. Specifically, one end of the node connection line 171 may be electrically connected to the fourth semiconductor layer of the fourth transistor T4 via a contact hole, and the other end of the node connection line 171 may be electrically connected to the connection electrode 161 via a contact hole. The second electrode CE2 may be electrically connected to the connection electrode 172, and the connection electrode 172 may be electrically connected to the driving voltage line 183.

The second transistor T2 may include a second semiconductor layer and a second gate electrode G2. The second semiconductor layer may include a second channel region A2, and a second source region S2 and a second drain region D2 at opposite sides of the second channel region A2. The second source region S2 may be electrically connected to the data line 181, and the second drain region D2 may be connected to the first source region S1. The second gate electrode G2 may be provided as a part of the first scan line 133.

The fifth transistor T5 may include a fifth semiconductor layer and a fifth gate electrode G5. The fifth semiconductor layer may include a fifth channel region A5, and a fifth source region S5 and a fifth drain region D5 at opposite sides of the fifth channel region A5. The fifth source region S5 may be electrically connected to the connection electrode 172, and the fifth drain region D5 may be connected to the first source region S1. The fifth gate electrode G5 may be provided as a part of the emission control line 135.

The sixth transistor T6 may include a sixth semiconductor layer and a sixth gate electrode G6. The sixth semiconductor layer may include a sixth channel region A6, and a sixth source region S6 and a sixth drain region D6 at opposite sides of the sixth channel region A6. The sixth source region S6 may be connected to the first drain region D1, and the sixth drain region D6 may be electrically connected to a pixel electrode (see 210 of FIG. 13) of the organic light-emitting diode OLED. The sixth gate electrode G6 may be provided as a part of the emission control line 135.

The seventh transistor T7 may include a seventh semiconductor layer and a seventh gate electrode G7. The seventh semiconductor layer may include a seventh channel region A7, and a seventh source region S7 and a seventh drain region D7 at opposite sides of the seventh channel region A7. The seventh drain region D7 may be electrically connected to the second initialization voltage line 174, and the seventh source region S7 may be connected to the sixth drain region D6. The seventh gate electrode G7 may be provided as a part of a second scan line 133'.

A first insulating layer (see 114 of FIG. 13) may be disposed on the first, the second, the fifth through seventh transistors T1, T2, T5, T6, and T7 each including a silicon semiconductor, and the third and fourth transistors T3 and T4 each including an oxide semiconductor may be disposed on the first insulating layer 114.

Each of semiconductor layers of the third transistor T3 and the fourth transistor T4 may include a channel region, a source region and a drain region at opposite sides of the channel region. The source region and the drain region may correspond to a source electrode and a drain electrode, respectively. Hereinafter, the terms such as a source region and a drain region instead of a source electrode or a drain electrode are used.

The third transistor T3 may include a third semiconductor layer and a third gate electrode G3 each including an oxide semiconductor. The third semiconductor layer may include a third channel region A3, and a third source region S3 and a third drain region D3 at opposite sides of the third channel region A3. The third source region S3 may be bridge-connected to the first gate electrode G1 via the node connection line 171. In addition, the third source region S3 may be connected to the fourth drain region D4 in the same layer. The third drain region D3 may be electrically connected to a first semiconductor layer of the first transistor T1 and a sixth semiconductor layer of the sixth transistor T6. The third gate electrode G3 may be provided as a part of the fourth scan line SL4.

The fourth transistor T4 may include a fourth semiconductor layer and a fourth gate electrode G4 each including an oxide semiconductor. The fourth semiconductor layer may include a fourth channel region A4, and a fourth source region S4 and a seventh drain region D4 at opposite sides of the fourth channel region A4. The fourth source region S4 may be electrically connected to the first initialization voltage line 147, and the fourth drain region D4 may be bridge-connected to the first gate electrode G1 via the node connection line 171. The fourth gate electrode G4 may be provided as a part of the third scan line SL3.

A third gate insulating layer (see 115 of FIG. 13) may be disposed between the third semiconductor layer and the third gate electrode G3 and between the fourth semiconductor layer and the fourth gate electrode G4 to correspond to each channel region.

The first boost capacitor Cbt may include a third electrode CE3 (or a first lower boost electrode) and a fourth electrode CE4 (or a first upper boost electrode). The third electrode CE3 of the first boost capacitor Cbt may be provided as a part of the first scan line 133 and may be connected to the second gate electrode G2. The fourth electrode CE4 of the first boost capacitor Cbt may be disposed to overlap the third electrode CE13 and may be provided as an oxide semiconductor. The fourth electrode CE4 may be provided in the same layer as the third semiconductor layer of the third transistor T3 and the fourth semiconductor layer of the fourth transistor T4. Alternatively, the fourth electrode CE4 may extend from the fourth semiconductor layer. Alternatively, the fourth electrode CE4 may extend from the third semiconductor layer.

The second boost capacitor Nbt may include a fifth electrode CE5 (or a second lower boost electrode) and a sixth electrode CE6 (or a second upper boost electrode). The fifth electrode CE5 of the second boost capacitor Nbt may be located in the same layer as the gate electrode G3 of the third transistor T3, and the sixth electrode CE6 of the second boost capacitor Nbt may be located in the same layer as the node connection line 171. The fifth electrode CE5 of the second boost capacitor Nbt may extend from the fourth scan line SL4 and may be connected to the gate electrode G3 of the third transistor T3. The sixth electrode CE6 of the second boost capacitor Nbt may extend from the node connection line 171 and may be electrically connected to the third source region S3 of the third transistor T3.

In an embodiment, a portion of wirings may be provided as two conductive layers arranged in different layers. For example, the third scan line SL3 may include a lower scan line 143 and an upper scan line 163, which are arranged in different layers. The lower scan line 143 may be provided in the same layer as the second electrode CE2 of the storage capacitor Cst and may include the same material as the second electrode CE2 of the storage capacitor Cst. The upper scan line 163 may be disposed on the third gate insulating layer (see 115 of FIG. 13). The lower scan line 143 may be disposed to overlap at least a portion of the upper scan line 163. Because the lower scan line 143 and the upper scan line 163 correspond to a portion of the third gate electrode of the third transistor T3, the third transistor T3 may have a double gate structure including a control electrode at each of an upper portion and a lower portion of the semiconductor layer.

In addition, the fourth scan line SL4 may include a lower scan line 145 and an upper scan line 165, which are arranged in different layers. The lower scan line 145 may be provided in the same layer as the second electrode CE2 of the storage capacitor Cst and may include the same material as the second electrode CE2 of the storage capacitor Cst. The upper scan line 165 may be disposed on the third gate insulating layer (see 115 of FIG. 13). The lower scan line 145 may be disposed to overlap at least a portion of the upper scan line 165. Because the lower scan line 145 and the upper scan line 165 correspond to a portion of the fourth gate electrode 4 of the fourth transistor T4, the fourth transistor T4 may have a double gate structure including a control electrode at each of an upper portion and a lower portion of the semiconductor layer.

A first initialization voltage line 147 and a second initialization voltage line 174 may be disposed in different layers. The first initialization voltage line 147 may be provided in the same layer as the second electrode CE2 of the storage capacitor Cst and may include the same material as the second electrode CE2 of the storage capacitor Cst. The second initialization voltage line 174 may be provided in the same layer as the connection electrode 172 and may include the same material as the connection electrode 172.

Hereinafter, a structure of a display apparatus according to an embodiment will be described in detail with reference to FIG. 13 and FIGS. 14 through 14H according to a stack order.

FIG. 13 illustrates a cross-section of portions that correspond to the first transistor T1, the fourth transistor T4, the storage capacitor Cst, the first boost capacitor Cbt, the second boost capacitor Nbt, and the organic light-emitting diode OLED, and some elements may be omitted. The stack structure of the second transistor T2 and the fifth through seventh transistors T5, T6, and T7 may be the same as or similar to the first transistor T1, and the stack structure of the third transistor T3 may be the same as or similar to the fourth transistor T4.

The substrate 100 may include a glass material, a ceramic material, a metal material, or a material having flexible or bendable characteristics. When the substrate 100 has flexible or bendable characteristics, the substrate 100 may include a polymer resin such as polyethersulphone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The substrate 100 may have a single layer or multi-layered structure of the above-described materials, and in the case of the multi-layered structure, the substrate 100 may further include an inorganic layer. For example, the substrate 100 may have a stack structure of a first base layer/a barrier layer/a second base layer. Each of the first base layer and the second base layer may be an organic layer including polymer resin. Each of the first base layer and the second base layer may include a transparent polymer resin. The barrier layer that is a barrier layer for preventing penetration of external foreign substances and may have a single layer or multi-layered structure including an inorganic material such as silicon nitride (SiNx) or silicon oxide (SiOx).

A buffer layer 111 may be disposed on the substrate 100. The buffer layer 111 may be configured to increase the smoothness of an upper surface of the substrate 100, and the buffer layer 111 may include an oxide layer such as silicon oxide (SiOx) or a nitride layer such as silicon nitride (SiNx), or silicon oxynitride (SiON).

The barrier layer 110 may be further provided between the substrate 100 and the buffer layer 111. The barrier layer 110 may be configured to prevent impurities from the substrate 100 from penetrating into a silicon semiconductor layer or to minimize penetration. The barrier layer 110 may have a single layer or multi-layered structure including an inorganic material such as silicon nitride (SiNx) or silicon oxide (SiOx). The barrier layer 110 may include a first barrier layer 110*a* and a second barrier layer 110*b*.

Figure 14A:
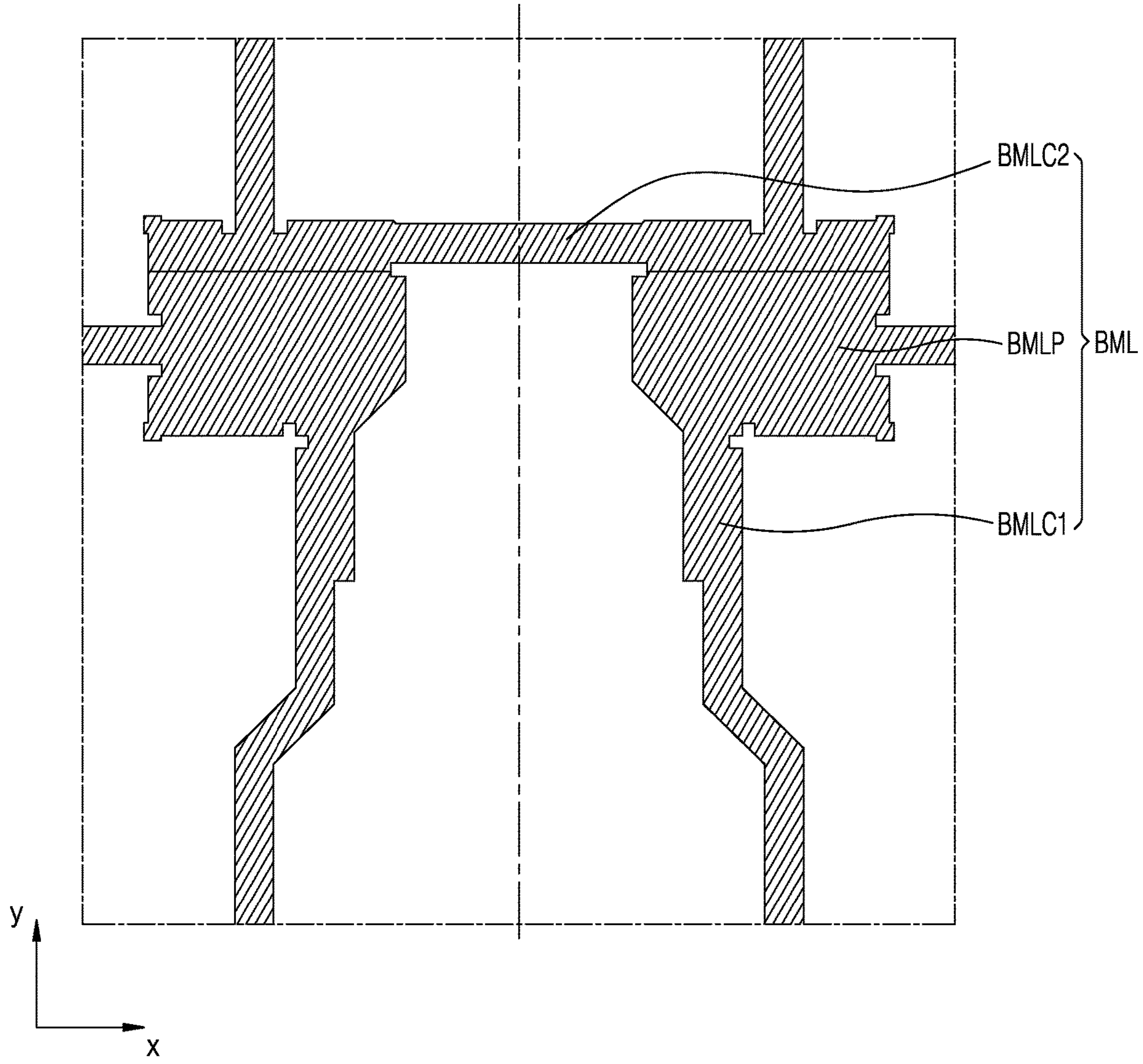
FIGS. 14A, 14B, 14C, 14D, 14E, 14F, 14G, and 14H are layout diagrams schematically illustrating elements of FIG. 13 for each layer.

As illustrated in FIG. 14A, a shielding layer BML may be between the first barrier layer 110*a* and the second barrier layer 110*b*. The shielding layer BML may include a shielding pattern BMLP disposed to correspond to the first transistor T1, a first connection line BMLC1 extending from the shielding pattern BMLP in the y direction, and a second connection line BMLC2 extending from the shielding pattern BMLP in the x direction. In another embodiment, the shielding layer BML may be between the second barrier layer 110*b* and the buffer layer 111.

Figure 14B:
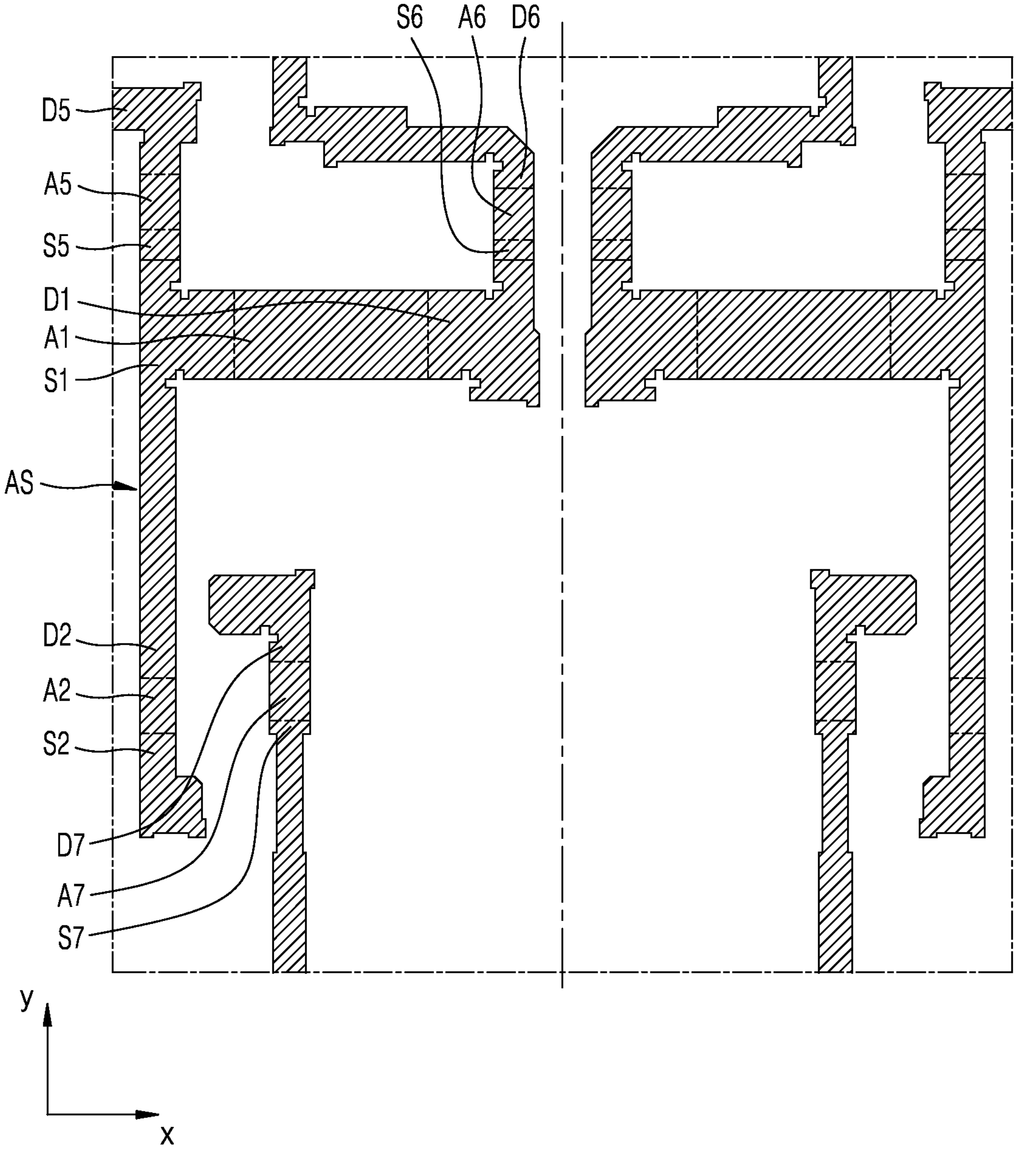

As illustrated in FIG. 14B, a semiconductor layer AS of each of the first transistor T1, the second transistor T2, the fifth transistor T5, the sixth transistor T6, and the seventh transistor T7 may be arranged on the buffer layer 111.

The semiconductor layer AS may include a first channel region A1, a first source region S1, and a first drain region D1 that are first semiconductor layers of the first transistor T1, a second channel region A2, a second source region S2, and a second drain region D2 that are second semiconductor layers of the second transistor T2, a fifth channel region A5, a fifth source region S5, and a fifth drain region D5 that are fifth semiconductor layers of the fifth transistor T5, a sixth channel region A6, a sixth source region S6, and a sixth drain region D6 that are sixth semiconductor layers of the sixth transistor T6, and a seventh channel region A7, a seventh source region S7, and a seventh drain region D7 that are seventh semiconductor layers of the seventh transistor T7. That is, a channel region, a source region, and a drain region of each of the first through seventh transistors T1 through T7 may be partial regions of the semiconductor layer AS.

In FIG. 14B, the semiconductor layers of the first transistor T1, the second transistor T2, the fifth transistor T5, and the sixth transistor T6 may be connected to each other, and the seventh semiconductor layer of the seventh transistor T7 may be separately provided. This is because the seventh semiconductor layer of the seventh transistor T7 shown in FIG. 14B is a partial region of a semiconductor layer extending to the next row. Semiconductor layers of the first transistor T1, the second transistor T2, the fifth transistor T5, the sixth transistor T6, and the seventh transistor T7 (which extends from above the active layer AS shown in FIG. 14B) that constitute a pixel circuit of a current row may be one semiconductor layer in which the semiconductor layers are connected to each other.

A first gate insulating layer 112 may be located on the semiconductor layer AS. The first gate insulating layer 112 may include an inorganic material including oxide or nitride. For example, the first insulating layer 112 may include at least one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

Figure 14C:
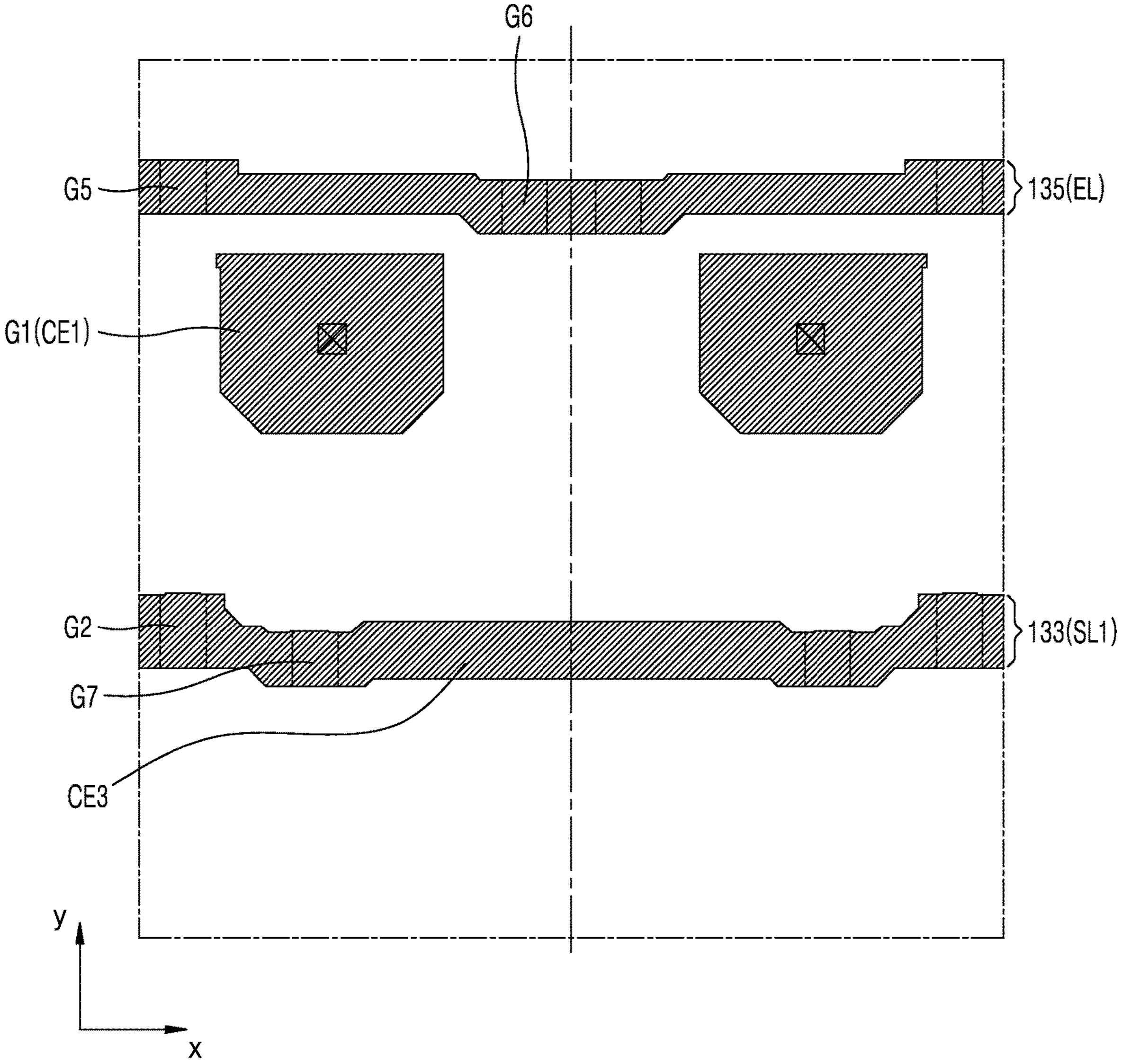

As illustrated in FIG. 14C, the first gate electrode G1 of the first transistor T1, the second gate electrode G2 of the second transistor T2, the fifth gate electrode G5 of the fifth transistor T5, the sixth gate electrode G6 of the sixth transistor T6, and the seventh gate electrode G7 of the seventh transistor T7 may be arranged on the first gate insulating layer 112. In addition, the first scan line 133 and the emission control line 135 may extend in the x direction and may be disposed on the first gate insulating layer 112. A portion of the first scan line 133 may be a third electrode CE3 of the first boost capacitor Cbt.

The first gate electrode G1 of the first transistor T1 may be provided in an isolated shape. The second gate electrode G2 of the second transistor T2 may be a portion of the first scan line 133 that crosses the semiconductor layer AS. The seventh gate electrode G7 of the seventh transistor T7 may be a portion of the first scan line 133 crossing the semiconductor layer AS or a portion of the second scan line (see 133' of FIG. 12) that is a scan line of the next row. FIG. 14C illustrates an example in which the seventh gate electrode G7 of the seventh transistor T7 of a pixel disposed in the previous row is a portion of the first scan line 133 crossing the semiconductor layer AS. The fifth gate electrode G5 of the fifth transistor T5 and the sixth gate electrode G6 of the sixth transistor T6 may be portions of the emission control line 135 crossing the semiconductor layer AS.

The first gate electrode G1 of the first transistor T1 may function as a control electrode of the first transistor T1 and also as the first electrode CE1 of the storage capacitor Cst.

Gate electrodes of the first transistor T1, the second transistor T2, the fifth transistor T5, the sixth transistor T6, and the seventh transistor T7 may include aluminum (Al), platinum (Pt), palladium (Pt), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may have a single layer or multi-layered structure including one or more materials.

A second gate insulating layer 113 may be disposed on the gate electrodes. The second gate insulating layer 113 may include an inorganic material including oxide or nitride. For example, the second insulating layer 113 may include at least one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

Figure 14D:
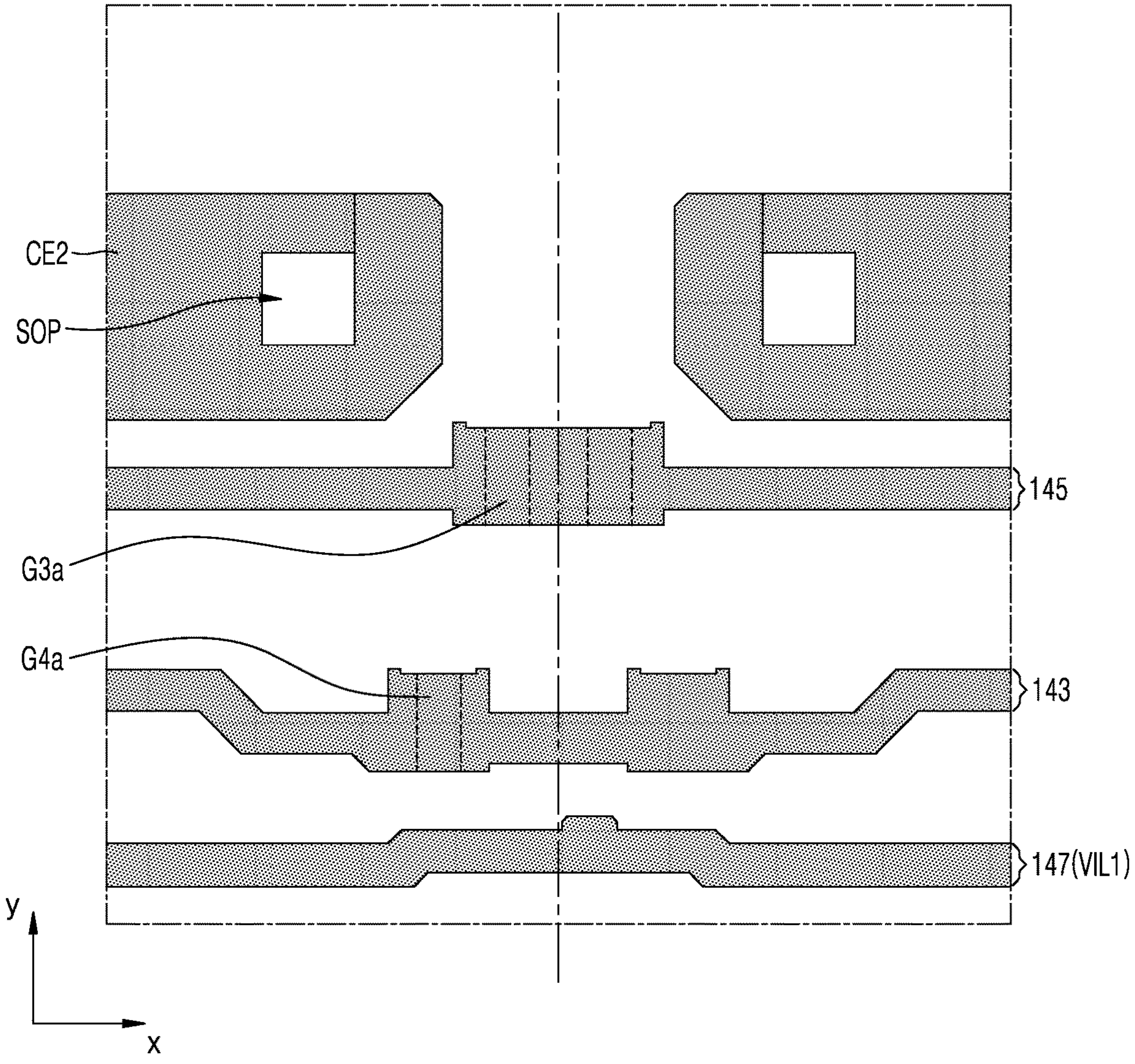

As illustrated in FIG. 14D, the second electrode CE2 of the storage capacitor Cst may be disposed on the second gate insulating layer 113 to overlap the first electrode CE1. The second electrode CE2 may have an opening SOP. The opening SOP may be formed by removing a portion of the second electrode CE2 and may have a closed shape. The second insulating layer 113 may serve as a dielectric layer of the storage capacitor Cst.

The second electrode CE2 of the storage capacitor Cst may have a single layer or multi-layered structure including one or more materials selected from the group consisting of Al, Pt, Pd, Ag, Mg, gold (Au), nickel (Ni), neodymium (Nd), iridium (Ir), chromium (Cr), lithium (Li), calcium (Ca), molybdenum (Mo), titanium (Ti), tungsten (W), or copper (Cu).

The first initialization voltage line 147, the lower scan line 143 of the third scan line SL3, and the lower scan line 145 of the fourth scan line SL4 may be provided on the second gate insulating layer 113 and may extend in the x direction and may include the same material as the second electrode CE2 of the storage capacitor Cst. A portion of the lower scan line 143 of the third scan line SL3 that overlaps the semiconductor layer (see AO of FIG. 14E) may be a lower gate electrode G4*a* of the fourth transistor T4. A portion of the lower scan line 145 of the fourth scan line SL4 that overlaps the semiconductor layer (see AO of FIG. 14E) may be a lower gate electrode G3*a* of the third transistor T3.

A first interlayer insulating layer 114 may be disposed on the second electrode CE2 of the storage capacitor Cst. The first interlay insulating layer 114 may include an inorganic material including oxide or nitride. For example, the first interlayer insulating layer 114 may include at least one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

Figure 14E:
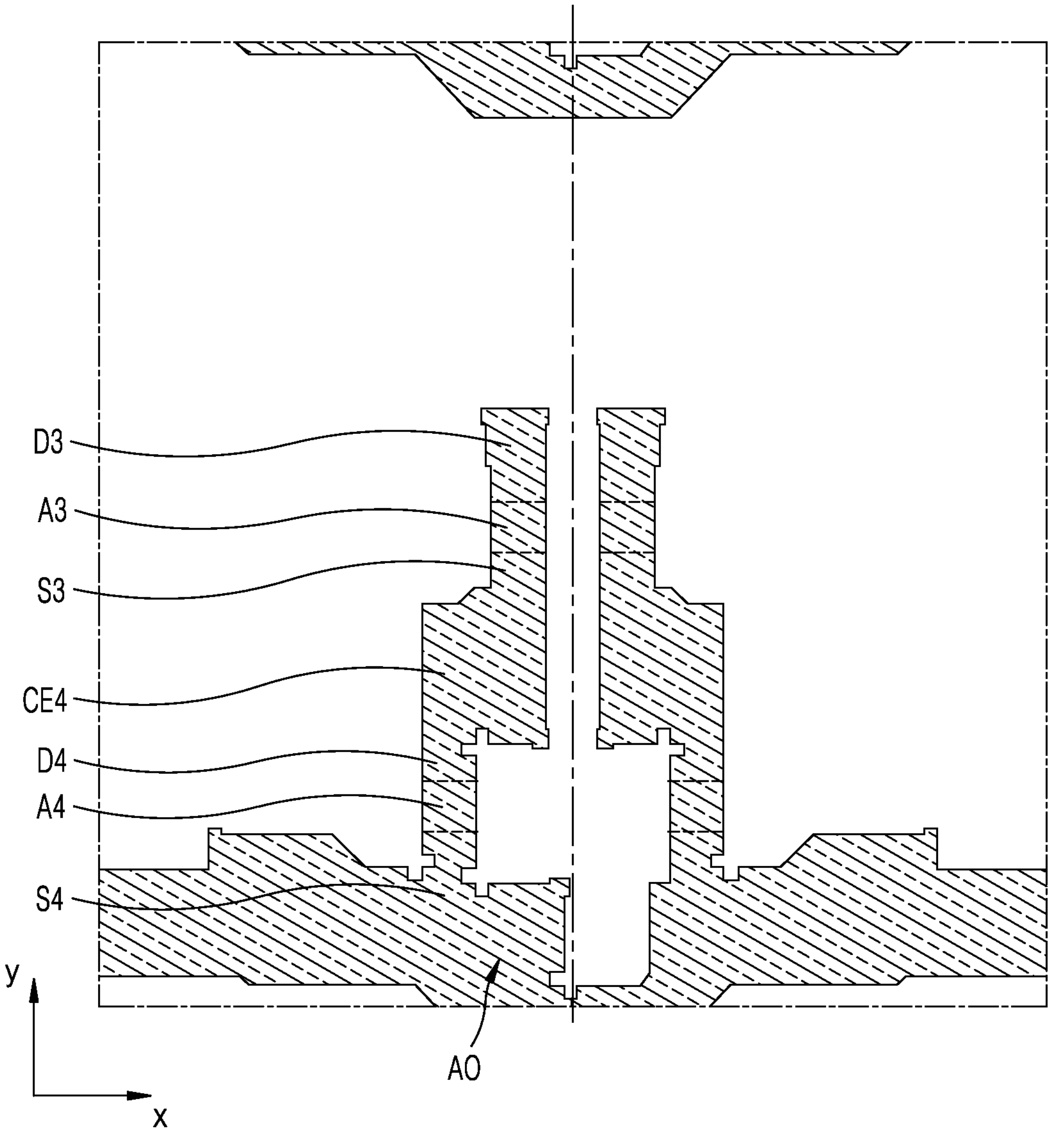

As illustrated in FIG. 14E, the semiconductor layer AO including an oxide semiconductor may be disposed on the first interlayer insulating layer 114. The semiconductor layer AO may include a Zn oxide, an In—Zn oxide, a Ga—In—Zn oxide as a Zn oxide-based material. In some embodiments, the semiconductor layer AO may include a In—Ga—Zn—O (IGZO) semiconductor, an In—Sn—Zn—O (ITZO) semiconductor, an In—Ga—Sn—Zn—O (IGTZO) semiconductor in which metal such as In, Ga, Sn is included in ZnO.

Each of semiconductor layers of the third transistor T3 and the fourth transistor T4 may include a channel region, a source region and a drain region at opposite sides of the channel region. A source region and a drain region of each of the third transistor T3 and the fourth transistor T4 may be formed by adjusting a carrier concentration of the oxide semiconductor and making it conductive. For example, the source region and drain region of each of the third transistor T3 and the fourth transistor T4 may be formed by increasing the carrier concentration through plasma treatment by using a hydrogen (H)-based gas, a fluorine (F)-based gas, or a combination thereof.

The semiconductor layer AO may include a third channel region A3, a third source region S3, and a third drain region D3 that are third semiconductor layers of the third transistor T3, and a fourth channel region A4, a fourth source region S4 and a fourth drain region D4 that are fourth semiconductor layers of the fourth transistor T4. That is, a channel region, a source region, and a drain region of each of the third transistor T3 and the fourth transistor T4 may be partial regions of the semiconductor layer AS. The fourth source region S4 of the fourth transistor T4 may overlap the first initialization voltage line 147.

The semiconductor layer AO may include a fourth electrode CE4 of the first boost capacitor Cbt. The fourth electrode CE4 of the first boost capacitor Cbt may be located between the third semiconductor layer of the third transistor T3 and the fourth semiconductor layer of the fourth transistor T4. The fourth electrode CE4 may extend from the third semiconductor layer of the third transistor T3 or the fourth semiconductor layer of the fourth transistor T4. That is, the fourth electrode CE4 may be provided as an oxide semiconductor, and may be disposed on the first interlayer insulating layer 114. The second gate insulating layer 113 and the first interlayer insulating layer 114 may be arranged between the third electrode CE3 and the fourth electrode CE4 of the first boost capacitor Cbt, and the second gate insulating layer 113 and the first interlayer insulating layer 114 may function as a dielectric layer of the first boost capacitor Cbt.

Figure 14F:
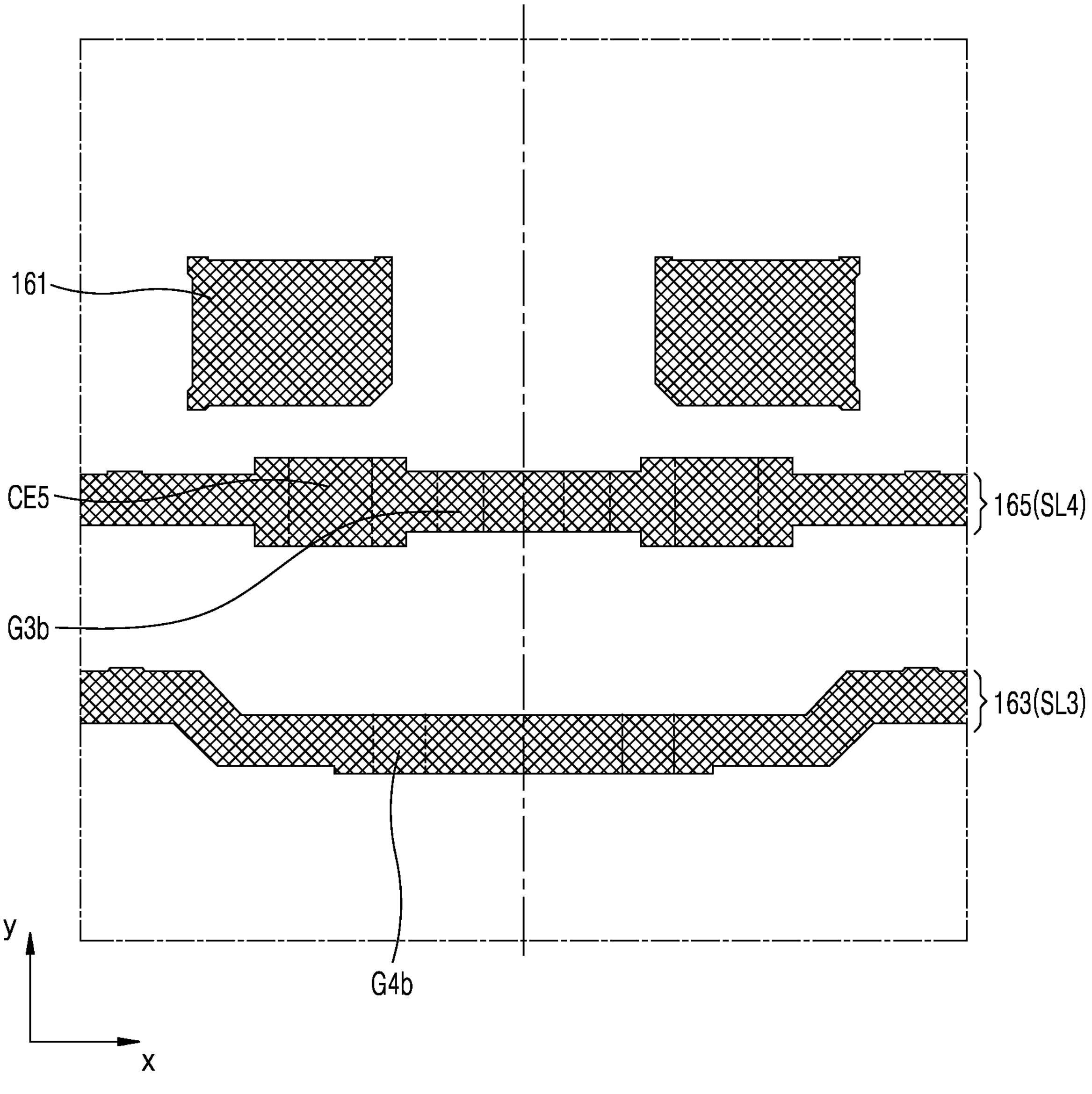

As illustrated in FIG. 14F, the upper scan line 163 of the third scan line SL3 and the upper scan line 165 of the fourth scan line SL4 may extend in the x direction and may be disposed on the semiconductor layer AO. That is, the third scan line SL3 and the fourth scan line SL4 may each be provided as two conductive layers disposed in different layers. In addition, the connection electrode 161 may be provided on the semiconductor layer AO in an isolated shape.

The upper scan line 163 of the third scan line SL3 may be disposed to overlap at least a portion of the lower scan line 143. The upper scan line 165 of the fourth scan line SL4 may be disposed to overlap at least a portion of the lower scan line 145. The connection electrode 161 may be disposed to overlap at least a portion of the first electrode CE1 of the storage capacitor Cst. The third gate insulating layer 115 may be disposed between the semiconductor layer AO and the upper scan line 163 of the third scan line SL3 and between the semiconductor layer AO and the upper scan line 165 of the fourth scan line SL4. The third gate insulating layer 115 may be patterned in a shape corresponding to the upper scan line 163 of the third scan line SL3 and the upper scan line 165 of the fourth scan line SL4.

A portion of the upper scan line 163 of the third scan line SL3 that overlaps the fourth semiconductor layer may be an upper gate electrode G4*b* of the fourth transistor T4. A portion of the upper scan line 165 of the fourth scan line SL4 that overlaps the third semiconductor layer may be an upper gate electrode G3*b* of the third transistor T3. That is, the third transistor T3 and the fourth transistor T4 may have a double gate structure including control electrodes on an upper portion and a lower portion of the semiconductor layer, respectively.

A portion of the fourth scan line SL4 may be a fifth electrode CE5 of the second boost capacitor Nbt. Specifically, a portion of the upper scan line 165 of the fourth scan line SLA that overlaps the node connection line (see 171 of FIG. 14G) may be the fifth electrode CE5 of the second boost capacitor Nbt.

The third gate insulating layer 115 may include an inorganic material including oxide or nitride. For example, the third insulating layer 115 may include at least one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The upper gate electrode G3*b* of the third transistor T3 and the upper gate electrode G4*b* of the fourth transistor T4 may be arranged on the third gate insulating layer 115, may include at least one of Mo, Cu, and Ti, and may have a single layer or multi-layered structure.

Figure 14G:
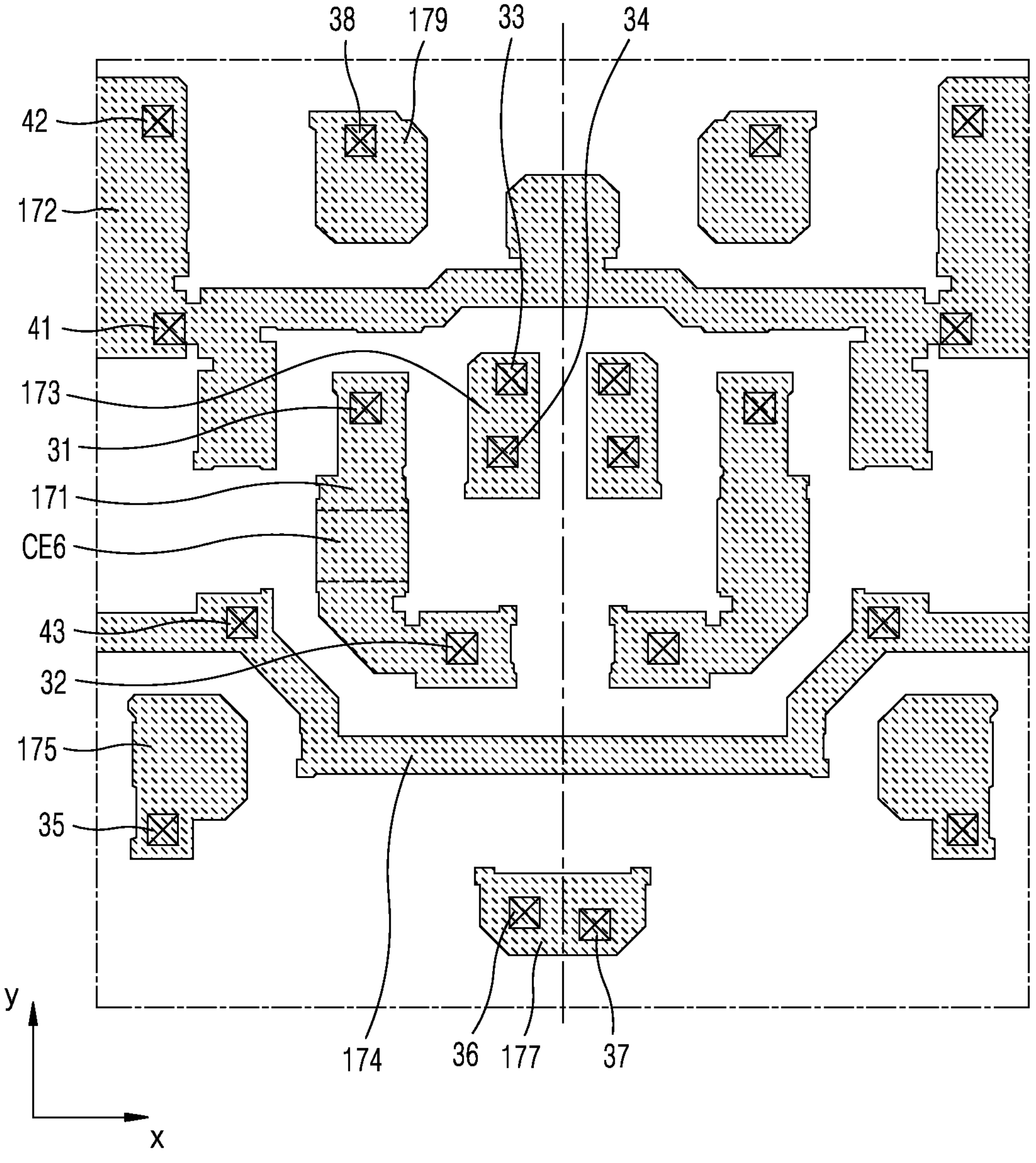

The second interlayer insulating layer 116 may cover the third transistor T3 and the fourth transistor T4. The second interlayer insulating layer 116 may be disposed on the upper gate electrode G3*b* of the third transistor T3 and the upper gate electrode G4*b* of the fourth transistor T4. As illustrated in FIG. 14G, the second initialization voltage line 174, the node connection line 171, and the connection electrodes 172, 173, 175, 177, and 179 may be arranged on the second interlayer insulating layer 116.

The second interlay insulating layer 116 may include an inorganic material including oxide or nitride. For example, the second interlayer insulating layer 116 may include at least one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The second initialization voltage line 174, the node connection line 171, and the connection electrodes 172, 173, 175, 177, and 179 may include a material having high conductivity such as metal, a conductive oxide. For example, the second initialization voltage line 174, the node connection line 171, and the connection electrodes 172, 173, 175, 177, and 179 may have a single layer or multi-layered structure including at least one of Al, Cu, and Ti. In some embodiments, the second initialization voltage line 174, the node connection line 171, and the connection electrodes 172, 173, 175, 177, and 179 may have a triple layer of Ti, Al, and Ti (Ti/Al/Ti), which are sequentially arranged.

The second initialization voltage line 174 may be connected to the seventh drain region D7 of the seventh transistor T7 via a contact hole 43 formed in the first gate insulating layer 112, the second gate insulating layer 113, the first interlayer insulating layer 114, and the second interlayer insulating layer 116.

One end of the node connection line 171 may be connected to the first gate electrode G1 via the contact hole 31. Specifically, the contact hole 31 may pass through the second interlayer insulating layer 116 and may connect the connection electrode 161 to the node connection line 171, and the contact hole through which the third gate insulating layer 115, the first interlayer insulating layer 114 and the second gate insulating layer 113 pass, may connect the connection electrode 161 to the first gate electrode G1. A portion of the node connection line 171 may be inserted into the contact hole 31 so that the node connection line 171 may be electrically connected to the connection electrode 161 and the first gate electrode G1.

The other end of the node connection line 171 may be connected to an oxide semiconductor layer, for example, the fourth electrode CE4 or the fourth semiconductor layer or the third semiconductor layer of the first boost capacitor Cbt through the contact hole 32. The contact hole 32 may pass through the second interlayer insulating layer 116 to expose the oxide semiconductor layer.

The fourth electrode CE4 of the first boost capacitor Cbt may be connected to the node connection line 171 and may be electrically connected to the first gate electrode G1. Thus, the first boost capacitor Cbt may increase a voltage of the second node (see N2 of FIG. 8) to express a black gray scale clearly when the first scan signal Sn supplied to the first scan line SL1 is turned off.

A portion of the node connection line 171 may be a sixth electrode CE6 of the second boost capacitor Nbt. Specifically, a portion overlapping the upper scan line 165 of the fourth scan line SL4 in the node connection line 171 may be the sixth electrode CE6 of the second boost capacitor Nbt. That is, the second interlayer insulating layer 116 may be disposed between the fifth electrode CE5 and the sixth electrode CE6 of the second boost capacitor Nbt, and the second interlayer insulating layer 116 may function as a dielectric layer of the second boost capacitor Nbt. Thus, the second boost capacitor Nbt may change a voltage of the second node (see N2 of FIG. 8) when a fourth scan signal Sn' supplied to the fourth scan line SLA is changed, so that the second boost capacitor Nbt may have the compensation relationship with the first boost capacitor Cbt.

The connection electrode 172 may be connected to the second electrode CE2 of the storage capacitor Cst through a contact hole 41 formed in the first interlayer insulating layer 114 and the second interlayer insulating layer 116. The connection electrode 172 may be connected to the fifth drain region D5 of the fifth transistor T5 via a contact hole 42 formed in the first gate insulating layer 112, the second gate insulating layer 113, the first interlayer insulating layer 114, and the second interlayer insulating layer 116.

One end of the connection electrode 173 may be connected to the first drain region D1 of the first transistor T1 and the sixth source region S6 of the sixth transistor T6 via the contact hole 33. The contact hole 33 may pass through the first gate insulating layer 112, the second gate insulating layer 113, the first interlayer insulating layer 114, and the second interlayer insulating layer 116 to expose a silicon semiconductor layer. The other end of the connection electrode 173 may be connected to the third drain region D3 of the third transistor T3 via a contact hole 34. The contact hole 34 may pass through the second interlayer insulating layer 116 to expose the oxide semiconductor layer.

The connection electrode 175 may be connected to the second source region S2 of the second transistor T2 via a contact hole 35 formed in the first gate insulating layer 112, the second gate insulating layer 113, the first interlayer insulating layer 114, and the second interlayer insulating layer 116.

A portion of the connection electrode 177 may be connected to the fourth source region S4 of the fourth transistor T4 via a contact hole 36 formed in the second interlayer insulating layer 116. Another portion of the connection electrode 177 may be connected to the first initialization voltage line 147 via a contact hole 37 formed in the first interlayer insulating layer 114 and the second interlayer insulating layer 116.

The connection electrode 179 may be connected to the drain region D6 of the sixth transistor T6 via a contact hole 38 formed in the first gate insulating layer 112, the second gate insulating layer 113, the first interlayer insulating layer 114, and the second interlayer insulating layer 116.

A first planarization layer 118 may be disposed on the second initialization voltage line 174, the node connection line 171, and the connection electrodes 172, 173, 175, 177, and 179.

Figure 14H:
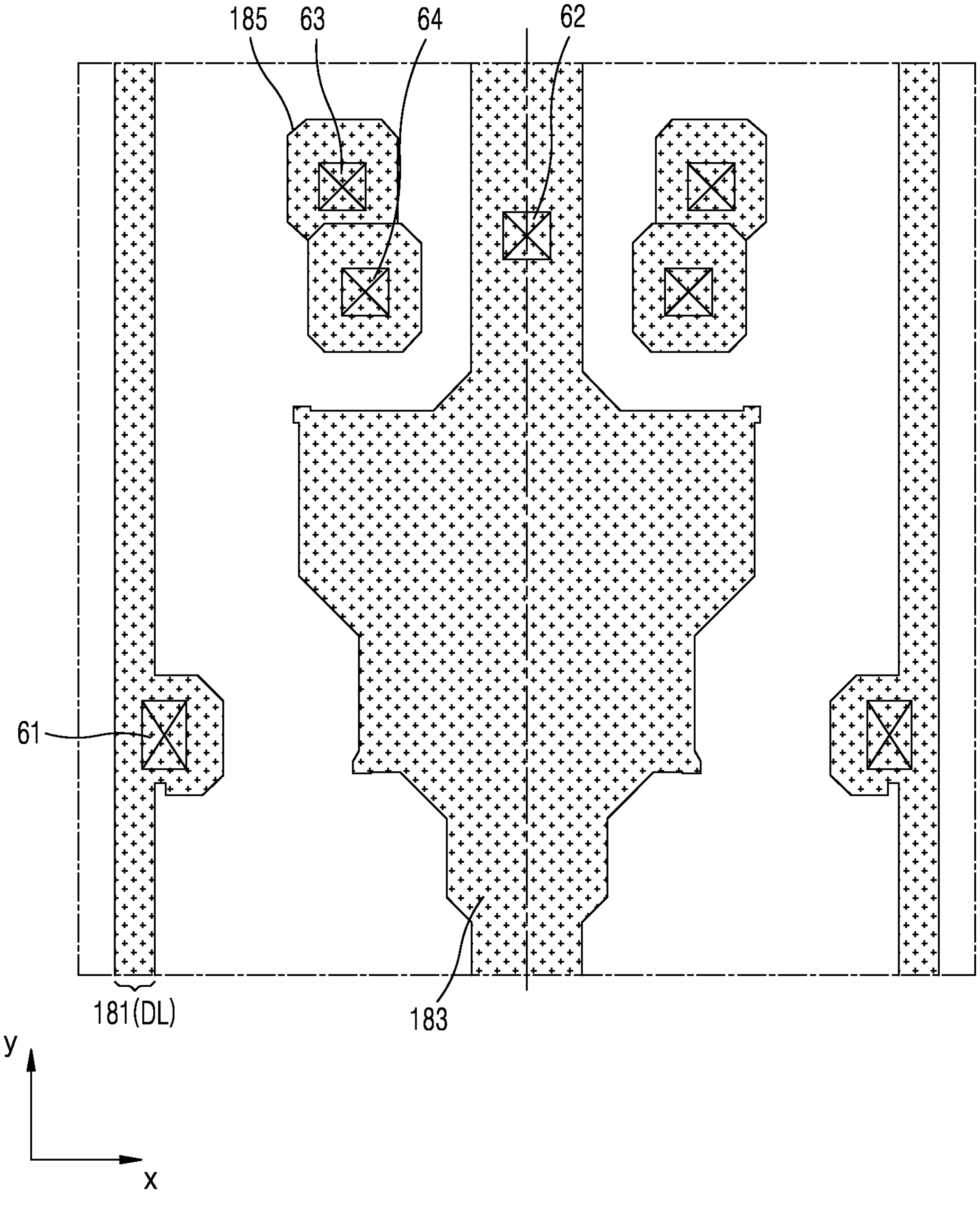

As illustrated in FIG. 14H, the data line 181, the driving voltage line 183, and the connection electrode 185 may be arranged on the first planarization layer 118.

The data line 181 may be connected to the connection electrode 175 via a contact hole 61 formed in the first planarization layer 118 and thus may be connected to the source region S2 of the second transistor T2.

The driving voltage line 183 may be connected to the connection electrode 172 via a contact hole 62 formed in the first planarization layer 118.

The connection electrode 185 may be connected to the connection electrode 179 via a contact hole 63 formed in the first planarization layer 118 and thus may be connected to the drain region D6 of the sixth transistor T6. The connection electrode 185 may be connected to the pixel electrode 210 via a contact hole 64 formed in a second planarization layer 119 on the first planarization layer 118 and may be configured to deliver a signal applied to the connection electrode T6 to the pixel electrode 210.

The second planarization layer 119 may be disposed on the data line 181, the driving voltage line 183, and the connection electrode 185.

The first planarization layer 118 and the second planarization layer 119 may include an organic material such as acryl, benzocyclobutene (BCB), polyimide or hexamethyldisiloxane (HMDSO), or the like. Alternatively, the first planarization layer 118 and the second planarization layer 119 may include an inorganic material. The first planarization layer 118 and the second planarization layer 119 may serve as a protective layer for covering the first through seventh transistors T1 through T7, and may be provided so that upper portions of the first planarization layer 118 and the second planarization layer 119 may be planarized. The first planarization layer 118 and the second planarization layer 119 may have a single layer or multi-layered structure.

Light-emitting elements (see EDm and EDc of FIG. 7) may be arranged on the second planarization layer 119, and the light-emitting elements EDm and EDc may include an organic light-emitting diode OLED. The organic light-emitting diode OLED may include a pixel electrode 210, an intermediate layer 220, and an opposite electrode 230. As described above, in a main light-emitting element (see EDm of FIG. 7) arranged in the front display area (see FDA of FIG. 7), the pixel electrode 210 may be patterned according to elements. However, in a corner light-emitting element (see EDc of FIG. 7) arranged in the corner display area (see CDA of FIG. 7), two light-emitting elements that are arranged adjacent to each other may share one pixel electrode 210.

The pixel electrode 210 may include a transparent conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 210 may include a reflective layer including Ag, Mg, Al, Pt, Pd, Au, Ni, Nd, Ir, Cr, or a compound thereof. For example, the pixel electrode 210 may have a structure having layers formed of ITO, IZO, ZnO or $In_2O_3$ on/under the above-described reflective layer. In this case, the pixel electrode 210 may have a stack structure of ITO/Ag/ITO.

A bank layer 120 may be arranged on the second planarization layer 119 and the pixel electrode 210. The bank layer 120 may have an opening corresponding to each of pixels, i.e., an opening through which a portion of the pixel electrode 210 is exposed, thereby defining the pixel. In addition, the bank layer 120 may be configured to increase a distance between edges of the pixel electrode 210 and the opposite electrode 230 on the pixel electrode 210 to prevent arc etc. from occurring in the edges of the pixel electrode 210. The bank layer 120 may include an organic material such as polyimide or HMDSO.

The intermediate layer 220 of the organic light-emitting diode OLED may include a low molecular weight material or a polymer material. When the intermediate layer 220 of the organic light-emitting diode OLED includes a low molecular weight material, the intermediate layer 220 may have a structure in which a hole injection layer (HIL), a hole transport layer (HTL), an emission layer (EML), an electron transport layer (ETL) and an electron injection layer (EIL) are stacked in a single or composite structure, and may include various organic materials such as copper phthalocyanine (CuPc), N,N'-Di(naphthalene-1-yl)-N,N'-diphenyl-benzidine (NPB), tris-8-hydroxyquinoline aluminum) (Alq3), and the like. These layers may be formed through a method such as vacuum deposition.

When the intermediate layer 220 includes a polymer material, the intermediate layer 220 may have a structure including the HTL and the EML. In this case, the HTL may include PEDOT, and the EML may include poly-phenylenevinylene (PPV)-based and polyfluorene-based polymer materials.

The intermediate layer 220 may not be necessarily limited thereto, and may have various structures. The intermediate layer 220 may include a single layer across the plurality of pixel electrodes 210, or may include a layer patterned to correspond to each of the plurality of pixel electrodes 210.

The opposite electrode 230 may be arranged on the intermediate layer 220. The opposite electrode 230 may include a conductive material having a low work function. For example, the opposite electrode 230 may include a (semi-)transparent layer including Ag, Mg, Al, Pt, Pd, Au, Ni, Nd, Ir, Cr, Li, Ca or an alloy thereof. Alternatively, the opposite electrode 230 may further include a layer such as ITO, IZO, ZnO or $In_2O_3$ on the (semi-)transparent layer including the above-described materials. The opposing electrodes 123 may be integrally formed to correspond to the front display area FDA included in the main display area MDA an the component area CA and the light emitting elements (see EDm and EDc of FIG. 7) included in the corner display area CDA.

Figure 15A:
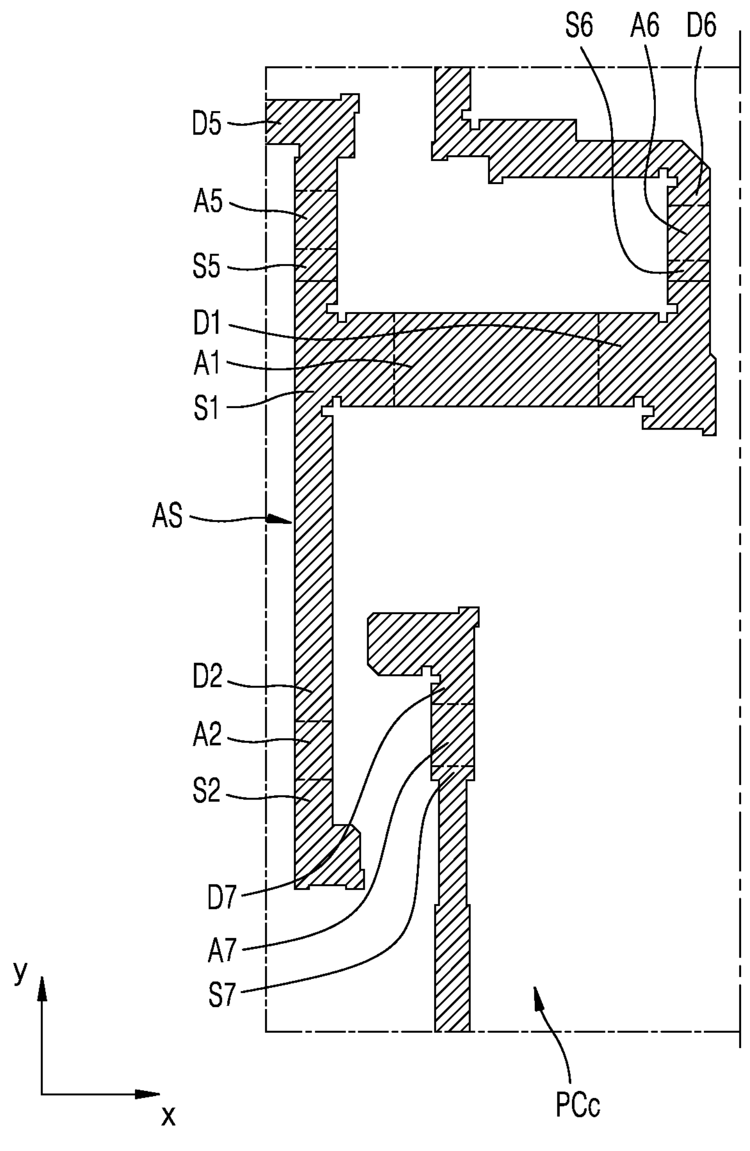
FIGS. 15A, 16A, and 17A are layout diagrams extracting only some configuration of FIG. 12.
Figure 15B:
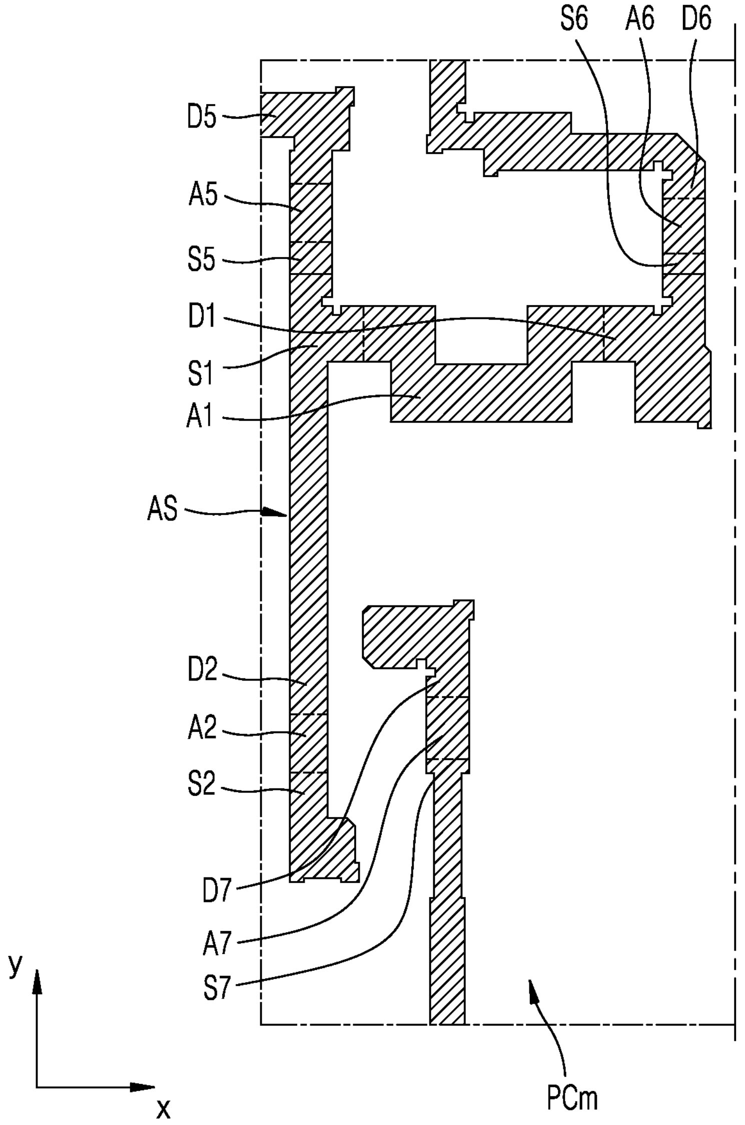
FIGS. 15B, 16B, and 17B are layout diagrams extracting only some configuration arranged in a main pixel circuit of a display apparatus according to an embodiment.
Figure 16A:
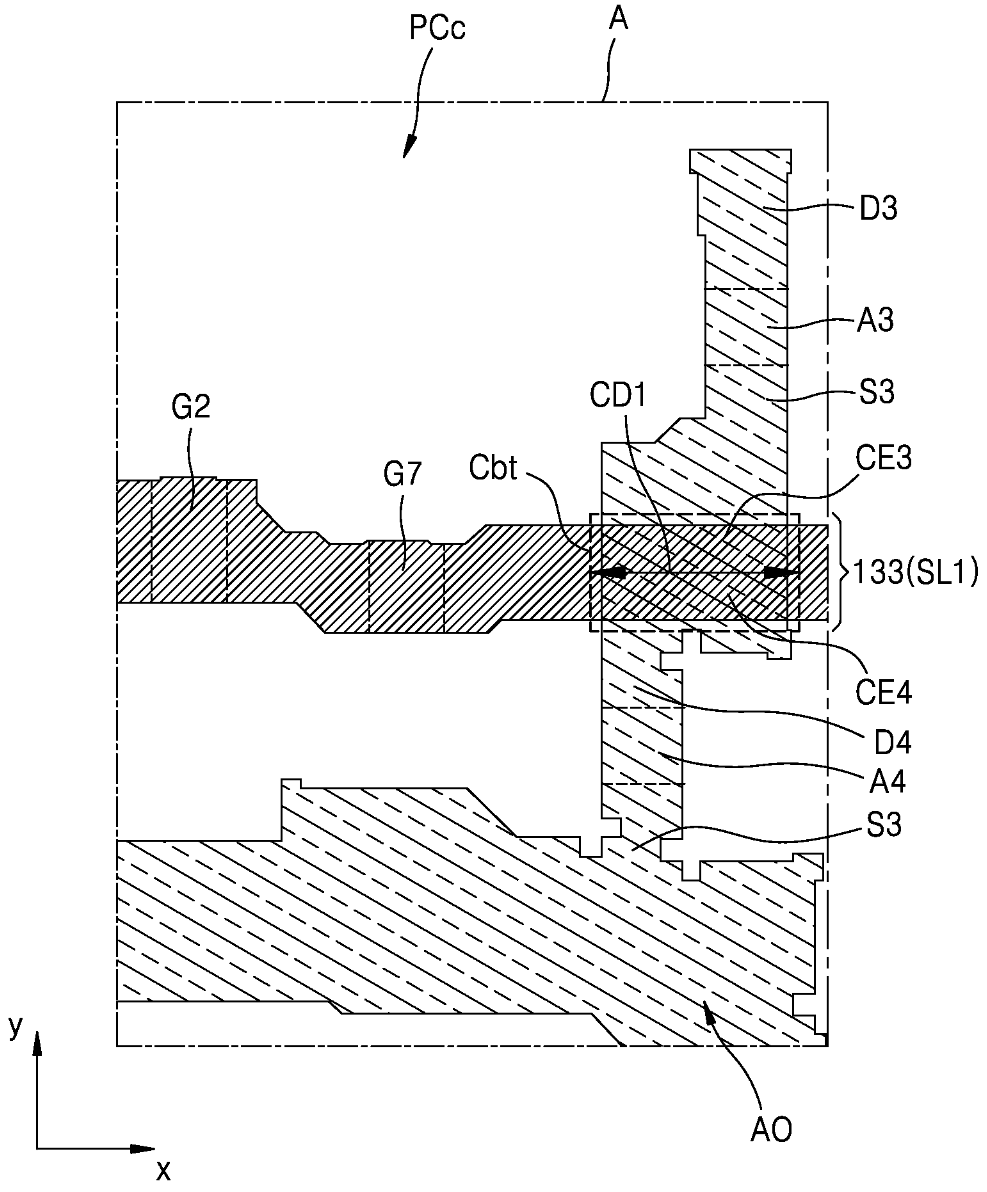
Figure 16B:
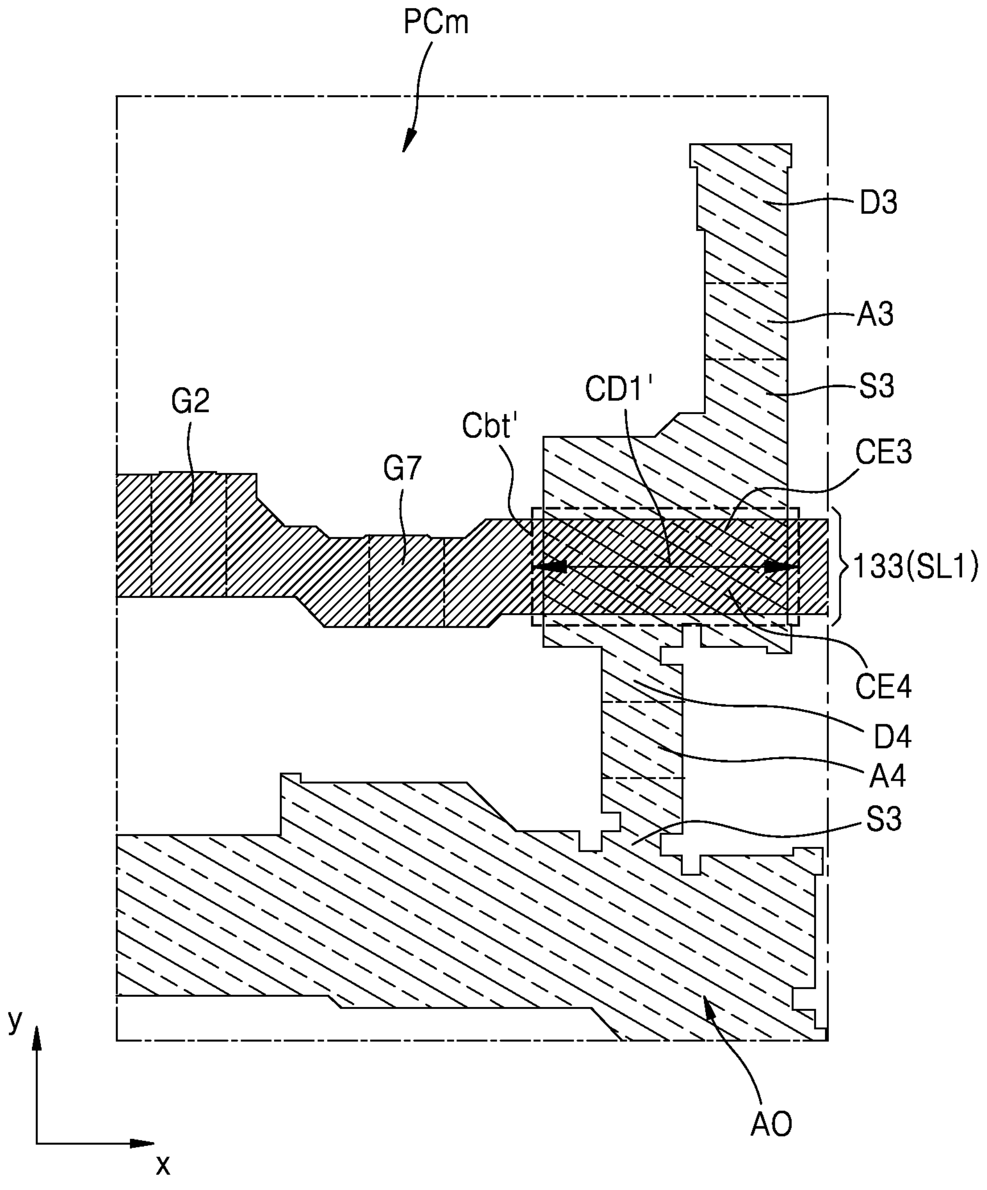
Figure 17A:
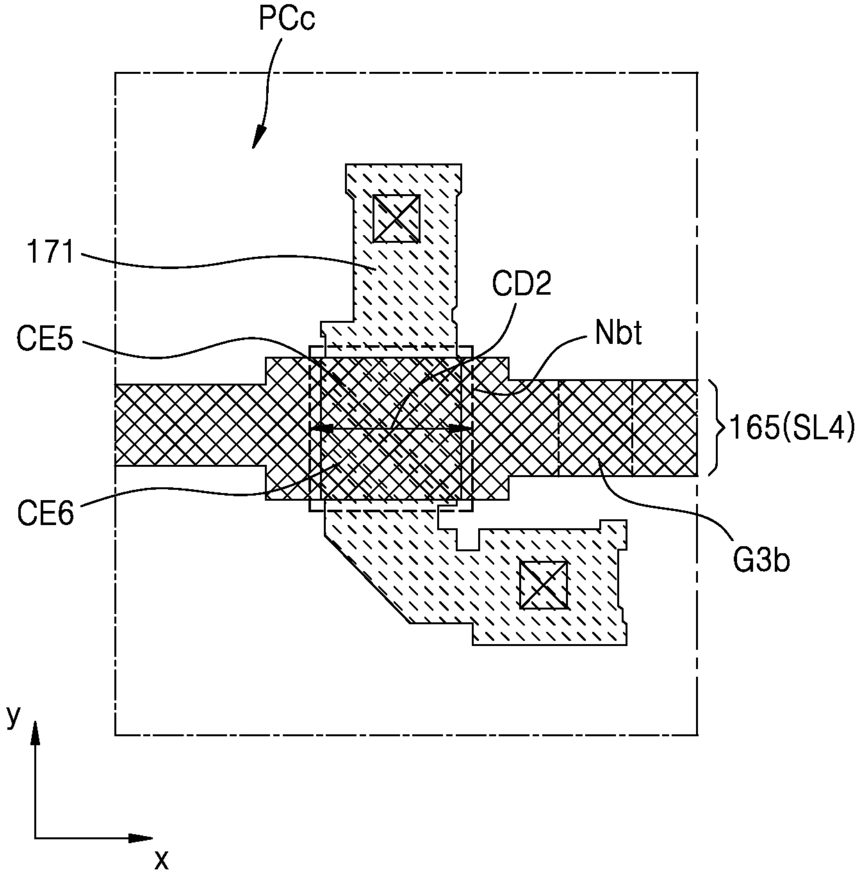

FIGS. 15A, 16A, and 17A are arrangement diagrams illustrating only a portion of the configuration of FIG. 12, and FIGS. 15B, 16B, and 17B are arrangement diagrams illustrating only a portion of the configuration arranged in a main pixel circuit of a display apparatus according to one embodiment.

FIG. 15A illustrates a portion of the pixel circuit disposed on the left side of the pair of pixel circuits shown in FIGS. 12 and 14B, centered on the structure of the semiconductor layer AS of the corner pixel circuit PCc disposed in the corner display area CDA. FIG. 15B illustrates a portion of the pixel circuit disposed on the left side of the pair of pixel circuits shown in FIG. 15A, centered on the structure of the semiconductor layer AS of the main pixel circuit PCm disposed in the front display area FDA.

Referring to FIGS. 15A and 15B, as described above, the semiconductor layer AS may include a first channel region A1, a first source region S1, and a first drain region D1, which are first semiconductor layers of the first transistor T1, a second channel region A2, a second source region S2, and a second drain region D2, which are second semiconductor layers of the second transistor T2, a fifth channel region A5, a fifth source region S5, and a fifth drain region D5, which are fifth semiconductor layers of the fifth transistor T5, a sixth channel region A6, a sixth source region S6, and a sixth drain region D6, which are sixth semiconductor layers of the sixth transistor T6, and a seventh channel region A7, a seventh source region S7, and a seventh drain region D7, which are seventh semiconductor layers of the seventh transistor T7.

In particular, the first transistor T1 that is a driving transistor may receive a data signal according to a switching operation of the second transistor T2 to supply a driving current to the organic light-emitting diode (see OLED of FIG. 8) and thus may be a transistor that has the greatest effects on luminance of the first through seventh transistors T1, T2, T3, T4, T5, T6, and T7. As described above, as one corner pixel circuit PCc is connected to two corner light-emitting elements (see EDc of FIG. 7) in the corner display area CDA, the luminance of the corner light-emitting elements (see EDc of FIG. 7) may be lower than the luminance of the main light-emitting elements (see EDm of FIG. 7).

Thus, the channel width of the first transistor T1 of the corner pixel circuit PCc may be set to be greater than the channel width of the first transistor T1 of the main pixel circuit PCm. Specifically, a channel width/channel length (W/L) of the first transistor T1 arranged in the corner pixel circuit PCc may be greater than a W/L of the first transistor T1 arranged in the main pixel circuit PCm. For example, the first transistor T1 arranged in the corner pixel circuit PCc may have a channel width of 5.1 μm and a channel length of 13.04 μm, and the first transistor T1 arranged in the main pixel circuit PCm may have a channel width of 3.4 μm and a channel length of 17.62 μm. As the channel width of the first transistor T1 arranged in the corner pixel circuit PCc is expanded, a current passing through a element may increase so that the luminance of the corner light-emitting elements (see EDc of FIG. 7) may be increased.

To expand the channel width in the corner pixel circuit PCc while not affecting the resolution, the first channel area A1 of the corner pixel circuit PCc may have a straight shape, and the first channel area A1 of the main pixel circuit PCm may include a curved shape. Specifically, as the first channel region A1 of the corner pixel circuit PCc has a straight shape, the first channel region A1 may have a small channel length while having a large channel width so that the luminance of the corner display area CDA may be increased. On the other hand, as the first channel region A1 of the main pixel circuit PCm has a bent shape, the first channel area A1 may have a small channel width and a large channel length, and the driving range of a gate voltage applied to the first gate electrode (see G1 of FIG. 12) may be increased and gray scale of light may be more accurately controlled.

Next, referring to FIGS. 16A and 16B, the first scan line 133 may extend in the x direction, and the first scan line 133 may be disposed between the first gate insulating layer (see 112 of FIG. 13) and the second gate insulating layer (see 113 of FIG. 13). The first scan line 133 may include a second gate electrode G2 of the second transistor T2, a seventh gate electrode G7 of the seventh transistor T7, and a third electrode CE3 of the first boost capacitor Cbt. That is, the second gate electrode G2, the seventh gate electrode G7, and the third electrode CE3 may be integrally formed with the first scan line 133.

In addition, a semiconductor layer AO including an oxide semiconductor may be disposed on the first interlayer insulating layer (see 114 of FIG. 13). The semiconductor layer AO may include a third channel region A3, a third source region S3, and a third drain region D3, which are third semiconductor layers of the third transistor T3, and a fourth channel region A4, a fourth source region S4, and a fourth drain region D4, which are fourth semiconductor layers of the fourth transistor T4, and may further include a fourth electrode CE4 of the first boost capacitor Cbt between the third transistor T3 and the fourth transistor T4. The fourth electrode CE4 may extend from the third semiconductor layer of the third transistor T3 or the fourth semiconductor layer of the fourth transistor T4. That is, the third electrode CE3 integrally formed with the first scan line 133, and the fourth electrode CE4 formed in the semiconductor layer AO may overlap each other so that the first boost capacitor Cbt may be formed.

In this case, the capacitance of the first boost capacitor Cbt formed in the corner pixel circuit PCc may be less than the capacitance of a first boost capacitor Cht' formed in the main pixel circuit PC. The first boost capacitors Cbt and Cbt' may be a boosting capacitor capable of adjusting a voltage applied to the gate electrode of the first transistor T1, and as the capacitance of the first boost capacitor Cbt decreases, the luminance of a corresponding pixel may be increased.

Specifically, the capacitance of the first boost capacitors Cbt and Cbt' may vary according to the area in which the third electrode CE3 and the fourth electrode CE4 overlap each other. Thus, in the corner pixel circuit PCc, the area in which the third electrode CE3 and the fourth electrode CE4 overlap each other, may be designed to be less than that of the main pixel circuit PCm. In particular, in order to design the capacitance of the first boost capacitor Cbt to be small in the corner pixel circuit PCc, a horizontal width CD1 of the fourth electrode CE4 that is an area overlapping the first scan line 133 of the semiconductor layer AO may be formed to be less than a horizontal width CD1' of the fourth electrode CE4 in the main pixel circuit PCm. After all, the capacitance of the first boost capacitor Cbt of the corner pixel circuit PCc is formed to be smaller compared to the main pixel circuit PCm, the luminance of the corner light emitting element EDc may be adjusted to be higher than the main light emitting element EDm.

Figure 17B:
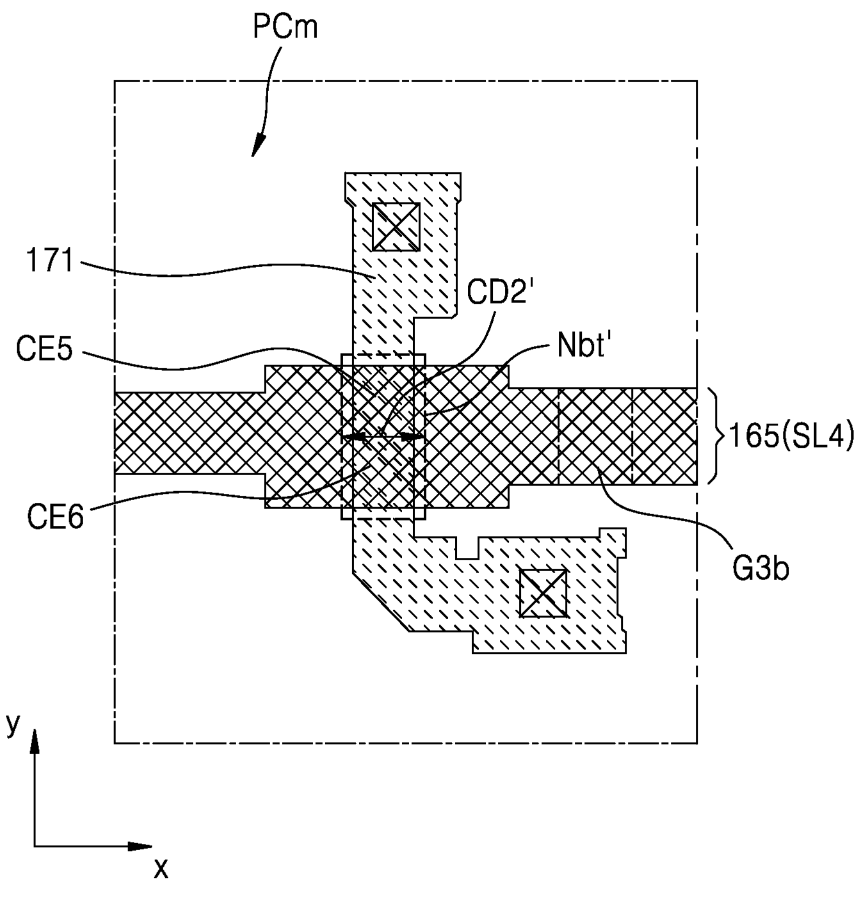

Next, referring to FIGS. 17A and 17B, the fourth scan line SL4 may extend in the x direction, and the fourth scan line SL4 may be disposed between the third gate insulating layer (scc 115 of FIG. 13) and the second interlayer insulating layer 116. The fourth scan line SL4 may include an upper gate electrode G3*b* of the third transistor T3, and a portion of the fourth scan line SL4 may be a fifth electrode CE5 of the second boost capacitor Nbt. That is, a portion of the fourth scan line SL4 that overlaps the node connection line 171 may be a fifth electrode CE5 of the second boost capacitor Nbt.

In addition, the node connection line 171 may be disposed on the second interlayer insulating layer (see 116 of FIG. 13). The node connection line 171 may be electrically connected to the first electrode CE1 and the third semiconductor layer of the third transistor T3, and the node connection line 171 may include a sixth electrode CE6 of the second boost capacitor Nbt that is a portion overlapping the fourth scan line SL4. That is, the fifth electrode CE5 integrally formed with the fourth scan line SL4, and the sixth electrode CE6 formed in the node connection line 171 may overlap each other so that the second boost capacitor Nbt may be formed.

In this case, the capacitance of the second boost capacitor Nbt formed in the corner pixel circuit PCc may be greater than the capacitance of a second boost capacitor Nbt' formed in the main pixel circuit PC. The second boost capacitors Nbt and Nbt', like the first boost capacitors Cbt and Cbt', may be a boosting capacitor that may adjust the voltage applied to the gate electrode of the first transistor T1, or it may be a negative boosting capacitor that functions in the opposite way to the first boost capacitors Cbt and Cbt'. That is, as the capacitance of the second boost capacitors Nbt and Nbt' may increase in an opposite way to the first boost capacitors Cbt and Cbt', the luminance of the corresponding pixel may be increased.

Specifically, the capacitance of the second boost capacitors Nbt and Nbt' may vary according to the area in which the fifth electrode CE5 and the sixth electrode CE6 overlap each other. Thus, in the corner pixel circuit PCc, the area in which the fifth electrode CE5 and the sixth electrode CE6 overlap each other, may be designed to be greater than that of the main pixel circuit PCm. In particular, in order to design the capacitance of the second boost capacitor Nbt to be large in the corner pixel circuit PCc, a horizontal width CD2 of the sixth electrode CE6 that is an area overlapping the fourth scan line SL4 of the node connection line 171 may be formed to be greater than a horizontal width CD2' of the sixth electrode CE6 in the main pixel circuit PCm. After all, the capacitance of the second boost capacitor Nbt of the corner pixel circuit PCc is formed to be larger compared to the main pixel circuit PCm, the luminance of the corner light emitting element EDc may be adjusted to be higher than the main light emitting element EDm.

As described above, the channel width of the first transistor T1 of the corner pixel circuit PCc may be expanded, and the capacitance of the first boost capacitor Cbt may be reduced, and the capacitance of the second boost capacitor Nbt may be increased. Thus, the luminance of the corner light-emitting element (see EDc of FIG. 7) may be increased and thus, luminance reduction of the corner display area (see CDA of FIG. 7) may be solved. However, the luminance of the corner light emitting element (see EDc of FIG. 7) may be greatly increased, resulting in a luminance deviation between the corner display area CDA and the front display area FDA, and a defect in which the boundary between the corner display area CDA and the front display area FDA is visible, may occur. Thus, in the display apparatus according to an embodiment, the first boost capacitor Cbt and the second boost capacitor Nbt may be reduced so that a defect of the boundary between the corner display area CDA and the front display area FDA may be prevented.

Specifically, in the corner pixel circuits PCc arranged in the corner display area CDA, the capacitance of a boost capacitor may gradually increase or decrease as the corner pixel circuits PCc get farther from the front display area (see FDA of FIG. 11B). That is, the capacitance of the first boost capacitor Cbt included in each of the plurality of corner pixel circuits PCc may gradually decrease as the first boost capacitor Cbt gets farther from the front display area (see FDA of FIG. 11B), and the capacitance of the second boost capacitor Nbt included in each of the plurality of corner pixel circuits PCc may gradually increase as the second boost capacitor Nbt gets farther from the front display area (see FDA of FIG. 11B).

To this end, the area in which the third electrode (CE3 or a first lower boost electrode) and the fourth electrode (CE4 or a first upper boost electrode) overlap each other in the corner pixel circuit PCc may gradually decrease as the third electrode (CE3 or a first lower boost electrode) and the fourth electrode (CE4 or a first upper boost electrode) get farther from the front display area FDA. That is, the horizontal width CD1 of the fourth electrode CE4 that overlaps the third electrode CE3 in the corner pixel circuit PCc may gradually decrease as the fourth electrode CE4 gets farther from the front display area FDA. In addition, the area in which the fifth electrode (CE5 or a second lower boost electrode) and the sixth electrode (CE6 or a second upper boost electrode) overlap each other in the corner pixel circuit PCc may gradually increase as the fifth electrode (CE5 or a second lower boost electrode) and the sixth electrode (CE6 or a second upper boost electrode) get farther from the front display area FDA. That is, the horizontal width CD2 of the sixth electrode CE6 that overlaps the fifth electrode CE5 in the corner pixel circuit PCc may gradually decrease as the sixth electrode CE6 gets farther from the front display area FDA.

For example, when a plurality of corner pixel circuits PCc are divided into first through sixth corner pixel circuits PC1, PC2, PC3, PC4, PC5, and PC6, as shown in FIG. 11B, the first through sixth corner pixel circuits PC1, PC2, PC3, PC4, PC5, and PC6 have the capacitance of the first boost capacitor Cbt and the capacitance of the second boost capacitor Nbt shown in the following Table 1.

TABLE 1

| Boost cap. | PCm | PC1 | PC2 | PC3 | PC4 | PC5 | PC6 |
|---|---|---|---|---|---|---|---|
| Cbt | 2.9 | 2.85 | 2.80 | 2.75 | 2.70 | 2.65 | 2.6 |
| Nbt | 2.6 | 4.1 | 4.2 | 4.3 | 4.4 | 4.5 | 4.6 |

As in the above Table 1, as the corner pixel circuits PCc get closer to the front display area FDA, the first boost capacitor Cbt may have a large value, and the second boost capacitor Nbt may have a small value. In other words, as the corner pixel circuits PCc get farther from the front display area FDA, the capacitance of the first boost capacitor Cbt may gradually decrease, and the capacitance of the second boost capacitor Nbt may gradually increase. In an embodiment, when the capacitance of the first boost capacitor Cbt of the main pixel circuit PCm is 2.9, the capacitance of the first boost capacitor Cbt of the first corner pixel circuit PC1 disposed closest to the main pixel circuit PCm may be 2.85 that is slightly less than 2.9. Subsequently, the second through sixth corner pixel circuits PC2, PC3, PC4, PC5, and PC6 arranged to be farther from the front display area FDA may have capacitances of 2.80, 2.75, 2.70, 7.65, 2.6, respectively, i.e., capacitances of the first boost capacitor Cbt that is sequentially decreased. In addition, when the capacitance of the second boost capacitor Nbt of the main pixel circuit PCm is 2.6, the capacitance of the second boost capacitor Nbt of the first corner pixel circuit PC1 disposed closest to the main pixel circuit PCm may be 4.1 that is slightly greater than 2.6. Subsequently, the second through sixth corner pixel circuits PC2, PC3, PC4, PC5, and PC6 arranged to be farther from the front display area FDA may have capacitances of 4.2, 4.3, 4.4, 4.5, 4.6, respectively, i.e., capacitances of the second boost capacitor Nbt that is sequentially increased.

However, in the case of the second boost capacitor Nbt, the first corner pixel circuit PC1 that is closest to the front display area FDA may have a value that is more than 1.5 times larger than the main pixel circuit PCm. That is, in the case of the first boost capacitor Cbt, a difference between capacitances of the main pixel circuit PCm and the first corner pixel circuit PC1 may be the same as a difference between capacitances between adjacent pixel circuits in the first through sixth corner pixel circuits PC1, PC2, PC3, PC4, PC5, and PC6. On the other hand, in the case of the second boost capacitor Nbt, the first corner pixel circuit PC1 may have capacitance that is more than 1.5 times larger than the main pixel circuit PCm, and a difference between capacitances between adjacent pixel circuits may be uniform only between the first through sixth corner pixel circuits PC1, PC2, PC3, PC4, PC5, and PC6, which are sequentially arranged. This is because the first boost capacitor Cbt may easily change its luminance by adjusting its capacitance by a small amount, but the second boost capacitor Nbt requires a large adjustment of its capacitance compared to the first boost capacitor Cbt to affect its luminance.

In addition, as described above in FIG. 11B, the corner pixel circuits PCc are not limited to be divided into the first through sixth corner pixel circuits PC1, PC2, PC3, PC4, PC5, and PC6. For example, depending on the location of the corner display area CDA, when the corner pixel circuits PCc are divided into the first through fourth corner pixel circuits PC1, PC2, PC3 and PC4, the capacitance of the first boost capacitor Cbt may gradually decrease through four steps, and the capacitance of the second boost capacitor Nbt may gradually increase through four steps. That is, when the number of light-emitting units arranged in the first direction (e.g., x direction) in the corner display area CDA is n, the capacitance of the first boost capacitor Cbt of the corner pixel circuits PCc may gradually decrease through n steps, and the capacitance of the second boost capacitor Nbt may gradually increase through n steps.

As a result, as the capacitance of the first boost capacitor Cbt gradually decreases and the capacitance of the second boost capacitor Nbt gradually increases as described above, the luminance of the corner light-emitting elements (see EDc of FIG. 11B) disposed in the corner display area (see CDA of FIG. 11B) gradually increases with distance from the front display area FDA. Thus, a radical luminance deviations between the front display area FDA and the corner display area CDA are eliminated. Thus, the display apparatus according to an embodiment may prevent boundary defects between the front display area FDA and the corner display area CDA.

A W/L of the first transistor T1 of each of the corner pixel circuits PCc arranged in the corner display area CDA may be uniform. For example, even when the corner pixel circuits PCc are divided into the first through sixth corner pixel circuits PC1, PC2, PC3, PC4, PC5 and PC6, as shown in FIG. 11B, a first channel region A1 of the first transistor T1 in all corner pixel circuits PCc may have a straight shape, and a W/L of the first transistor T1 may be the same. In addition, a storage capacitor (see Cst of FIG. 8) of each of the corner pixel circuits PCc arranged in the corner display area CDA may also be uniform. For example, even when the corner pixel circuits PCc are divided into the first through sixth corner pixel circuits PC1, PC2, PC3, PC4, PC5 and PC6, as shown in FIG. 11B, the capacitance of the storage capacitor Cst in all corner pixel circuits PCc may be the same. That is, this means that it is designed to increase the luminance of corner pixels gradually by using only the first boost capacitor Cbt and the second boost capacitor Nbt without using the W/L of the first transistor T1 and the storage capacitor (see Cst of FIG. 8) so that boundary defects between the corner display area CDA and the front display area FDA may be prevented.

A display apparatus according to an embodiment having the above configuration includes a corner display area so that an area in which an image is displayed, may be expanded and boundary defects that may occur between the corner display area and the front display area may be prevented. The above-described effects are merely illustrative, and the scope of the present disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:

a substrate comprising a front display area and a corner display area extending from a corner of the front display area;

a plurality of main light-emitting elements arranged in the front display area and a plurality of main pixel circuits connected to the plurality of main light-emitting elements, respectively; and a plurality of corner light-emitting elements arranged in the corner display area and a plurality of corner pixel circuits connected to the plurality of corner light-emitting elements, respectively, wherein each of the plurality of main pixel circuits and the plurality of corner pixel circuits comprises a boost capacitor, and a capacitance of a boost capacitor included in each of the plurality of corner pixel circuits gradually increases or decreases as the boost capacitor gets farther from the front display area.

2. The display apparatus of claim 1, wherein the corner display area comprises a first corner display area extending from the front display area and a second corner display area extending from the first corner display area, and the plurality of corner pixel circuits are arranged in the first corner display area, and the second corner display area comprises a driving circuit for providing driving signals to the plurality of main pixel circuits and the plurality of corner pixel circuits, and the plurality of corner light-emitting elements are arranged in the first corner display area and the second corner display area.

3. The display apparatus of claim 1, wherein the boost capacitor comprises a first boost capacitor and a second boost capacitor, and, a capacitance of the first boost capacitor included in each of the plurality of corner pixel circuits gradually decreases as the first boost capacitor gets farther from the front display area, and a capacitance of the second boost capacitor included in each of the plurality of corner pixel circuits gradually increases as the second boost capacitor gets farther from the front display area.

4. The display apparatus of claim 3, wherein each of the plurality of main pixel circuits and the plurality of corner pixel circuits further comprises a storage capacitor, and a capacitance of the storage capacitor of the plurality of corner pixel circuits is same as a capacitance of a storage capacitor of the plurality of main pixel circuits.

5. The display apparatus of claim 3, wherein a capacitance of the second boost capacitor of a corner pixel circuit disposed closest to the front display area among the plurality of corner pixel circuits is greater than 1.5 times a capacitance of the second boost capacitor of one of the plurality of main pixel circuits.

6. The display apparatus of claim 3, wherein one of the plurality of corner pixel circuits is connected to at least two of the plurality of corner light-emitting elements.

7. The display apparatus of claim 6, further comprising light-emitting element units configured as a portion of the plurality of corner light-emitting elements and being repeatedly arranged, wherein one light-emitting element unit comprises 8 corner light-emitting elements and is connected to 4 corner pixel circuits.

8. The display apparatus of claim 7, wherein, when n light-emitting element units (where n is a natural number that is greater than or equal to 2) are arranged in the corner display area in a first direction, a capacitance of a boost capacitor included in each of the plurality of corner pixel circuits gradually increases or decreases through n steps as the boost capacitor gets farther from the front display area.

9. The display apparatus of claim 3, wherein each of the plurality of main pixel circuits and the plurality of corner pixel circuits comprises:

a first transistor that is a driving transistor;

a second transistor connected to a first scan line and a data line; and a third transistor connected to a second scan line and configured to connect a gate electrode and an output electrode of the first transistor to each other.

10. The display apparatus of claim 9, wherein one electrode of the first boost capacitor is connected to the first scan line connected to a gate electrode of the second transistor, and the other electrode of the first boost capacitor is connected to the gate electrode of the first transistor.

11. The display apparatus of claim 9, wherein one electrode of the second boost capacitor is connected to the second scan line connected to a gate electrode of the third transistor, and the other electrode of the second boost capacitor is connected to a node configured to connect the first transistor and the third transistor to each other.

12. The display apparatus of claim 9, further comprising:

a first semiconductor layer disposed on the substrate and comprising a channel region of the first transistor;

a first gate insulating layer disposed on the first semiconductor layer;

a gate electrode of the first transistor disposed on the first gate insulating layer and overlapping a channel of the first transistor;

a second gate insulating layer disposed on the gate electrode of the first transistor;

a lower gate electrode of the third transistor disposed on the second gate insulating layer;

a first interlayer insulating layer disposed on a lower gate electrode of the third transistor;

a second semiconductor layer disposed on the first interlayer insulating layer and comprising a channel region of the third transistor;

a third gate insulating layer disposed on the second semiconductor layer;

an upper gate electrode of the third transistor disposed on the third gate insulating layer and overlapping a channel of the third transistor;

a second interlayer insulating layer covering an upper gate electrode of the third transistor; and a node connection line disposed on the second interlayer insulating layer and configured to connect the gate electrode of the first transistor and the second semiconductor layer to each other.

13. The display apparatus of claim 12, wherein the first semiconductor layer comprises a silicon semiconductor, and the second semiconductor layer comprises an oxide semiconductor.

14. The display apparatus of claim 12, wherein the first boost capacitor comprises a first lower boost electrode and a first upper boost electrode, and the first lower boost electrode is located on a same layer as the gate electrode of the first transistor, and the first upper boost electrode is located on a same layer as the second semiconductor layer.

15. The display apparatus of claim 14, wherein the first scan line is disposed on the first gate insulating layer, and the first lower boost electrode extends from the first scan line and is integrally formed, and the first upper boost electrode extends from the channel region of the third transistor and is integrally formed.

16. The display apparatus of claim 14, wherein an overlapping area of the first lower boost electrode and the first upper boost electrode arranged in one of the plurality of corner pixel circuits gradually decreases as the corner pixel circuit gets farther from the front display area.

17. The display apparatus of claim 16, wherein the first scan line extends in a first direction, and a width following the first direction of the first upper boost electrode arranged in the corner pixel circuit gradually decreases as the first upper boost electrode gets farther from the front display area.

18. The display apparatus of claim 12, wherein the second boost capacitor comprises a second lower boost electrode and a second upper boost electrode, and the second lower boost electrode is located on a same layer as the upper gate electrode of the third transistor, and the second upper boost electrode is located on a same layer as the node connection line.

19. The display apparatus of claim 18, wherein the second scan line is disposed on the third gate insulating layer, and the second lower boost electrode extends from the second scan line and is integrally formed, and the second upper boost electrode extends from the node connection line and is integrally formed.

20. The display apparatus of claim 18, wherein an overlapping area of the second lower boost electrode and the second upper boost electrode arranged in one of the plurality of corner pixel circuits gradually increases as the corner pixel circuit gets farther from the front display area.

21. The display apparatus of claim 20, wherein the second scan line extends in a first direction, and a width following the first direction of the second upper boost electrode disposed in the corner pixel circuit gradually increases as the second upper boost electrode gets farther from the front display area.

22. The display apparatus of claim 12, wherein the first semiconductor layer comprises the channel region of the first transistor and a source region and a drain region at opposite sides of the channel region, and a channel region of the first transistor arranged in the plurality of main pixel circuits has a bent shape, and a channel region of the first transistor arranged in the plurality of corner pixel circuits has a straight line shape.

23. The display apparatus of claim 22, wherein a channel width/channel length (W/L) of the first transistor arranged in the plurality of main pixel circuits is less than a W/L of the first transistor arranged in the plurality of corner pixel circuits.

24. The display apparatus of claim 22, wherein a channel width/channel length (W/L) of the first transistor arranged in the plurality of corner pixel circuits is uniform.

* * * * *